United States Patent
Inasaki et al.

(10) Patent No.: US 10,921,712 B2
(45) Date of Patent: *Feb. 16, 2021

(54) COLOR DEVELOPING COMPOSITION, LITHOGRAPHIC PRINTING PLATE PRECURSOR, METHOD FOR PRODUCING LITHOGRAPHIC PRINTING PLATE, AND COLOR DEVELOPING COMPOUND

(71) Applicant: FUJIFILM Corporation, Tokyo (JP)

(72) Inventors: Takeshi Inasaki, Shizuoka (JP); Keisuke Nogoshi, Shizuoka (JP); Hiroaki Idei, Shizuoka (JP); Akio Mizuno, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/104,638

(22) Filed: Aug. 17, 2018

(65) Prior Publication Data

US 2018/0356730 A1  Dec. 13, 2018

Related U.S. Application Data

(63) Continuation of application No. PCT/JP2017/005199, filed on Feb. 13, 2017.

(30) Foreign Application Priority Data

Feb. 19, 2016 (JP) .................................. 2016-030505
Feb. 8, 2017 (JP) .................................. 2017-021607

(51) Int. Cl.
| | | |
|---|---|---|
| *G03F 7/32* | (2006.01) | |
| *G03F 7/105* | (2006.01) | |
| *C09B 11/24* | (2006.01) | |
| *C09B 23/01* | (2006.01) | |
| *G03F 7/027* | (2006.01) | |
| *B41C 1/10* | (2006.01) | |
| *B41N 1/14* | (2006.01) | |
| *G03F 7/004* | (2006.01) | |
| *G03F 7/029* | (2006.01) | |
| *G03F 7/033* | (2006.01) | |
| *G03F 7/16* | (2006.01) | |
| *G03F 7/20* | (2006.01) | |
| *G03F 7/26* | (2006.01) | |

(52) U.S. Cl.
CPC .............. *G03F 7/105* (2013.01); *B41C 1/10* (2013.01); *B41C 1/1008* (2013.01); *B41N 1/14* (2013.01); *C09B 11/24* (2013.01); *C09B 23/0008* (2013.01); *C09B 23/0016* (2013.01); *C09B 23/0025* (2013.01); *C09B 23/0066* (2013.01); *G03F 7/0045* (2013.01); *G03F 7/027* (2013.01); *G03F 7/0295* (2013.01); *G03F 7/033* (2013.01); *G03F 7/16* (2013.01); *G03F 7/168* (2013.01); *G03F 7/2004* (2013.01); *G03F 7/2006* (2013.01); *G03F 7/26* (2013.01); *B41C 2201/02* (2013.01); *B41C 2210/08* (2013.01)

(58) Field of Classification Search
CPC ........................................................ G03F 7/20
See application file for complete search history.

(56) References Cited

U.S. PATENT DOCUMENTS

| | | | |
|---|---|---|---|
| 10,241,400 B2* | 3/2019 | Mizuno et al. | C09B 23/086 |
| 2006/0024612 A1* | 2/2006 | Oshima | B41C 1/1008 430/270.1 |
| 2008/0311524 A1 | 12/2008 | Vermeersch et al. | |
| 2010/0040976 A1 | 2/2010 | Callant et al. | |
| 2010/0221662 A1 | 9/2010 | Callant et al. | |
| 2015/0360498 A1* | 12/2015 | Mizuno | G03C 1/685 252/600 |
| 2016/0326372 A1 | 11/2016 | Mizuno et al. | |
| 2017/0123315 A1 | 5/2017 | Mizuno et al. | |

FOREIGN PATENT DOCUMENTS

| | | |
|---|---|---|
| CN | 105190436 A | 12/2015 |
| CN | 106661338 A | 5/2017 |
| EP | 2 963 495 A1 | 1/2016 |
| JP | 61-248789 A | 11/1986 |
| JP | 2006-96027 A | 4/2006 |
| JP | 2008-544053 A | 12/2008 |
| JP | 2008-544322 A | 12/2008 |
| JP | 2013-199089 A | 10/2013 |
| JP | 2017-13318 A | 1/2017 |
| JP | 2017132227 A * | 8/2017 |
| WO | 2010/033182 A1 | 3/2010 |

(Continued)

OTHER PUBLICATIONS

Communication dated Feb. 19, 2019, issued by the European Patent Office in counterpart European Application No. 17753139.9.

(Continued)

*Primary Examiner* — Chanceity N Robinson
(74) *Attorney, Agent, or Firm* — Sughrue Mion PLLC

(57) ABSTRACT

A color developing composition containing a compound represented by the Formula (1) as defined herein, a lithographic printing plate precursor including a support and an image-recording layer containing the color developing composition, a method for producing a lithographic printing plate including: exposing the lithographic printing plate precursor in an image pattern; and removing a non-exposed portion in the image-recording layer using at least one of printing ink or dampening water on a printer, and a color developing compound represented by the Formula (1) as defined herein.

15 Claims, No Drawings

(56) References Cited

FOREIGN PATENT DOCUMENTS

| WO | 2014/132721 A1 | 9/2014 | |
| WO | WO-2014132721 A1 * | 9/2014 | ........... B41C 1/1008 |
| WO | 2015/115598 A1 | 8/2015 | |
| WO | 2016/027886 A | 2/2016 | |
| WO | WO-2016027886 A1 * | 2/2016 | |
| WO | 2018/043125 A1 | 3/2018 | |

OTHER PUBLICATIONS

Office Action dated Mar. 20, 2019 by the State Intellectual Property Office of P.R. China in counterpart Chinese Patent Application No. 201780012745.1.
Communication dated Jul. 9, 2019, from the Japanese Patent Office in counterpart application No. 2018-500109.
Search Report dated Apr. 4, 2017 by the International Searching Authority in counterpart International Patent Application No. PCT/JP2017/005199. (PCT/ISA/210).
Written Opinion dated Apr. 4, 2017 by the International Searching Authority in counterpart International Patent Application No. PCT/JP2017/005199. (PCT/ISA/237).
International Preliminary Report on Patentability issued from the International Bureau in counterpart International Application No. PCT/JP2017/005199, dated Aug. 21, 2018 (PCT/IB/373).
Office Action dated Aug. 28, 2019, issued by the Indian Patent Office in counterpart Indian Application No. 20187031035.
Office Action dated Nov. 29, 2019, issued by the State Intellectual Property Office of P.R. China in counterpart Chinese Application No. 201780012745.1.
Office Action dated Feb. 25, 2020, issued by the Japanese Patent Office in counterpart Japanese Application No. 2018-500109.
Office Action dated Apr. 24, 2020 in corresponding Chinese Application No. 201780012745.1 (15 pages total including translation).
Communication dated Oct. 22, 2020, issued by the European Patent Office in couterpart European Application No. 17753139.9.
Office Action dated Jul. 3, 2020, issued by the Patent Office of India in counterpart Indian Application No. 201847031035.

* cited by examiner

COLOR DEVELOPING COMPOSITION, LITHOGRAPHIC PRINTING PLATE PRECURSOR, METHOD FOR PRODUCING LITHOGRAPHIC PRINTING PLATE, AND COLOR DEVELOPING COMPOUND

CROSS REFERENCE TO RELATED APPLICATION

This is a continuation of International Application No. PCT/JP2017/005199 filed on Feb. 13, 2017, and claims priority from Japanese Patent Application No. 2016-030505 filed on Feb. 19, 2016 and Japanese Patent Application No. 2017-021607 filed on Feb. 8, 2017, the entire disclosures of which are incorporated herein by reference.

BACKGROUND OF THE INVENTION

1. Field of the Invention

The present invention relates to a color developing composition, a lithographic printing plate precursor, a method for producing a lithographic printing plate, and a color developing compound.

2. Description of the Related Art

Generally, a lithographic printing plate includes a lipophilic image area that receives ink in a printing process and a hydrophilic non-image area that receives dampening water. Lithographic printing is a method in which the properties of water and oil-based ink that repel each other are used, the lipophilic image area of the lithographic printing plate is used as an ink-receiving portion, the hydrophilic non-image area is used as a dampening water-receiving portion (non-ink-receiving portion), a difference in the adhesive property of ink to the surface of the lithographic printing plate is caused, the ink is inked only in the image area, and then the ink is transferred to a body to be printed such as paper, thereby carrying out printing.

At the moment, in a plate making step of producing a lithographic printing plate from a lithographic printing plate precursor, image exposure is carried out using a computer to plate (CTP) technology. That is, image exposure is directly carried out on a lithographic printing plate precursor by means of scanning, exposure, or the like using a laser or a laser diode without using a lith film.

In addition, due to the intensifying interest in the global environment, regarding the plate making of lithographic printing plate precursors, an environmental issue of waste liquid generated by wet processes such as a development process has gathered attention, and accordingly, there have been attempts to simplify or remove development processes. As one of simple development processes, a method called "on-machine development" has been proposed. The on-machine development refers to a method in which, after the image exposure of a lithographic printing plate precursor, a development process of the related art is not carried out, and instead, the lithographic printing plate precursor is attached to a printer, and unnecessary portions in an image-recording layer are removed at the initial phase of an ordinary printing step.

Generally, as a previous step of attaching the lithographic printing plate to the printer, an operation of inspecting and identifying an image on the lithographic printing plate (the inspection of the plate) in order to check whether image is recorded as intended on the lithographic printing plate is carried out. Particularly, in polychromatic printing, the capability of determining whether or not a register mark, which serves as a mark for registration, is drawn is critical in printing operations.

In lithographic printing plate precursors that are subjected to an ordinary development process step, generally, an image-recording layer is colored, thereby obtaining a colored image by means of a development process, and thus it is easy to check the image before the printing plate is attached to a printer.

Meanwhile, in on-machine development-type or process-less (development-less)-type lithographic printing plate precursors on which an ordinary development process is not carried out, it is difficult to check an image on the lithographic printing plate precursor in a phase of attaching the lithographic printing plate precursor to a printer, and thus it is impossible to sufficiently inspect the plate. Therefore, for on-machine development-type or process-less (development-less)-type lithographic printing plate precursors, there is a demand for means for checking an image in a phase of being exposed, that is, the formation of a so-called print-out image in which an exposed region develops or does not develop a color. Furthermore, from the viewpoint of improving workability, it is also critical that an exposed region which develops or does not develop a color remains unchanged regardless of the elapsing of time and a state of developing or not developing colors is maintained.

As means for forming a print-out image, JP2008-544053A and JP2008-544322A describe a thermosensitive image-forming element containing an IR dye having a specific structure capable of forming a print-out image using infrared rays or heat, a thermosensitive lithographic printing plate precursor, and a method for producing a lithographic printing plate using the same.

In addition, JP2013-199089A describes a lithographic printing plate precursor containing a compound having a specific structure, an IR dye having a specific structure, and the like and a method for producing a lithographic printing plate using the same.

SUMMARY OF THE INVENTION

However, the thermosensitive image-forming element containing an infrared absorbing dye described in JP2008-544053A, JP2008-544322A, and JP2013-199089A does not have sufficient color developability. In addition, the lithographic printing plate precursor containing an infrared absorbing dye described in JP2008-544053A, JP2008-544322A, and JP2013-199089A does not have sufficient visibility (plate inspection properties) due to the color developability. Furthermore, the on-machine developability are not sufficient. Additionally, it has been clarified that the stability in a case in which the lithographic printing plate precursor is exposed to white light (hereinafter, also referred to as white light stability) is not sufficient, and the on-machine developability degrade.

An object of the present invention is to provide a color developing composition which has excellent color developability and does not significantly discolor after aged.

Another object of the present invention is to provide a lithographic printing plate precursor which has excellent visibility by means of color development, is capable of maintaining excellent visibility even after aged, exhibits favorable on-machine developability, has excellent white light stability, and is also favorable in terms of printing resistance and tone reproducibility and a method for producing a lithographic printing plate in which the lithographic printing plate precursor is used.

Still another object of the present invention is to provide a color developing compound which has excellent color developability and does not significantly discolor after aged.

The present inventors found that the above-described objects can be achieved using a compound represented by Formula (1) and completed the present invention.

The present invention includes constitutions described below.

(1) A color developing composition comprising: a compound represented by Formula (1),

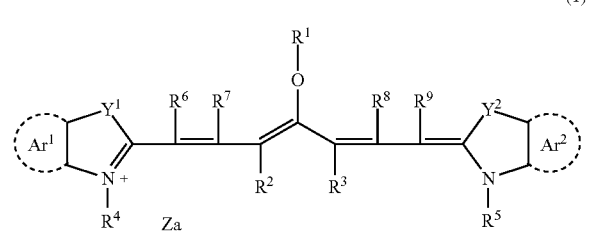

(1)

in Formula (1), $R^1$ represents a group in which an $R^1$—O bond is cleaved by heat or exposure to infrared rays, $R^2$ and $R^3$ each independently represent a hydrogen atom or an alkyl group, or $R^2$ and $R^3$ may be linked to each other to form a ring, $Ar^1$ and $Ar^2$ each independently represent a group forming a benzene ring or a naphthalene ring, $Y^1$ and $Y^2$ each independently represent an oxygen atom, a sulfur atom, —$NR^0$—, or a dialkyl methylene group, $R^4$ and $R^5$ each independently represent an alkyl group or a group represented by one of Formulae (2) to (4), $R^6$ to $R^9$ each independently represent a hydrogen atom or an alkyl group, $R^0$ represents a hydrogen atom, an alkyl group, or an aryl group, and Za represents a counter ion for neutralizing a charge; provided that the compound represented by Formula (1) has at least one of groups represented by Formulae (2) to (4) as $R^4$ or $R^5$ or in $R^1$, $Ar^1$, or $Ar^2$,

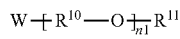  (2)

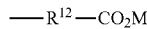  (3)

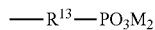  (4)

in Formulae (2) to (4), $R^{10}$ represents an alkylene group having 2 to 6 carbon atoms, W represents a single bond or an oxygen atom, n1 represents an integer of 1 to 45, $R^{11}$ represents an alkyl group having 1 to 12 carbon atoms or —C(=O)—$R^{14}$, $R^{14}$ represents an alkyl group having 1 to 12 carbon atoms, $R^{12}$ and $R^{13}$ each independently represent a single bond or an alkylene group having 1 to 12 carbon atoms, and M represents a hydrogen atom, a Na atom, a K atom, or an onium group.

(2) The color developing composition according to (1), in which $R^1$ in Formula (1) is a group represented by Formula (5),

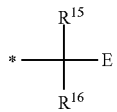  (5)

in Formula (5), $R^{15}$ and $R^{16}$ each independently represent a hydrogen atom, an alkyl group, or an aryl group, E represents an onium group, and * represents a bonding site.

(3) The color developing composition according to (2), in which E in Formula (5) is a pyridinium group represented by Formula (6),

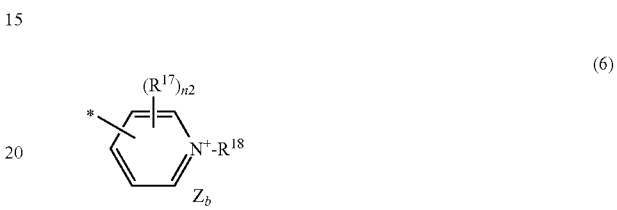  (6)

in Formula (6), $R^{17}$ represents a halogen atom, an alkyl group, an aryl group, a hydroxy group, or an alkoxy group; in a case in which a plurality of $R^{17}$'s is present, the plurality of $R^{17}$'s may be identical to or different from each other or the plurality of $R^{17}$'s may be linked to each other to form a ring, n2 represents an integer of 0 to 4, $R^{18}$ represents an alkyl group, an aryl group, or a group represented by any of Formulae (2) to (4), and $Z_b$ represents a counter ion for neutralizing a charge.

(4) The color developing composition according to any one of (1) to (3), in which $Ar^1$ or $Ar^2$ in Formula (1) is a group forming a group represented by Formula (7),

  (7)

in Formula (7), $R^{19}$ represents an alkyl group having 1 to 12 carbon atoms or a group represented by any of Formulae (2) to (4), n3 represents an integer of 1 to 4, and * represents a bonding site.

(5) The color developing composition according to any one of (1) to (4), in which the compound represented by Formula (1) has at least one group represented by Formula (2) as $R^4$ or $R^5$ or in $R^1$, $Ar^1$, or $Ar^2$.

(6) The color developing composition according to any one of (1) to (5), in which $R^4$ and $R^5$ in Formula (1) are the group represented by Formula (2).

(7) The color developing composition according to any one of (1) to (6), further comprising: a binder polymer.

(8) The color developing composition according to any one of (1) to (7), further comprising: a polymerizable compound.

(9) The color developing composition according to any one of (1) to (8), further comprising: a polymerization initiator.

(10) The color developing composition according to any one of (1) to (9), further comprising: an acid color developer.

(11) The color developing composition according to (10), in which the acid color developer is at least one compound selected from the group consisting of a spiropyran compound, a spirooxazine compound, a spirolactone compound, and a spirolactam compound.

(12) A lithographic printing plate precursor comprising: an image-recording layer containing the color developing composition according to any one of (1) to (11), on a support.

(13) The lithographic printing plate precursor according to (12), further comprising: a protective layer on the image-recording layer.

(14) A method for producing a lithographic printing plate comprising: exposing the lithographic printing plate precursor according to (12) or (13) in an image pattern; and removing a non-exposed portion in the image-recording layer using at least one of printing ink or dampening water on a printer.

(15) A color developing compound represented by Formula (1),

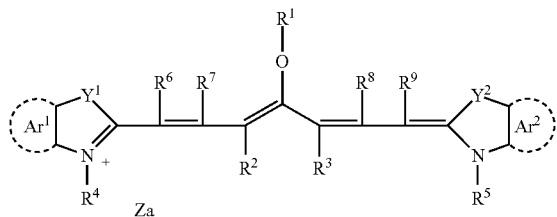

(1)

in Formula (1), $R^1$ represents a group in which an $R^1$—O bond is cleaved by heat or exposure to infrared rays, $R^2$ and $R^3$ each independently represent a hydrogen atom or an alkyl group, or $R^2$ and $R^3$ may be linked to each other to form a ring, $Ar^1$ and $Ar^2$ each independently represent a group forming a benzene ring or a naphthalene ring, $Y^1$ and $Y^2$ each independently represent an oxygen atom, a sulfur atom, —$NR^0$—, or a dialkyl methylene group, $R^4$ and $R^5$ each independently represent an alkyl group or a group represented by one of Formulae (2) to (4), $R^6$ to $R^9$ each independently represent a hydrogen atom or an alkyl group, $R^0$ represents a hydrogen atom, an alkyl group, or an aryl group, and Za represents a counter ion for neutralizing a charge; provided that the compound represented by Formula (1) has at least one of groups represented by Formulae (2) to (4) as $R^4$ or $R^5$ or in $R^1$, $Ar^1$, or $Ar^2$, $$—W+R^{10}-O+_{n1}R^{11} \quad (2)$$

$$—R^{12}-CO_2M \quad (3)$$

$$—R^{13}-PO_3M_2 \quad (4)$$

in Formulae (2) to (4), $R^{10}$ represents an alkylene group having 2 to 6 carbon atoms, W represents a single bond or an oxygen atom, n1 represents an integer of 1 to 45, $R^{11}$ represents an alkyl group having 1 to 12 carbon atoms or —C(=O)—$R^{14}$, $R^{14}$ represents an alkyl group having 1 to 12 carbon atoms, $R^{12}$ and $R^{13}$ each independently represent a single bond or an alkylene group having 1 to 12 carbon atoms, and M represents a hydrogen atom, a Na atom, a K atom, or an onium group.

According to the present invention, it is possible to provide a color developing composition which has excellent color developability and does not significantly discolor after aged.

In addition, according to the present invention, it is possible to provide a lithographic printing plate precursor which has excellent visibility by means of color development, is capable of maintaining excellent visibility even after aged, exhibits favorable on-machine developability, has excellent white light stability, and is also favorable in terms of printing resistance and tone reproducibility.

Furthermore, according to the present invention, it is possible to provide a method for producing a lithographic printing plate in which the lithographic printing plate precursor is used.

Furthermore, according to the present invention, it is possible to provide a color developing compound which has excellent color developability and does not significantly discolor after aged.

DESCRIPTION OF THE PREFERRED EMBODIMENTS

Hereinafter, the present invention will be described in detail.

[Color Developing Composition]

A color developing composition according to the present invention contains a compound represented by Formula (1).

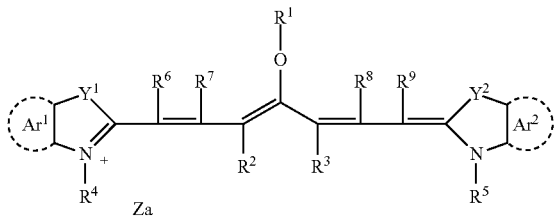

(1)

in Formula (1), $R^1$ represents a group in which an $R^1$—O bond is cleaved by heat or exposure to infrared rays. $R^2$ and $R^3$ each independently represent a hydrogen atom or an alkyl group, or $R^2$ and $R^3$ may be linked to each other to form a ring. $Ar^1$ and $Ar^2$ each independently represent a group forming a benzene ring or a naphthalene ring. $Y^1$ and $Y^2$ each independently represent an oxygen atom, a sulfur atom, —$NR^0$—, or a dialkyl methylene group. $R^4$ and $R^5$ each independently represent an alkyl group or a group represented by one of Formulae (2) to (4). $R^6$ to $R^9$ each independently represent a hydrogen atom or an alkyl group. $R^0$ represents a hydrogen atom, an alkyl group, or an aryl group. Za represents a counter ion for neutralizing a charge; here, the compound represented by Formula (1) has at least one of groups represented by Formulae (2) to (4) as $R^4$ or $R^5$ or in $R^1$, $Ar^1$, or $Ar^2$.

$$—W+R^{10}-O+_{n1}R^{11} \quad (2)$$

$$—R^{12}-CO_2M \quad (3)$$

$$—R^{13}-PO_3M_2 \quad (4)$$

In Formulae (2) to (4), $R^{10}$ represents an alkylene group having 2 to 6 carbon atoms. W represents a single bond or an oxygen atom. n1 represents an integer of 1 to 45. $R^{11}$ represents an alkyl group having 1 to 12 carbon atoms or —C(=O)—$R^{14}$. $R^{14}$ represents an alkyl group having 1 to 12 carbon atoms. $R^{12}$ and $R^{13}$ each independently represent a single bond or an alkylene group having 1 to 12 carbon atoms. M represents a hydrogen atom, a Na atom, a K atom, or an onium group.

<Compound Represented by Formula (1)>

The compound represented by Formula (1) which is contained in the color developing composition according to the present invention (hereinafter, in some cases, simply referred to as the compound A) will be described in detail.

The compound represented by Formula (1) has characteristics of being decomposed by heat or exposure to infrared rays and generating highly visible color-developing bodies. In the present specification, color development refers to the fact that stronger coloration occurs or absorption occurs at shorter wavelengths after heating or exposure to infrared rays than before heating and exposure to infrared rays and absorption occurs in the visible light range. That is, the compound represented by Formula (1) is a compound which is decomposed by heat or exposure to infrared rays and in which, compared with before heating and exposure to infrared rays, absorption increases in the visible light range or absorption occurs at shorter wavelengths and absorption occurs in the visible light range. The compound represented by Formula (1) is preferably a compound which is decomposed by heat or exposure to infrared rays and generates a compound having a maximum absorption wavelength in a range of 500 to 600 nm.

The color development mechanism of the compound represented by Formula (1) is considered as follows: the $R^1$—O bond is cleaved by heat or exposure to infrared rays, the cleaved oxygen atoms form a carbonyl group, and a merocyanine colorant which is a highly visible color-developing body is generated.

In addition, in order to generate a merocyanine colorant, the bonding between $R^1$ and a cyanine colorant structure through an oxygen atom as well as having a group in which the $R^1$—O bond is cleaved by heat or exposure to infrared rays as $R^1$ is also important.

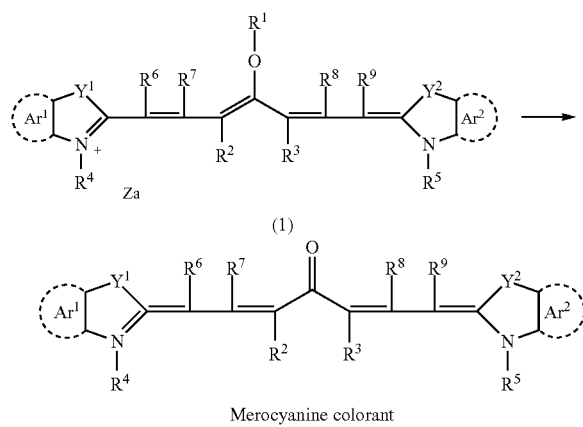

Merocyanine colorant

In Formula (1), $R^1$ represents a group in which the $R^1$—O bond is cleaved by heat or exposure to infrared rays. Specific examples thereof include groups in which the decomposition or isomerization reaction of the compound represented by Formula (1) proceeds due to heat energy supplied from the outside, energy generated in a case in which the compound returns to the ground state from the excited state generated after absorbing infrared rays, or a chemical reaction proceeding from the excited state and the $R^1$—O bond is cleaved.

In a case in which $R^1$ is an aryl group or a linear alkyl group, the $R^1$—O bond is not cleaved by heat or exposure to infrared rays.

The group represented by $R^1$ will be described below in more detail.

The alkyl group as $R^2$ to $R^9$ and $R^0$ is preferably an alkyl group having 1 to 30 carbon atoms, more preferably an alkyl group having 1 to 15 carbon atoms, and still more preferably an alkyl group having 1 to 10 carbon atoms. The alkyl group may have a linear shape or a branch and may have a ring structure.

Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among these alkyl groups, a methyl group, an ethyl group, a propyl group, and a butyl group are particularly preferred.

In addition, the alkyl group may have a substituent. Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, a group formed of a combination thereof, and the like.

The aryl group as $R^0$ is preferably an aryl group having 6 to 30 carbon atoms, more preferably an aryl group having 6 to 20 carbon atoms, and still more preferably an aryl group having 6 to 12 carbon atoms.

The aryl group may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, a group formed of a combination thereof, and the like.

Specific examples thereof include a phenyl group, a naphthyl group, a p-tolyl group, a p-chlorophenyl group, a p-fluorophenyl group, a p-methoxyphenyl group, a p-dimethylaminophenyl group, a p-methyl thiophenyl group, a p-phenylthiophenyl group, and the like.

Among these aryl groups, a phenyl group, a p-methoxyphenyl group, a p-dimethylaminophenyl group, or a naphthyl group is preferred.

$R^2$ and $R^3$ are preferably linked to each other to form a ring.

In a case in which $R^2$ and $R^3$ are linked to each other to form a ring, a five-membered ring or a six-membered ring is preferred, and a five-membered ring is particularly preferred.

$Y^1$ and $Y^2$ each independently represent an oxygen atom, a sulfur atom, —NR$^0$—, or a dialkyl methylene group and are preferably —NR$^0$— or a dialkyl methylene group and more preferably a dialkyl methylene group.

$R^0$ represents a hydrogen atom, an alkyl group, or an aryl group and is preferably an alkyl group.

The group represented by one of Formulae (2) to (4) as $R^4$ or $R^5$ will be described below in detail.

$R^4$ and $R^5$ are preferably identical groups.

$R^6$ to $R^9$ each independently represent a hydrogen atom or an alkyl group and are preferably a hydrogen atom.

$Ar^1$ and $Ar^2$ each independently represent a group forming a benzene ring or a naphthalene ring. The benzene ring or the naphthalene ring may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, an acyloxy group, a phosphonic acid group, a group formed of a combination thereof, and the like. As the substituent, an alkyl group is preferred.

In addition, from the viewpoint of an increase in the maximum absorption wavelength of the compound represented by Formula (1) and the improvement of color developability and printing resistance in lithographic printing plates, $Ar^1$ and $Ar^2$ each are independently preferably a group forming a naphthalene ring or a benzene ring having an alkyl group or an alkoxy group as a substituent, more preferably a group forming a naphthalene ring or a benzene ring having an alkoxy group as a substituent, and particularly preferably a group forming a naphthalene ring or a benzene ring having a methoxy group as a substituent.

In Formula (1), $Ar^1$ or $Ar^2$ is preferably a group forming a group represented by Formula (7).

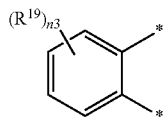

(7)

In Formula (7), $R^{19}$ represents an alkyl group having 1 to 12 carbon atoms or a group represented by any of Formulae (2) to (4). n3 represents an integer of 1 to 4. * represents a bonding site.

Za represents a counter ion for neutralizing a charge. Here, in a case in which the compound represented by Formula (1) has a corresponding ionic substituent in the structure, and the neutralization of a charge is not necessary, Za is not required. In a case in which Za represents an anion, examples thereof include a sulfonate ion, a carboxylate ion, a tetrafluoroborate ion, a hexafluorophosphate ion, a p-toluenesulfonate ion, a perchlorate ion, and the like, and a hexafluorophosphate ion is particularly preferred. In a case in which Za represents a cation, examples thereof include an alkali metal ion, an alkaline earth metal ion, an ammonium ion, a pyridinium ion, a sulfonium ion, and the like, a sodium ion, a potassium ion, an ammonium ion, a pyridinium ion, or a sulfonium ion is preferred, and a sodium ion, a potassium ion, or an ammonium ion is more preferred.

$R^1$ to $R^9$, $R^0$, $Ar^1$, $Ar^2$, $Y^1$, and $Y^2$ may have an anion structure or a cation structure, and, in a case in which all of $R^1$ to $R^9$, $R^0$, $Ar^1$, $Ar^2$, $Y^1$, and $Y^2$ are electrically neutral groups, Za is a monovalent counter anion, and, for example, in a case in which $R^1$ to $R^9$, $R^0$, $Ar^1$, $Ar^2$, $Y^1$, and $Y^2$ have two or more anion structures, Za may also become a counter cation.

The group represented by $R^1$ will be described below in detail.

From the viewpoint of color developability, $R^1$ is preferably a group represented by any of Formulae (1-1) to (1-7) and more preferably a group represented by any of Formulae (1-1) to (1-3).

(1-1)

(1-2)

(1-3)

(1-4)

(1-5)

(1-6)

(1-7)

In Formulae (1-1) to (1-7), • represents a bonding site with the O atom in Formula (1), $R^{20}$'s each independently represent a hydrogen atom, an alkyl group, an alkenyl group, an aryl group, $-OR^{24}$, $-NR^{25}R^{26}$, or $-SR^{27}$, $R^{21}$'s each independently represent a hydrogen atom, an alkyl group, or an aryl group, $R^{22}$ represents an aryl group, $-OR^{24}$, $-NR^{25}R^{26}$, $-SR^{27}$, $-C(=O)R^{28}$, $-OC(=O)R^{28}$, or a halogen atom, $R^{23}$ represents an aryl group, an alkenyl group, an alkoxy group, or an onium group, $R^{24}$ to $R^{27}$ each independently represent a hydrogen atom, an alkyl group, or an aryl group, $R^{28}$ represents an alkyl group, an aryl group, $-OR^{24}$, $-NR^{25}R^{26}$, or $-SR^{27}$, and $Z^1$ represents a counter ion for neutralizing a charge.

In a case in which $R^{20}$, $R^{21}$, and $R^{24}$ to $R^{28}$ are alkyl groups, the preferred aspects thereof are identical to the preferred aspects of the alkyl group as $R^2$ to $R^9$ and $R^0$.

The number of carbon atoms in the alkenyl group as $R^{20}$ and $R^{23}$ is preferably 1 to 30, more preferably 1 to 15, and still more preferably 1 to 10.

In a case in which $R^{20}$ to $R^{28}$ are aryl groups, the preferred aspects thereof are identical to the preferred aspects of the aryl group as $R^0$.

From the viewpoint of color developability, $R^{20}$ in Formula (1-1) is preferably an alkyl group, an alkenyl group, an aryl group, $-OR^{24}$, $-NR^{25}R^{26}$, or $-SR^{27}$, more preferably an alkyl group, $-OR^{24}$, $-NR^{25}R^{26}$, or $-SR^{27}$, still more preferably an alkyl group or $-OR^{24}$, and particularly preferably $-OR^{24}$.

In addition, in a case in which $R^{20}$ in Formula (1-1) is an alkyl group, the alkyl group may be an alkyl group having an arylthio group, an alkyloxycarbonyl group, or an arylsulfonyl group at the α-position and is preferably an alkyl group having an arylthio group or an alkyloxycarbonyl group at the α-position.

In a case in which $R^{20}$ in Formula (1-1) is —$OR^{24}$, $R^{24}$ is preferably an alkyl group, more preferably an alkyl group having 1 to 8 carbon atoms, still more preferably an isopropyl group or a tert-butyl group, and particularly preferably a t-butyl group.

In a case in which $R^{20}$ in Formula (1-1) is an alkenyl group, the alkenyl group may be an alkenyl group having an aryl group or a hydroxyaryl group.

From the viewpoint of color developability, $R^{21}$ in Formula (1-2) is preferably a hydrogen atom.

In addition, from the viewpoint of color developability, $R^{22}$ in Formula (1-2) is preferably —C(=O)$OR^{24}$, —OC(=O)$OR^{24}$, or a halogen atom and more preferably —C(=O)$OR^{24}$ or —OC(=O)$OR^{24}$. In a case in which $R^{22}$ in Formula (1-2) is —C(=O)$OR^{24}$ or —OC(=O)$OR^{24}$, $R^{24}$ is preferably an alkyl group.

From the viewpoint of color developability, $R^{21}$'s in Formula (1-3) each are independently preferably a hydrogen atom or an alkyl group, and at least one $R^{21}$ in Formula (1-3) is more preferably an alkyl group.

In addition, the alkyl group as $R^{21}$ is preferably an alkyl group having 1 to 10 carbon atoms and more preferably an alkyl group having 3 to 10 carbon atoms.

Furthermore, the alkyl group as $R^{21}$ is preferably an alkyl group having a branch, more preferably a secondary or tertiary alkyl group, and still more preferably an isopropyl group, a cyclopentyl group, a cyclohexyl group, or a tert-butyl group.

In addition, from the viewpoint of color developability, $R^{23}$ in Formula (1-3) is preferably an aryl group, an alkoxy group, or an onium group, more preferably p-dimethylaminophenyl group or a pyridinium group, and still more preferably a pyridinium group.

Examples of the onium group as $R^{23}$ include a pyridinium group, an ammonium group, a sulfonium group, and the like. The onium group may have a substituent. Examples of the substituent include an alkyl group, an aryl group, an alkoxy group, an aryloxy group, an amino group, an alkylthio group, an arylthio group, a halogen atom, a carboxy group, a sulfo group, an alkyloxycarbonyl group, an aryloxycarbonyl group, a group formed of a combination thereof, and the like, and an alkyl group, an aryl group, and a group formed of a combination thereof are preferred.

Among these, a pyridinium group is preferred, an N-alkyl-3-pyridinium group, an N-benzyl-3-pyridinium group, an N-(alkoxy polyalkyleneoxy alkyl)-3-pyridinium group, an N-alkoxycarbonylmethyl-3-pyridinium group, an N-alkyl-4-pyridinium group, an N-benzyl-4-pyridinium group, an N-(alkoxy polyalkyleneoxy alkyl)-4-pyridinium group, an N-alkoxycarbonylmethyl-4-pyridinium group, or an N-alkyl-3,5-dimethyl-4-pyridinium group is more preferred, an N-alkyl-3-pyridinium group or an N-alkyl-4-pyridinium group is still more preferred, an N-methyl-3-pyridinium group, an N-octyl-3-pyridinium group, an N-methyl-4-pyridinium group, or an N-octyl-4-pyridinium group is particularly preferred, and an N-octyl-3-pyridinium group or an N-octyl-4-pyridinium group is most preferred.

In addition, in a case in which $R^{23}$ is a pyridinium group, examples of the counter anion include a sulfonate ion, a carboxylate ion, a tetrafluoroborate ion, a hexafluorophosphate ion, a p-toluenesulfonate ion, a perchlorate ion, and the like, and a p-toluenesulfonate ion or a hexafluorophosphate ion is preferred.

From the viewpoint of color developability, $R^{20}$'s in Formula (1-4) are preferably alkyl groups or aryl groups, and it is more preferable that one of the two $R^{20}$'s is an alkyl group and the other is an aryl group. The two $R^{20}$'s may be linked to each other to form a ring.

From the viewpoint of color developability, $R^{20}$ in Formula (1-5) is preferably an alkyl group or an aryl group, more preferably an aryl group, and still more preferably a p-methylphenyl group.

From the viewpoint of color developability, $R^{20}$'s in Formula (1-6) each are independently preferably alkyl groups or aryl groups and more preferably methyl groups or phenyl groups.

From the viewpoint of color developability, $Z^1$ in Formula (1-7) may be a counter ion for neutralizing a charge and may be included in Za as the entire compound.

$Z^1$ is preferably a sulfonate ion, a carboxylate ion, a tetrafluoroborate ion, a hexafluorophosphate ion, a p-toluenesulfonate ion, or a perchlorate ion and more preferably a p-toluenesulfonate ion or a hexafluorophosphate ion.

From the viewpoint of color developability, $R^1$ is still more preferably a group represented by Formula (5).

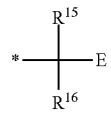

(5)

In Formula (5), $R^{15}$ and $R^{16}$ each independently represent a hydrogen atom, an alkyl group, or an aryl group, E represents an onium group, and * represents a bonding site.

The alkyl group represented by $R^{15}$ or $R^{16}$ is identical to the alkyl group as $R^2$ to $R^9$ and $R^0$, and the preferred aspect is also identical to the preferred aspect of the alkyl group as $R^2$ to $R^9$ and $R^0$.

The aryl group represented by $R^{15}$ or $R^{16}$ is identical to the aryl group as $R^0$, and the preferred aspect is also identical to the preferred aspect of the aryl group as $R^0$.

The onium group represented by E is identical to the onium group as $R^{23}$, and the preferred aspect is also identical to the preferred aspect of the onium group as $R^{23}$.

In Formula (5), the onium group represented by E is preferably a pyridinium group represented by Formula (6).

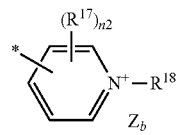

(6)

In Formula (6), $R^{17}$ represents a halogen atom, an alkyl group, an aryl group, a hydroxy group, or an alkoxy group, and, in a case in which a plurality of $R^{17}$'s is present, the plurality of $R^{17}$'s may be identical to or different from each other or the plurality of $R^{17}$'s may be linked to each other to form a ring. n2 represents an integer of 0 to 4. $R^{18}$ represents an alkyl group, an aryl group, or a group represented by any of Formulae (2) to (4). $Z_b$ represents a counter ion for neutralizing a charge.

The alkyl group or the aryl group represented by $R^{17}$ or $R^{18}$ is identical to the alkyl group as $R^2$ to $R^9$ and $R^0$ or the aryl group as $R^0$, and the preferred aspect is also identical to the preferred aspect of the alkyl group as $R^2$ to $R^9$ and $R^0$ or the aryl group as $R^0$.

The alkoxy group represented by $R^{17}$ is preferably an alkoxy group having 1 to 10 carbon atoms, and examples thereof include a methoxy group, an ethoxy group, an n-propoxy group, an isopropoxy group, an n-butoxy group, an isobutoxy group, a tert-buthoxy group, and the like.

n2 is preferably 0.

The counter ion for neutralizing a charge represented by $Z_b$ is identical to $Z^1$ in Formula (1-7), and the preferred aspect is also identical to the preferred aspect of $Z^1$ in Formula (1-7).

Hereinafter, specific examples of the group represented by $R^1$ will be illustrated, but the present invention is not limited thereto. In the following structural formulae, TsO⁻ represents a tosylate anion, and • represents a bonding site.

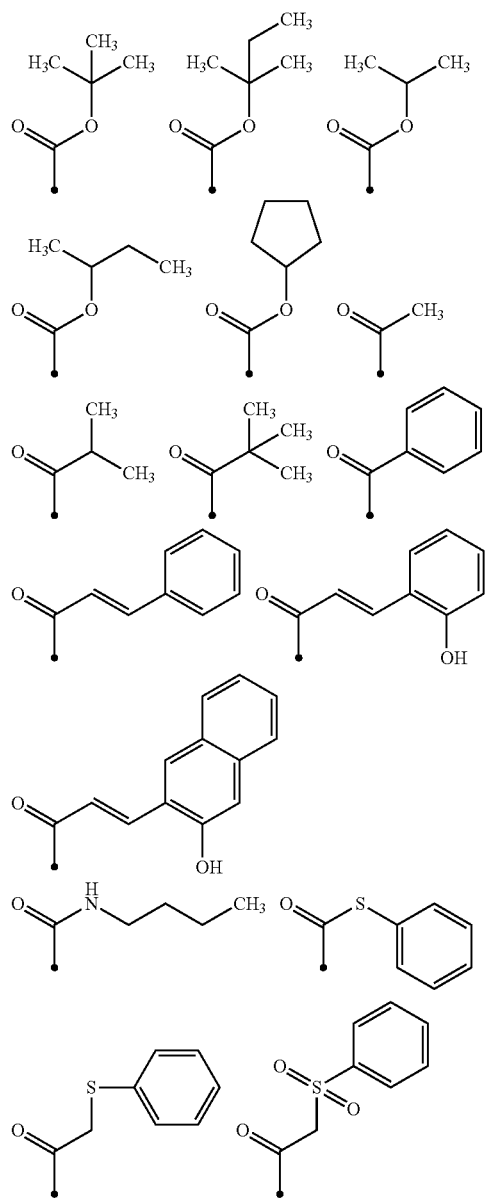
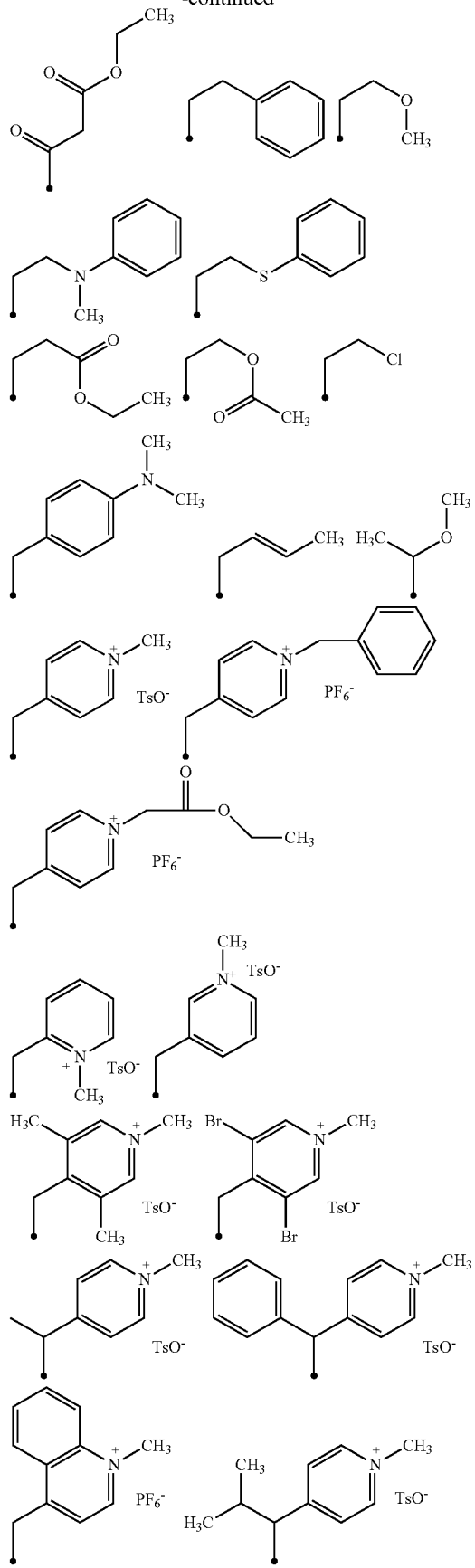

-continued
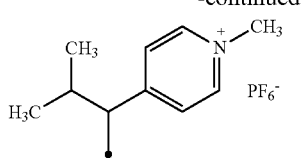
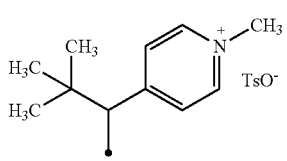
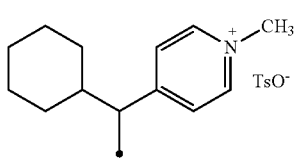
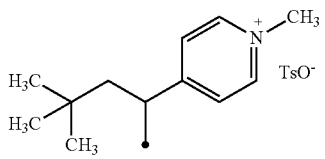
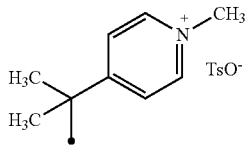
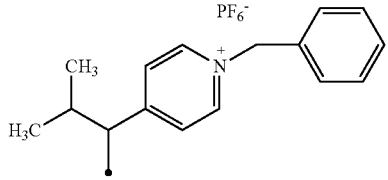
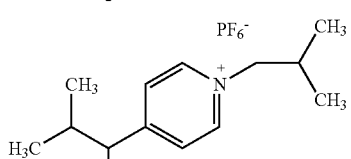
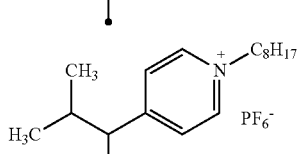
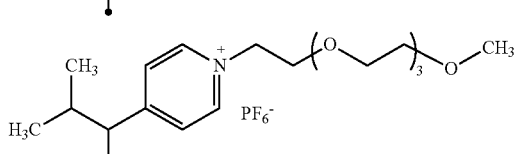
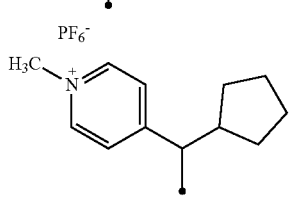
-continued
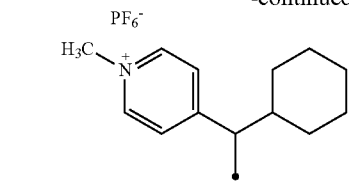
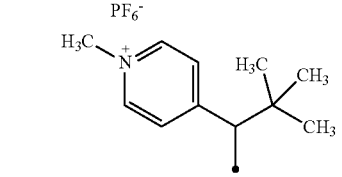
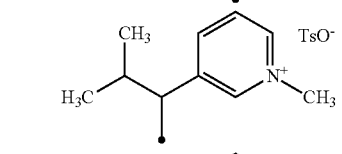
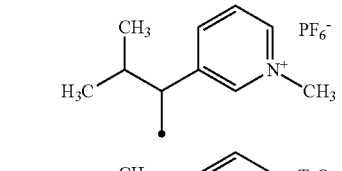
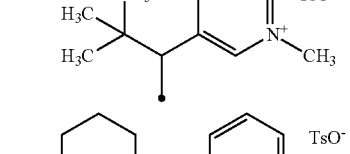
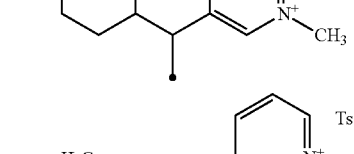
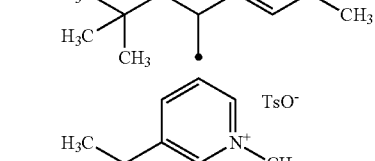
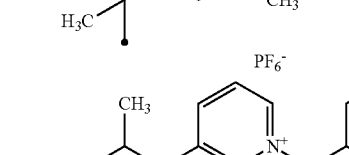
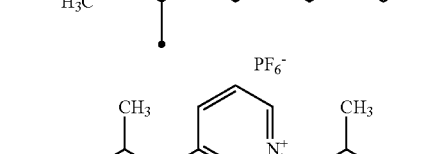
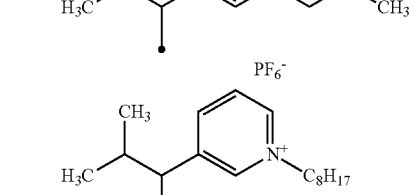

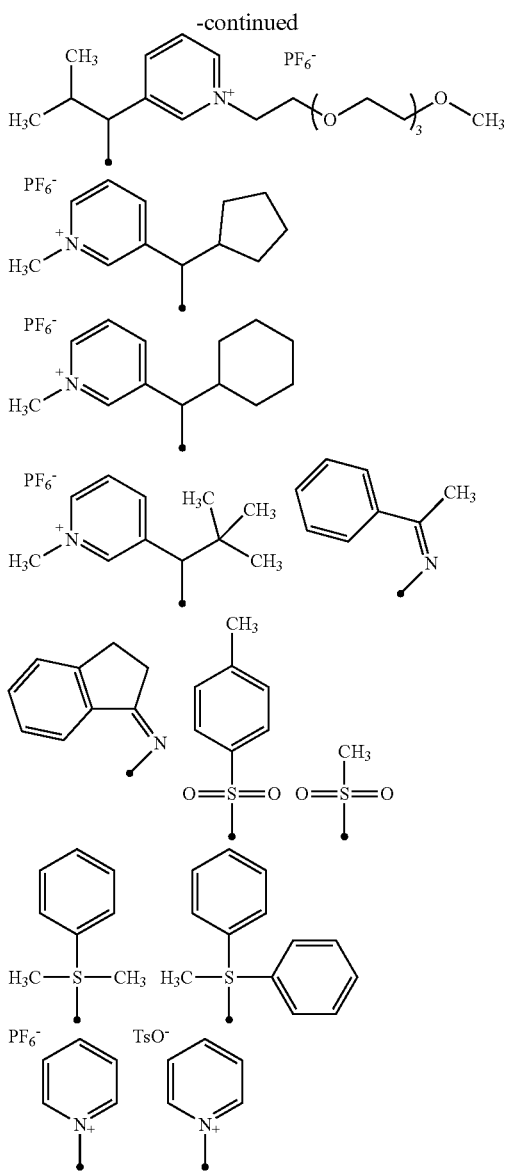

Next, the groups represented by Formulae (2) to (4), at least one of which is included in the compound represented by Formula (1), will be described.

$$—W-(R^{10}-O)_{\overline{n1}}-R^{11} \quad (2)$$

$$—R^{12}-CO_2M \quad (3)$$

$$—R^{13}-PO_3M_2 \quad (4)$$

In Formulae (2) to (4), $R^{10}$ represents an alkylene group having 2 to 6 carbon atoms. The alkylene group may be linear or branched. W represents a single bond or an oxygen atom. n1 represents an integer of 1 to 45. $R^{11}$ represents an alkyl group having 1 to 12 carbon atoms or —C(=O)—$R^{14}$. $R^{14}$ represents an alkyl group having 1 to 12 carbon atoms. $R^{12}$ and $R^{13}$ each independently represent a single bond or an alkylene group having 1 to 12 carbon atoms. The alkylene group may be linear or branched. M represents a hydrogen atom, a Na atom, a K atom, or an onium group.

Specific examples of the alkylene group represented by $R^{10}$ include an ethylene group, an n-propylene group, an isopropylene group, an n-butylene group, an isobutylene group, an n-pentylene group, an isopentylene group, an n-hexyl group, an isohexyl group, and the like, an ethylene group, an n-propylene group, an isopropylene group, and an n-butylene group are preferred, and an n-propylene group is particularly preferred.

n1 is preferably 1 to 10, more preferably 1 to 5, and particularly preferably 1 to 3.

Specific examples of the alkyl group represented by $R^{11}$ include a methyl group, an ethyl group, an n-propyl group, an isopropyl group, an n-butyl group, an isobutyl group, a tert-butyl group, an n-pentyl group, an isopentyl group, a neopentyl group, an n-hexyl group, an n-octyl group, an n-dodecyl group, and the like, a methyl group, an ethyl group, an n-propyl group, an isopropyl group, an n-butyl group, and a tert-butyl group are preferred, a methyl group and an ethyl group are more preferred, and a methyl group is particularly preferred.

The alkyl group represented by $R^{14}$ is identical to the alkyl group represented by $R^{11}$, and the preferred aspect is also identical to the preferred aspect of the alkyl group represented by $R^{11}$.

Hereinafter, specific examples of the group represented by Formula (2) will be illustrated, but the present invention is not limited thereto. In the following structural formulae, Me represents a methyl group, Et represents an ethyl group, and * represents a bonding site.

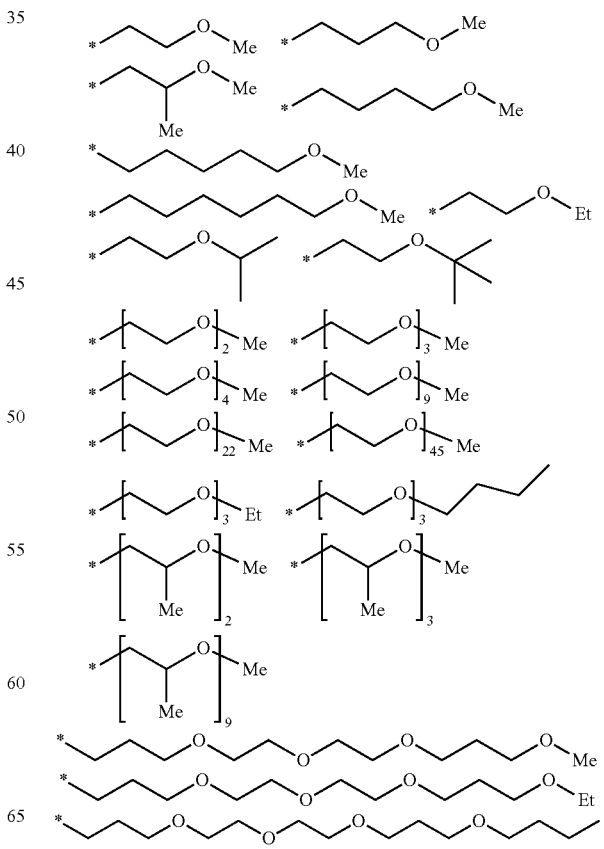

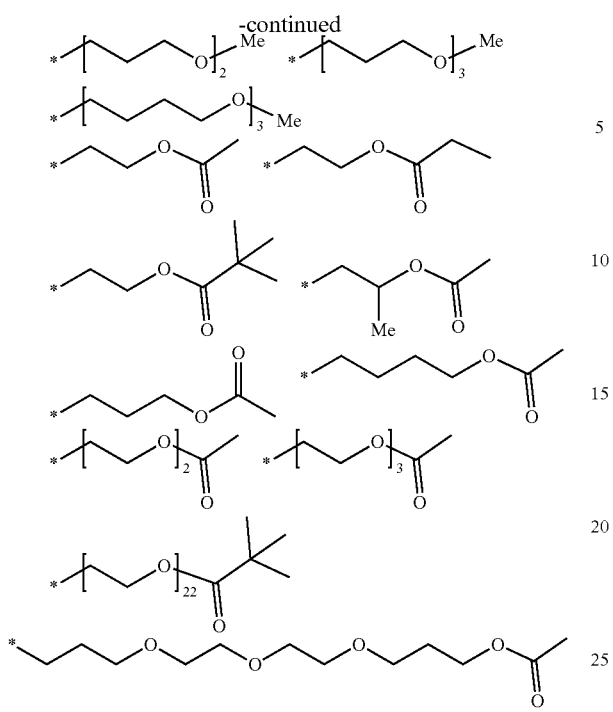

Specific examples of the alkylene group represented by $R^{12}$ or $R^{13}$ in Formula (3) or (4) include a methylene group, an ethylene group, an n-propylene group, an isopropylene group, an n-butylene group, an isobutylene group, an n-pentylene group, an isopentylene group, an n-hexyl group, an isohexyl group, an n-octylene group, an n-dodecylene group, and the like, an ethylene group, an n-propylene group, an isopropylene group, and an n-butylene group are preferred, and an ethylene group and an n-propylene group are particularly preferred.

In a case in which the group represented by Formula (3) or (4) is present in the group represented by $Ar^1$ or $Ar^2$ in the compound represented by Formula (1), $R^{12}$ or $R^{13}$ is preferably a single bond.

In a case in which the group represented by Formula (3) or (4) is present in the group represented by $R^1$ in the compound represented by Formula (1) or present as the group represented by $R^4$ or $R^5$, $R^{12}$ or $R^{13}$ is preferably an alkylene group.

In Formula (4), two M's may be identical to or different from each other.

Specific examples of the onium group represented by M in Formula (3) or (4) include an ammonium group, an iodonium group, a phosphonium group, a sulfonium group, and the like.

The ammonium group includes a group represented by Formula (A).

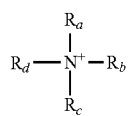

(A)

In Formula (A), $R_a$ to $R_d$ each independently represent a hydrogen atom, an aryl group having 20 or less carbon atoms, an alkyl group, an alkenyl group, or an alkynyl group.

The aryl group, the alkyl group, the alkenyl group, or the alkynyl group may have a substituent. Examples of the substituent an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an aryloxy group having 1 to 12 carbon atoms, a halogen atom, an alkylamino group having 1 to 12 carbon atoms, a dialkylamino group having 1 to 12 carbon atoms, an alkylamide or arylamide group having 1 to 12 carbon atoms, a carbonyl group, a carboxy group, a cyano group, a sulfonyl group, a thioalkyl group having 1 to 12 carbon atoms, a thioaryl group having 1 to 12 carbon atoms, and a hydroxyl group. As $R_a$ to $R_d$, a hydrogen atom, an alkyl group having 1 to 4 carbon atoms, or an aryl group having 6 carbon atoms are preferred.

Specific examples of the ammonium group will be illustrated below, but the present invention is not limited thereto. In the following structural formulae, Me represents a methyl group, and Et represents an ethyl group.

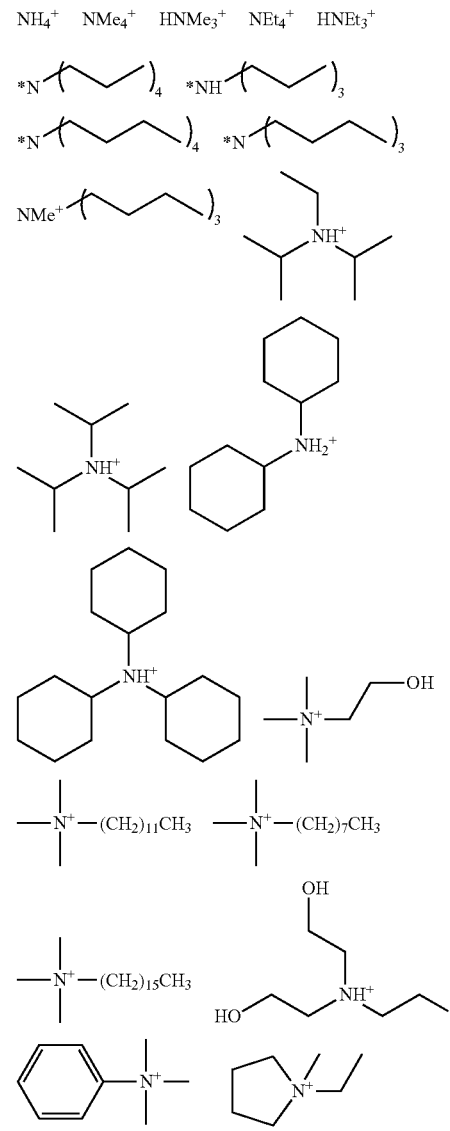

-continued

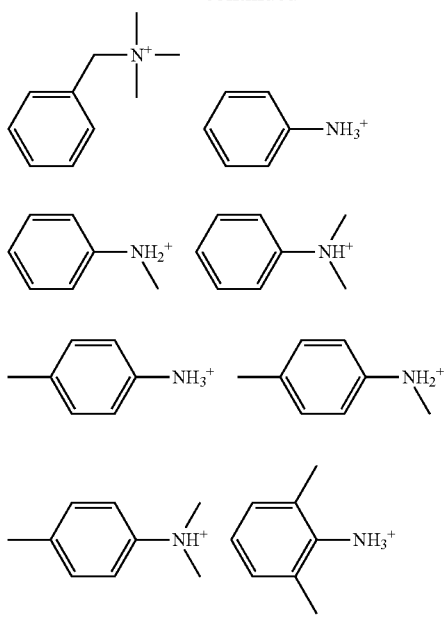

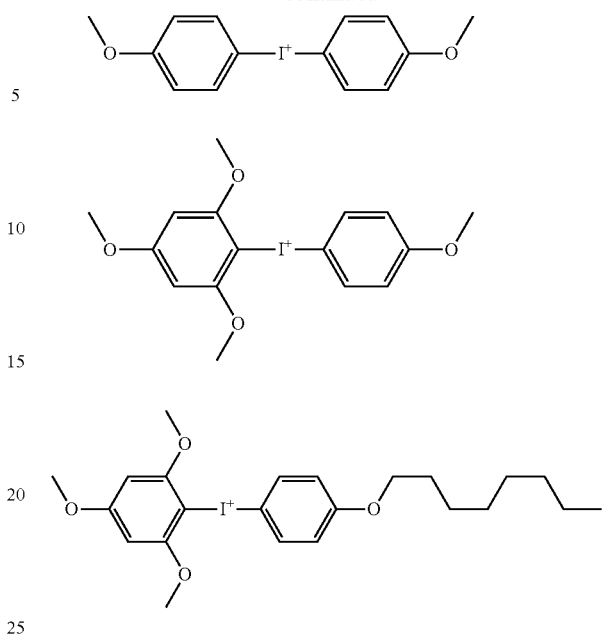

The phosphonium group includes a group represented by Formula (C).

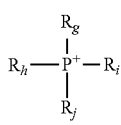

(C)

In Formula (C), $R_g$ to $R_j$ each are independently identical to $R_a$ to $R_d$ in Formula (A). Examples of preferred $R_g$ to $R_j$ include an aryl group having 6 to 20 carbon atoms.

Specific examples of the phosphonium group will be illustrated below, but the present invention is not limited thereto.

The iodonium group includes a group represented by Formula (B).

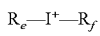 (B)

In Formula (B), $R_e$ and $R_f$ each are independently identical to $R_a$ to $R_d$ in Formula (A). Examples of preferred $R_e$ and $R_f$ include an aryl group having 6 to 20 carbon atoms.

Specific examples of the iodonium group will be illustrated below, but the present invention is not limited thereto.

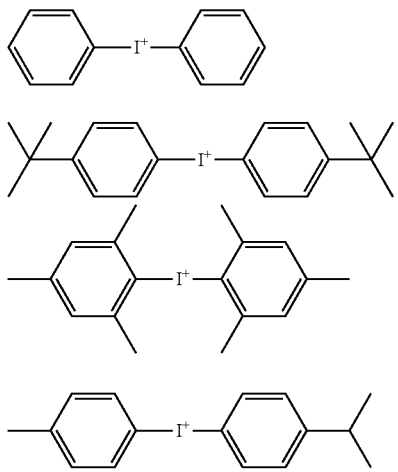

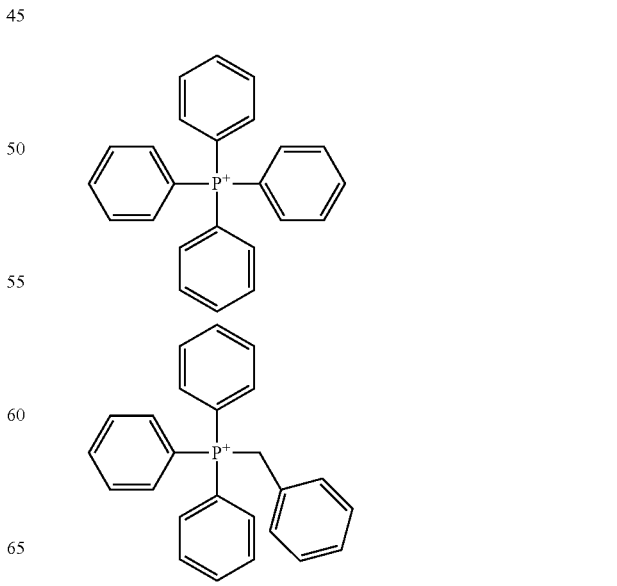

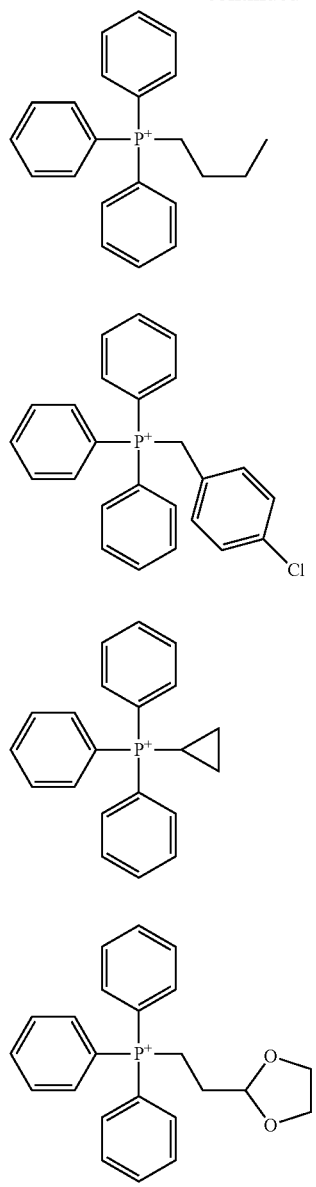

The sulfonium group includes a group represented by Formula (D).

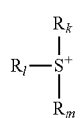
(D)

In Formula (D), $R_k$ to $R_m$ each are independently identical to $R_a$ to $R_d$ in Formula (A). Preferred examples thereof include an aryl group having 6 to 20 carbon atoms. Examples of preferred $R_k$ to $R_m$ include an aryl group having 6 to 20 carbon atoms.

Specific examples of the sulfonium group will be illustrated below, but the present invention is not limited thereto.

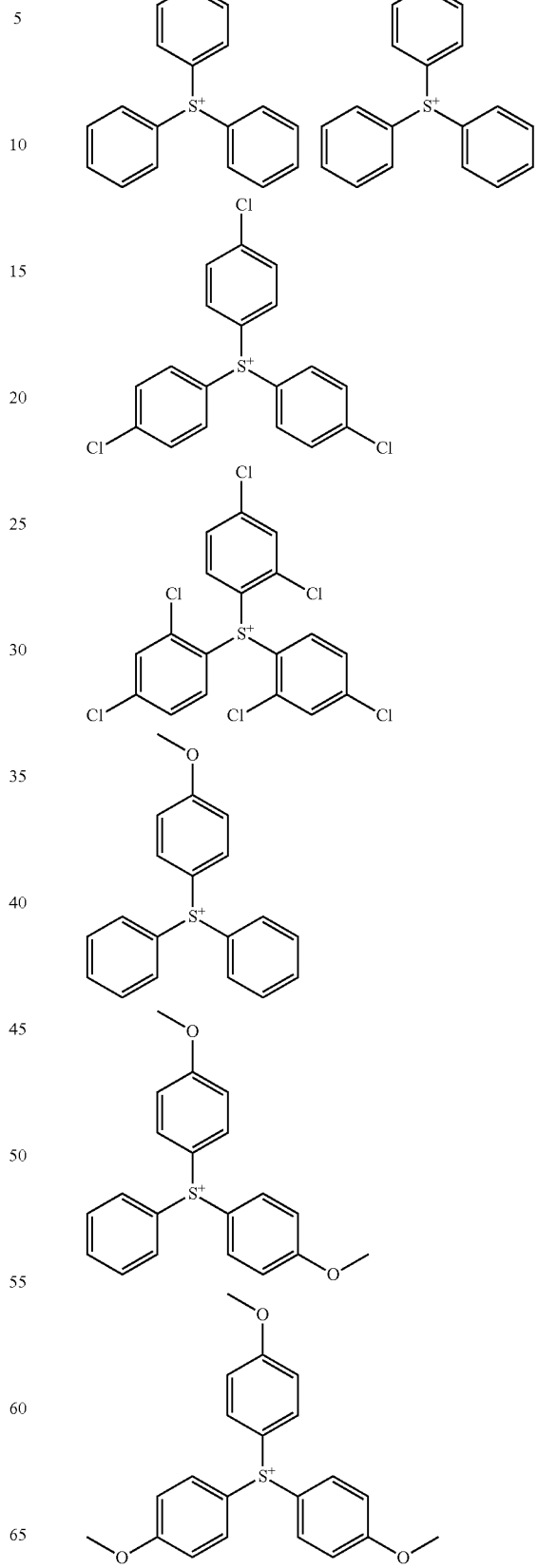

-continued

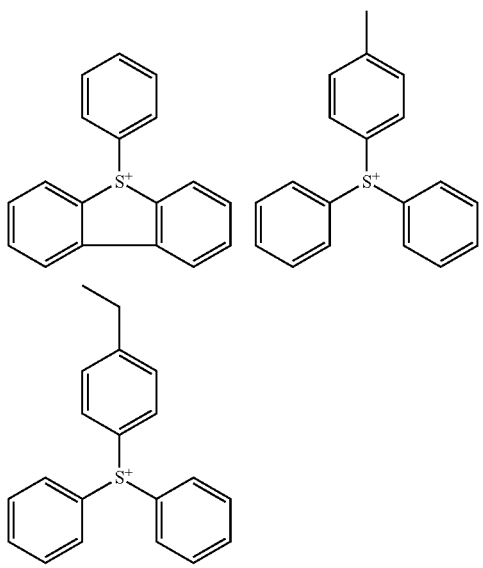 [SMILES: c1ccc(-[s+]2c3ccccc3c3ccccc32)cc1 ; Cc1ccc([S+](c2ccccc2)c2ccccc2)cc1 ; CCc1ccc([S+](c2ccccc2)c2ccccc2)cc1]

Among the above-described onium groups, the ammonium group is preferred.

In a case in which the compound represented by Formula (1) includes the onium group, M may be the onium group.

The onium group may be present in an onium salt in the molecule.

Specific examples of the group represented by Formula (3) will be illustrated below, but the present invention is not limited thereto. In the following structural formulae, Et represents an ethyl group, and * represents a bonding site.

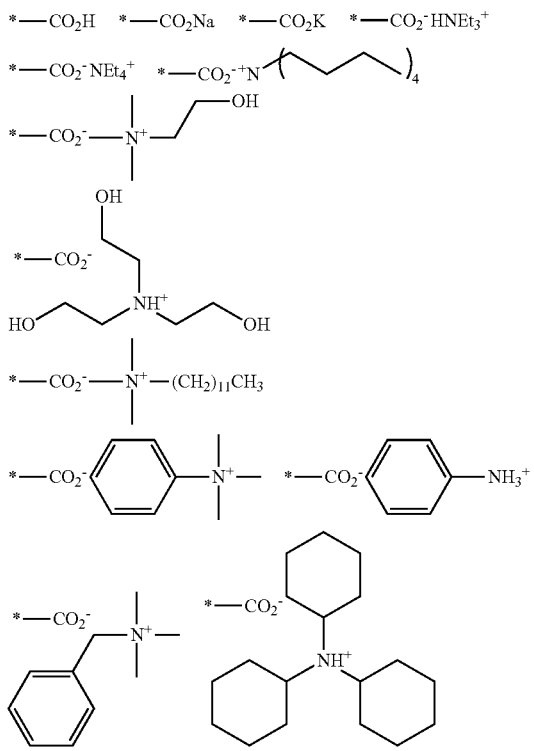

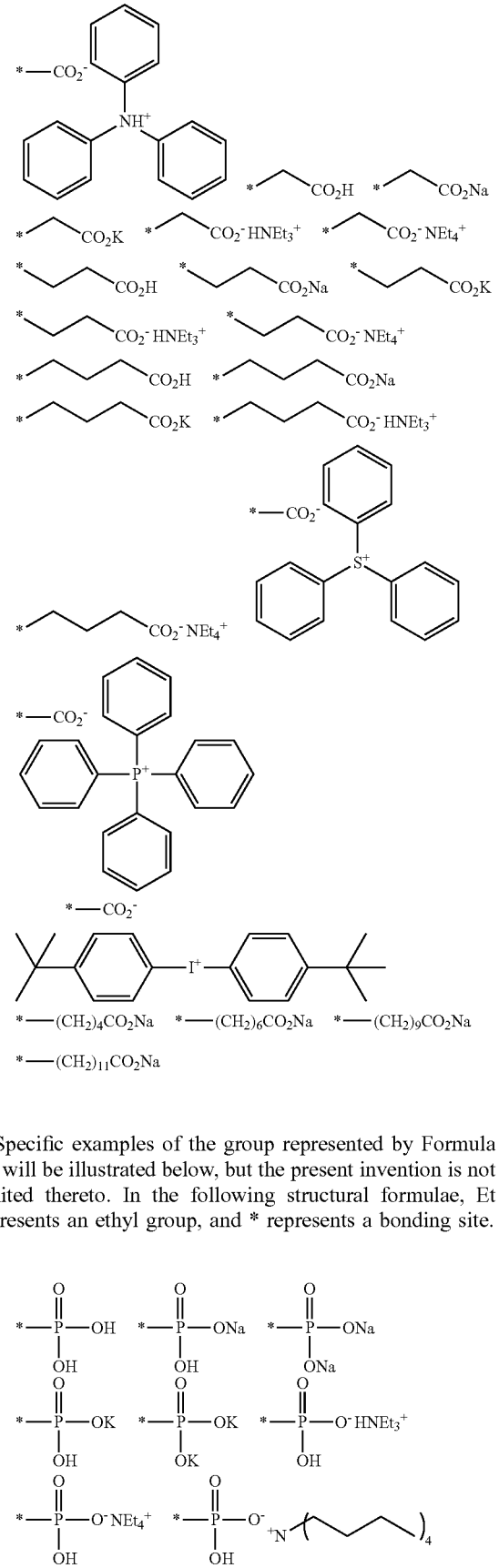

Specific examples of the group represented by Formula (4) will be illustrated below, but the present invention is not limited thereto. In the following structural formulae, Et represents an ethyl group, and * represents a bonding site.

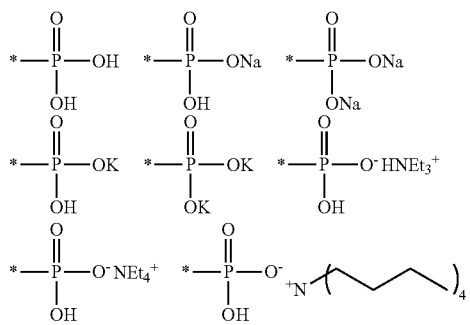

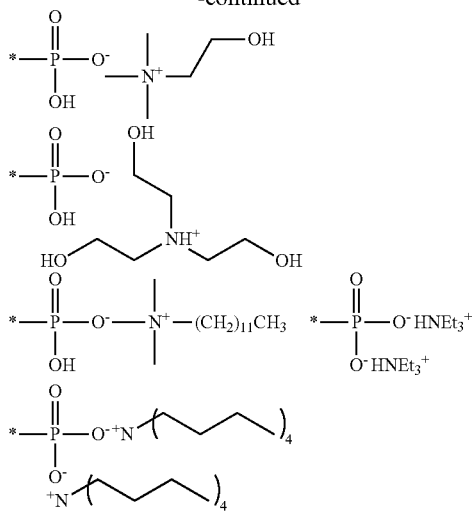
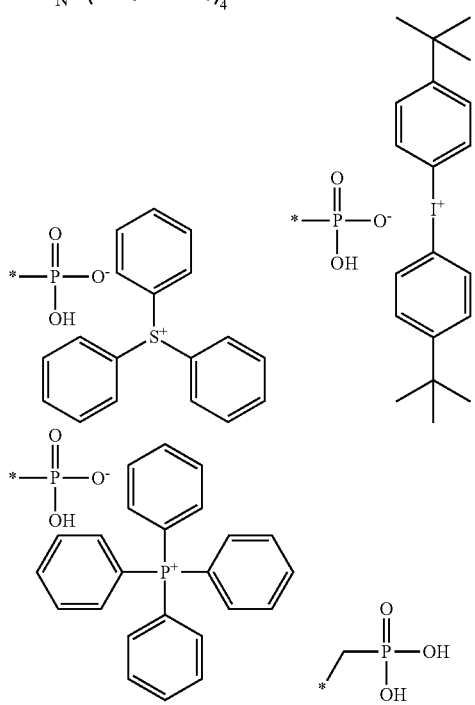
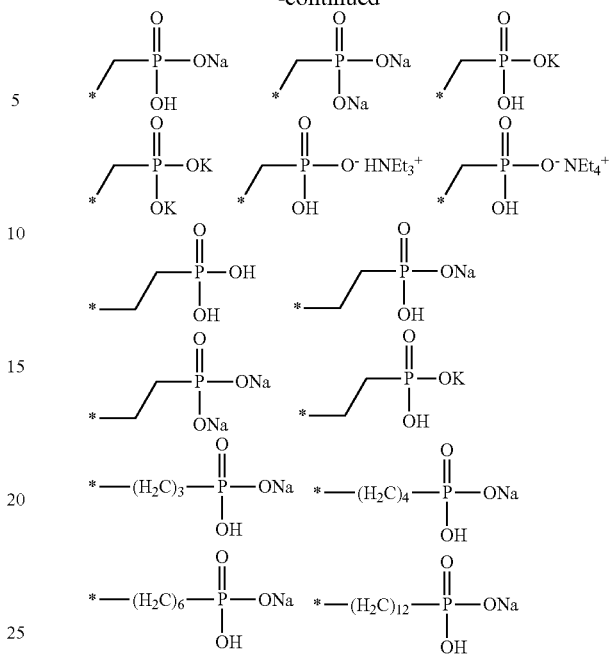

Among the groups represented by Formulae (2) to (4), the group represented by Formula (2) is preferred.

One or more of the groups represented by Formulae (2) to (4) need to be present in the compound represented by Formula (1). The upper limit of the number of the groups represented by Formulae (2) to (4) is preferably five. The number of the groups represented by Formulae (2) to (4) is preferably 1 to 5 and more preferably 2 or 3.

The groups represented by Formulae (2) to (4) may be present as the group represented by $R^4$ or $R^5$ in the compound represented by Formula (1) or may be present in the group represented by $R^1$, $Ar^1$, or $Ar^2$.

Particularly, the groups are preferably present as the group represented by $R^4$ or $R^5$. Alternatively, the groups are preferably present as the group represented by $Ar^1$ or $Ar^2$.

Hereinafter, specific examples of the compound represented by Formula (1) will be illustrated, but the present invention is not limited thereto. In the following structural formulae, Me represents a methyl group, and TsO⁻ represents a tosylate anion.

(A-1)

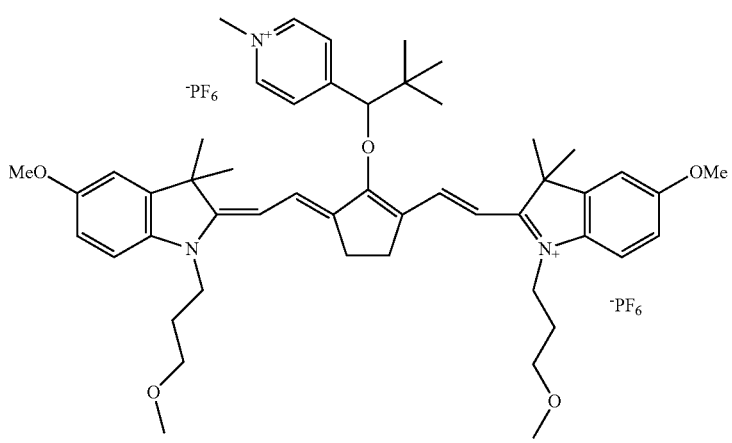

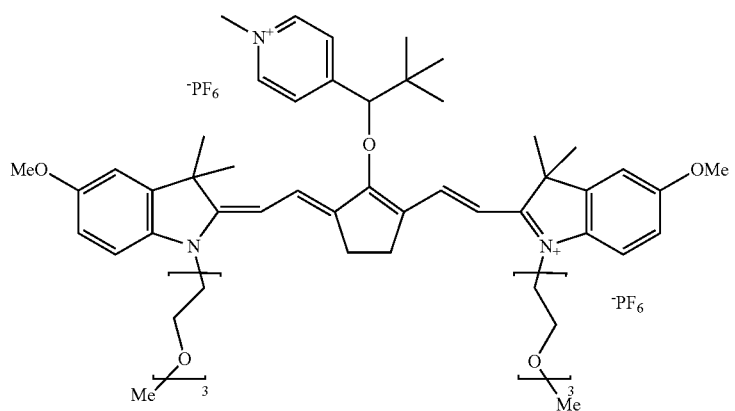
(A-2)
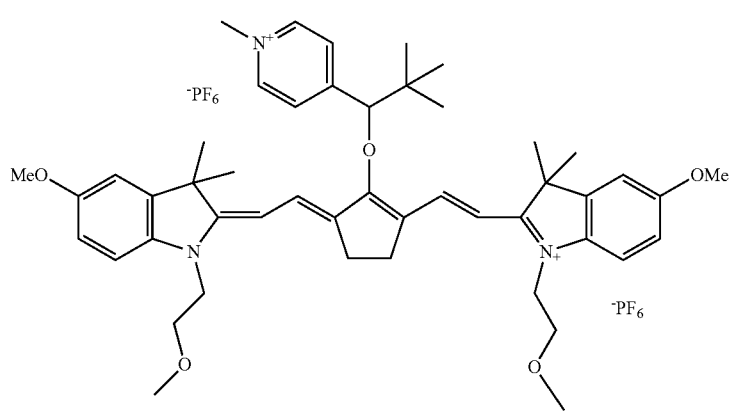
(A-3)
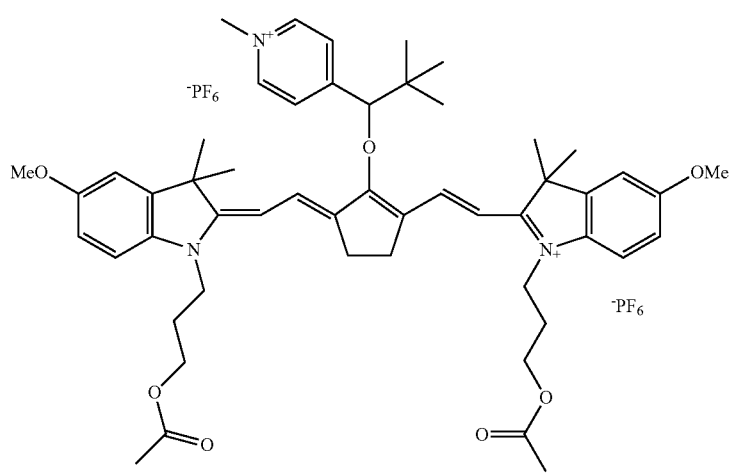
(A-4)

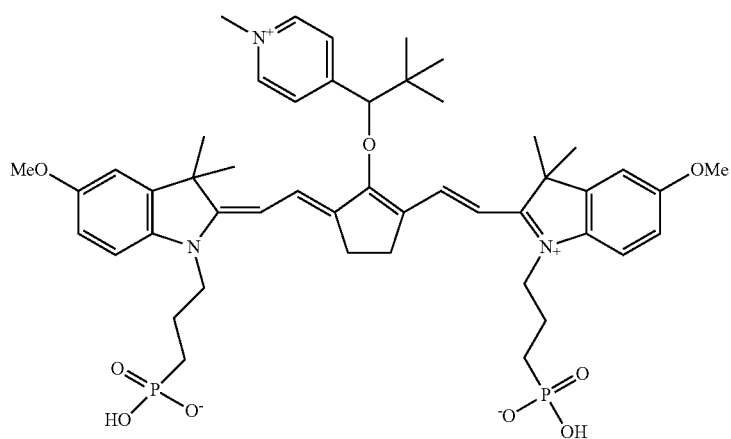
(A-5)
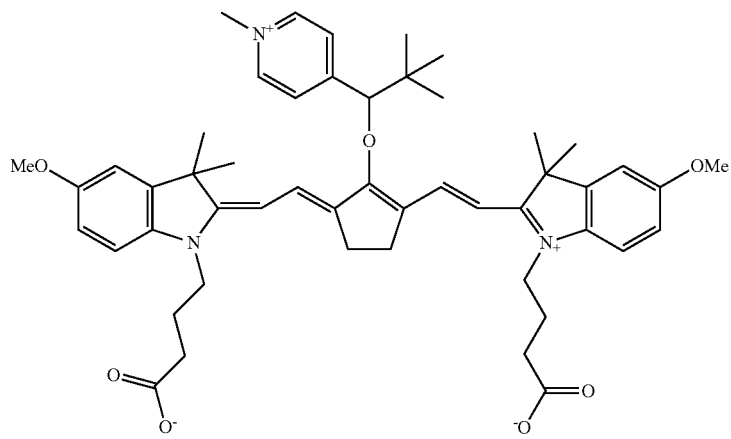
(A-6)
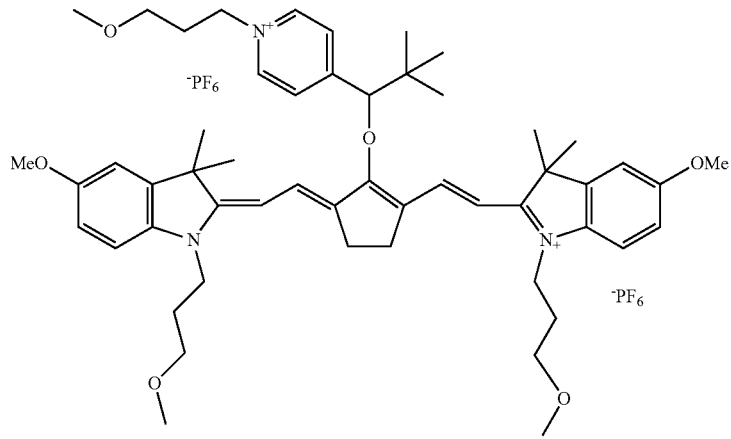
(A-7)

(A-8)
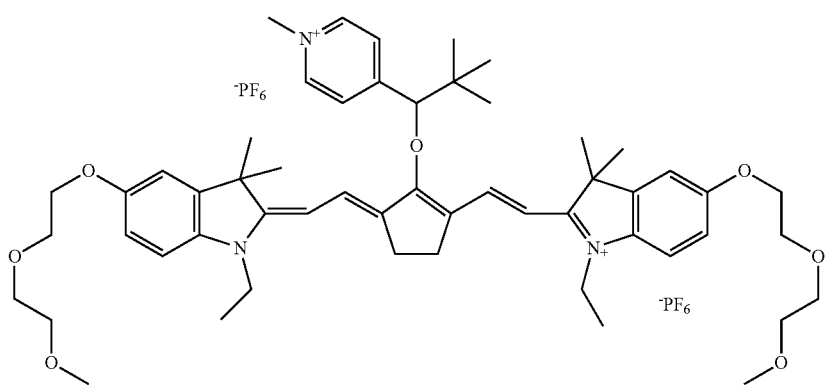
(A-9)
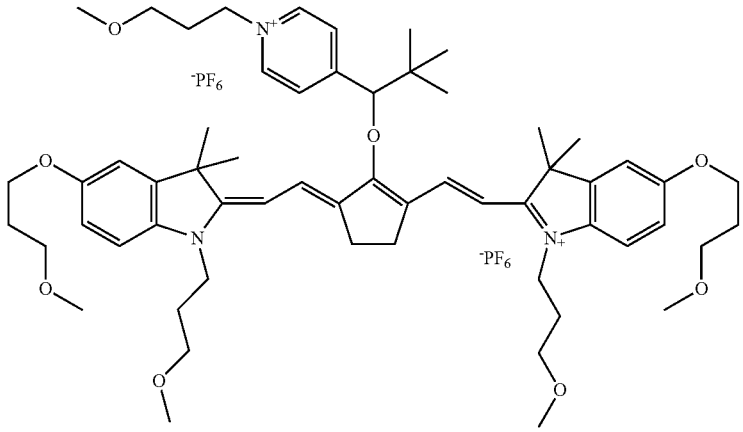
(A-10)
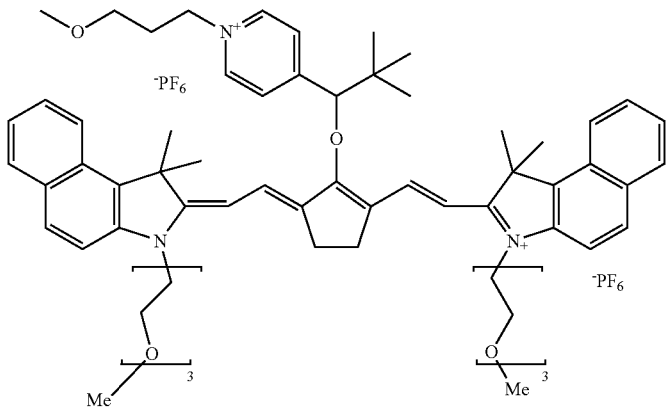
(A-11)
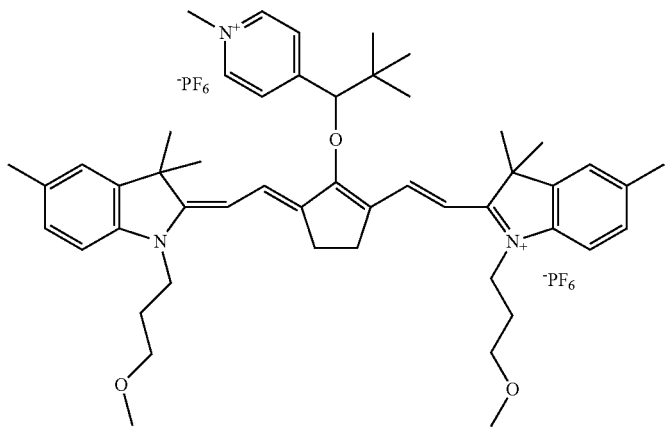

-continued
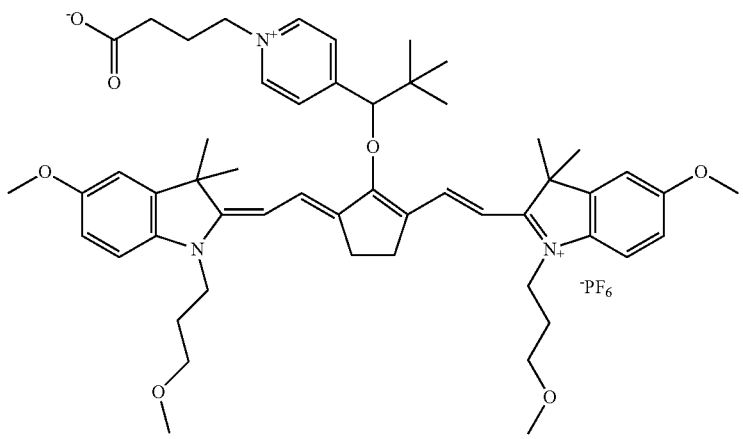
(A-12)
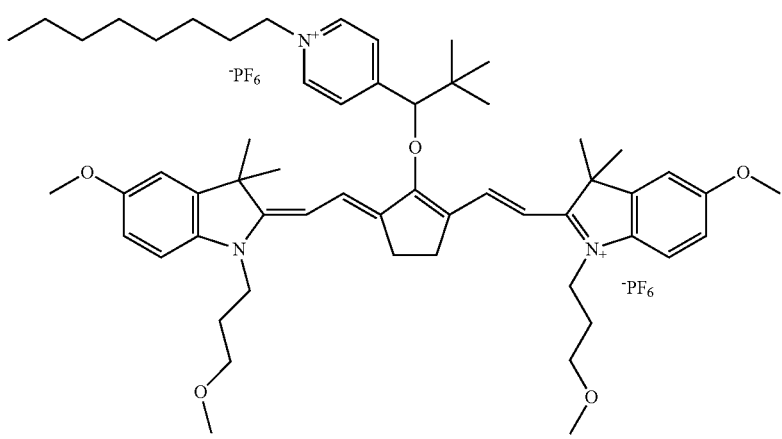
(A-13)
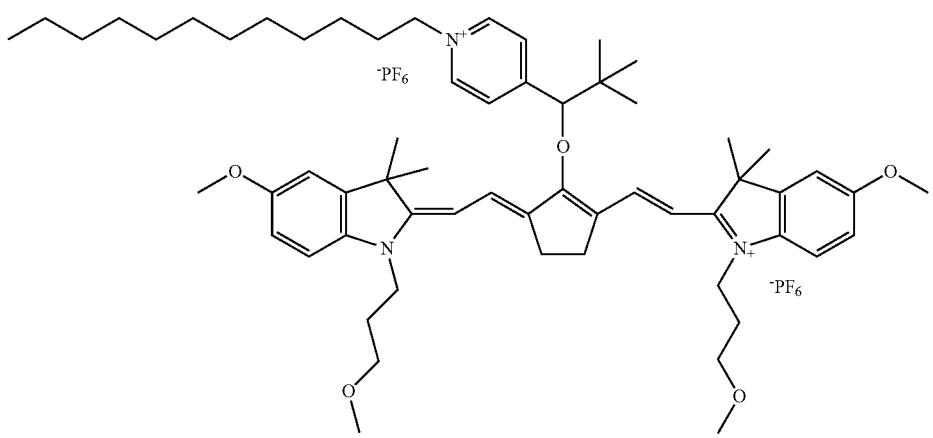
(A-14)

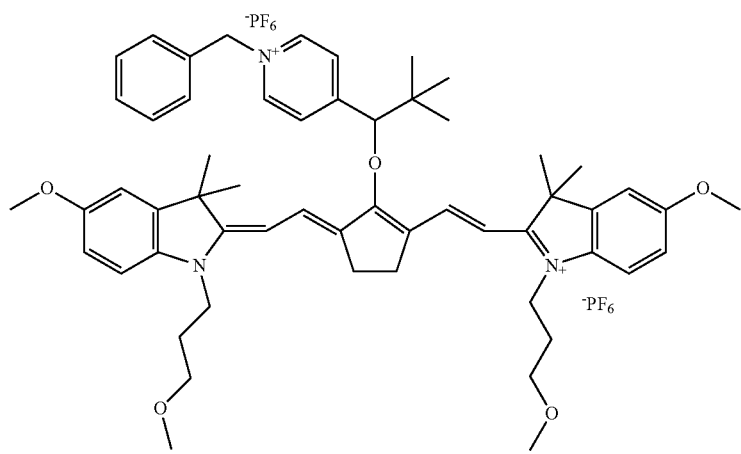
(A-15)
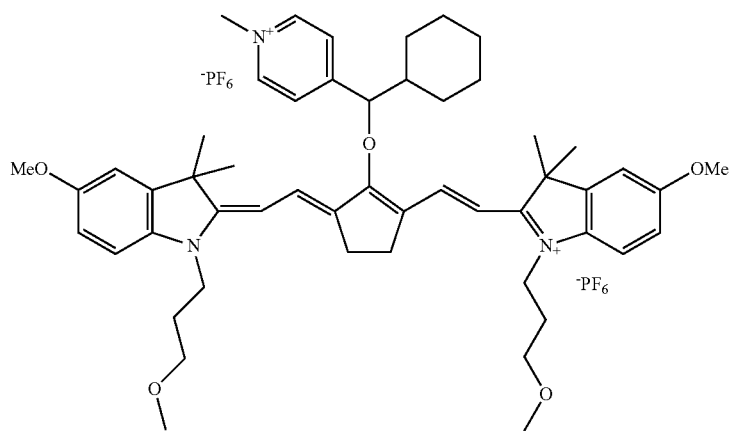
(A-16)
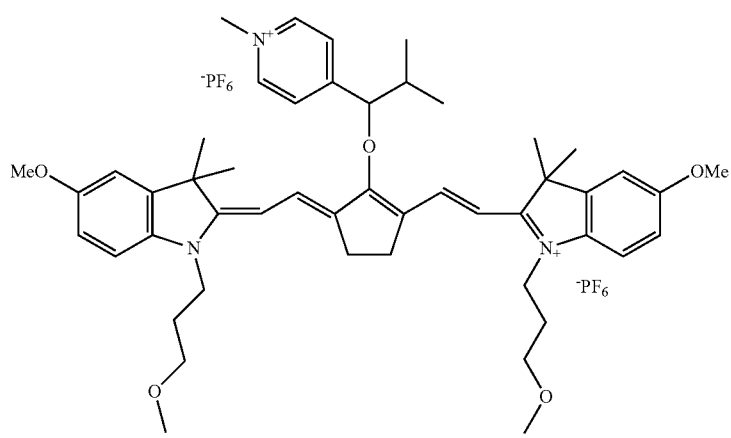
(A-17)

-continued
(A-18)
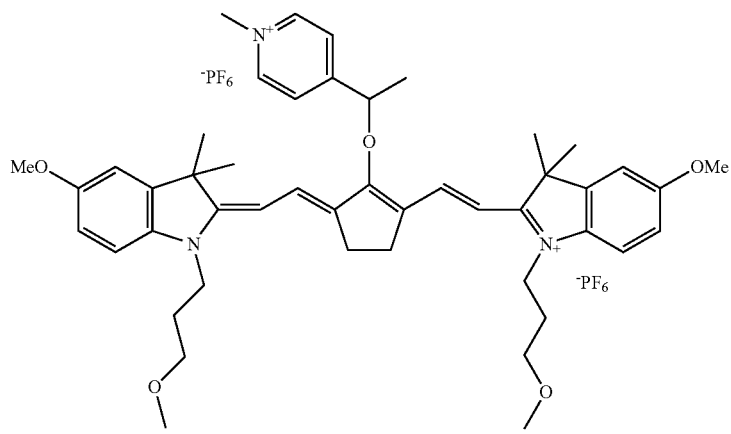
(A-19)
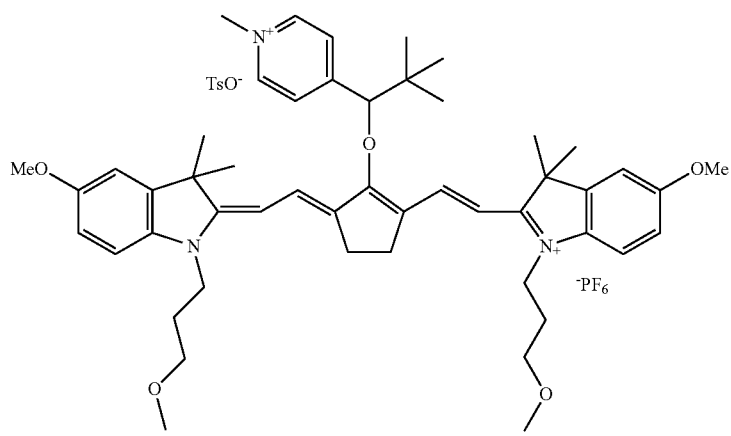
(A-20)
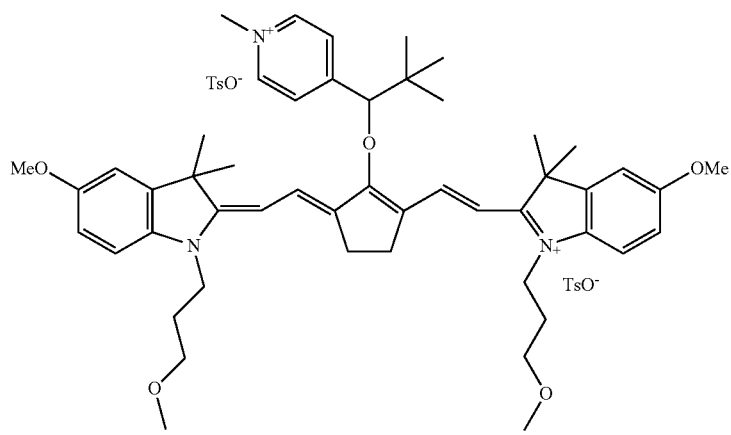
(A-21)
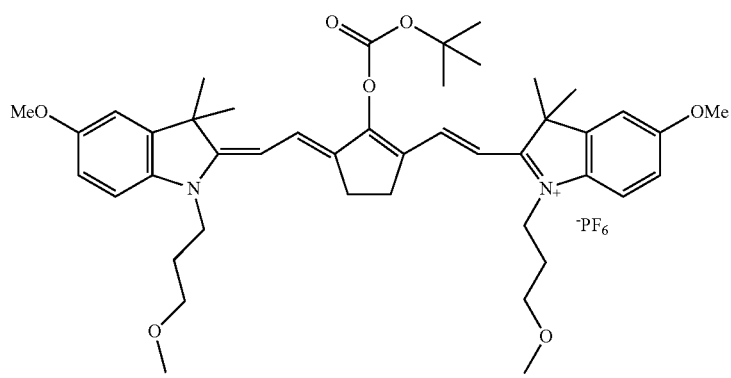

(A-22)
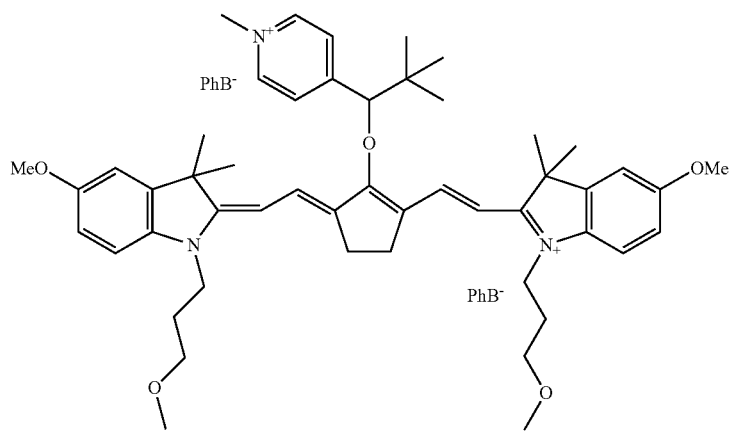
(A-23)
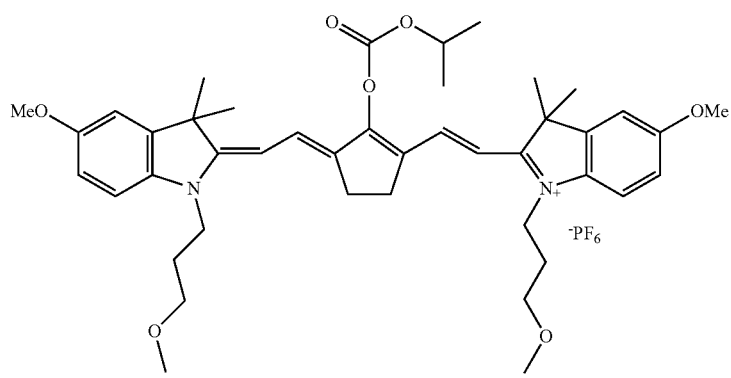
(A-24)
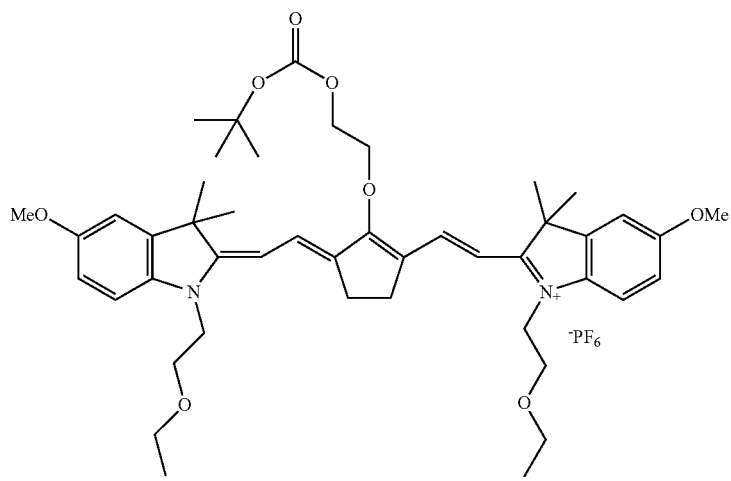
(A-25)
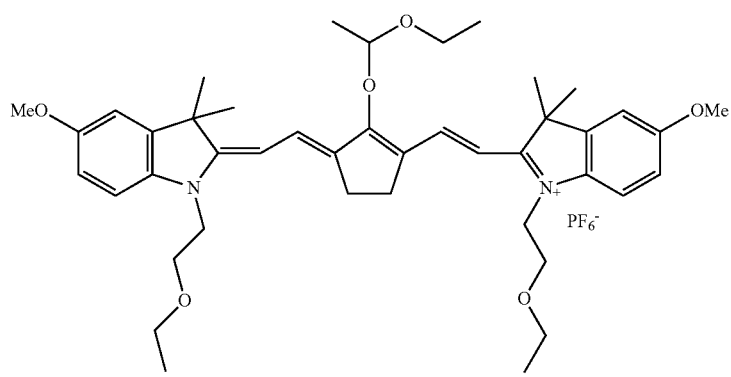

(A-26)
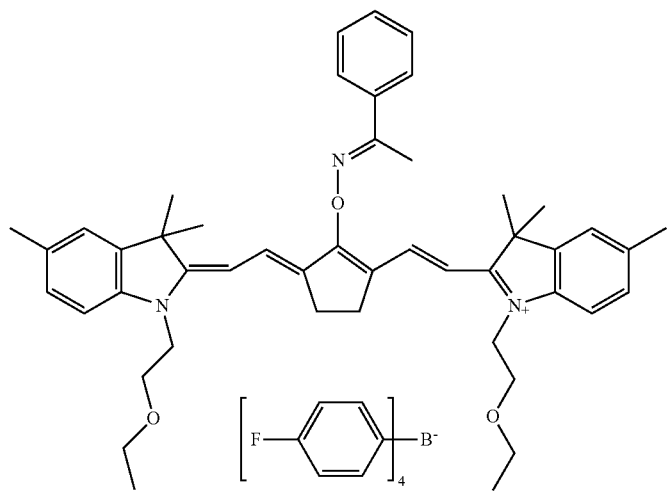
(A-27)
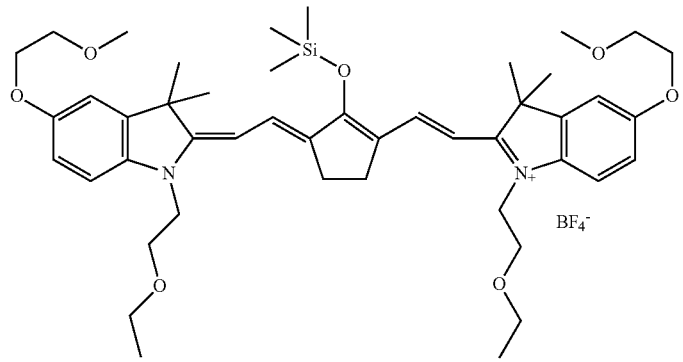
(A-28)
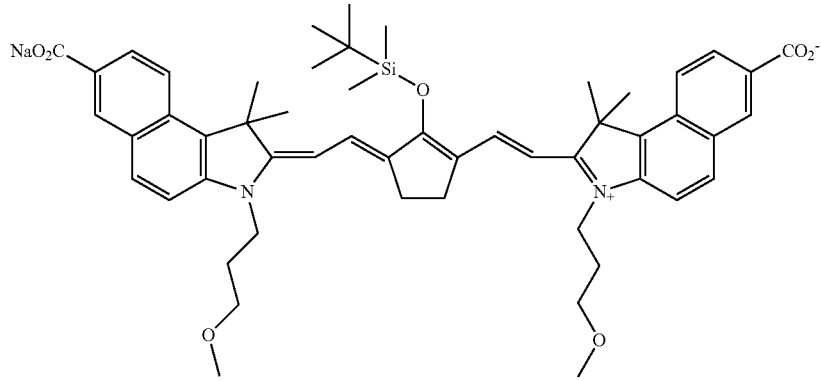
(A-29)
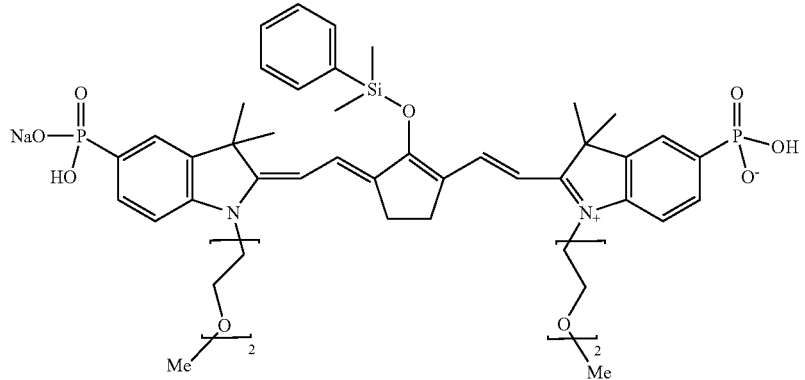

(A-30)
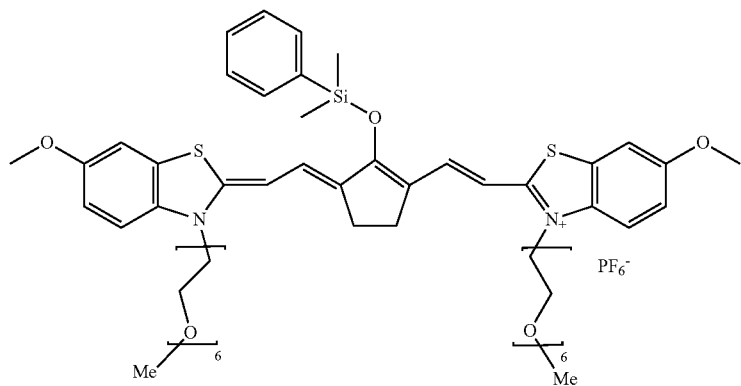
(A-31)
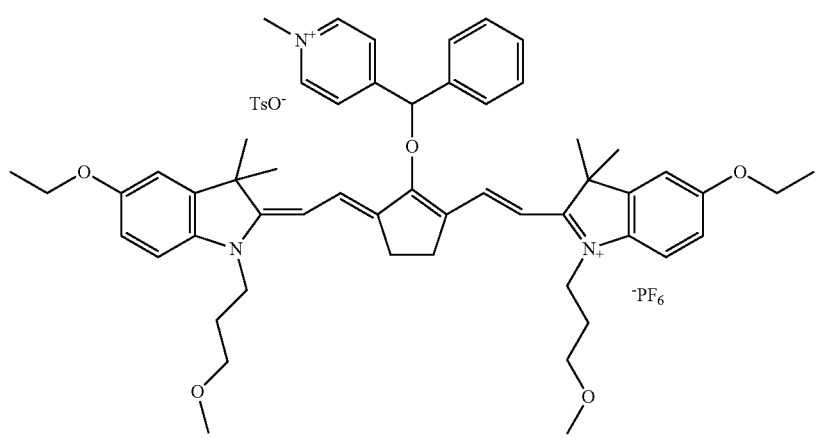
(A-32)
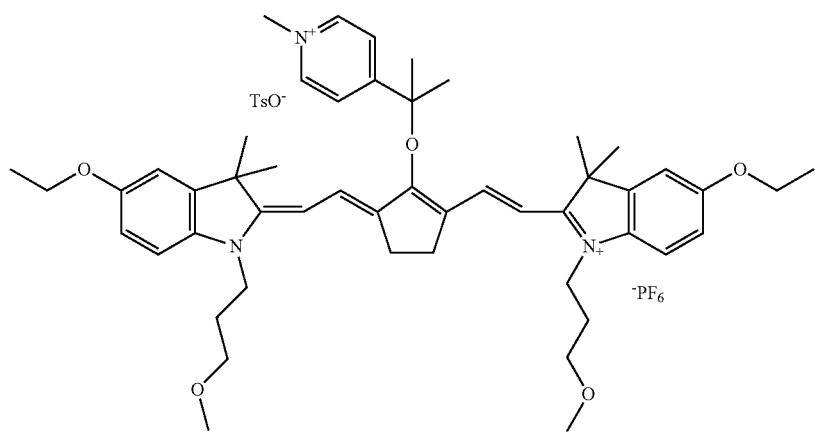

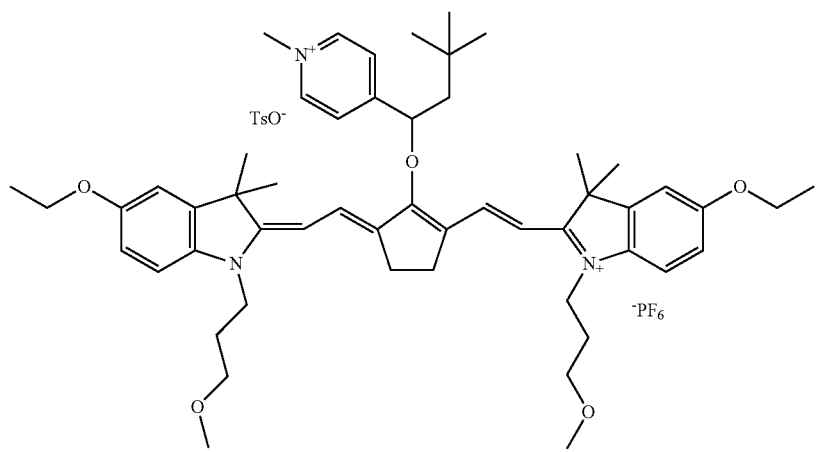
(A-33)
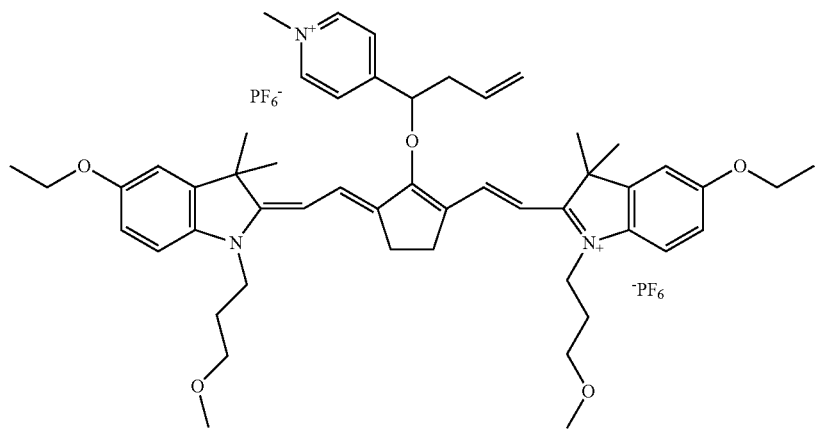
(A-34)
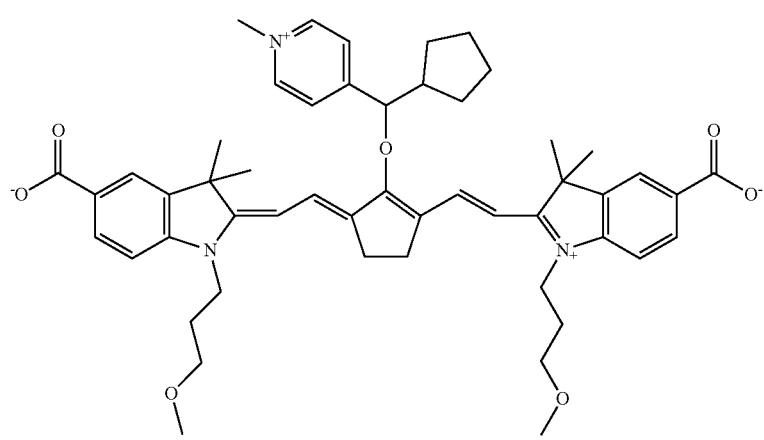
(A-35)

-continued
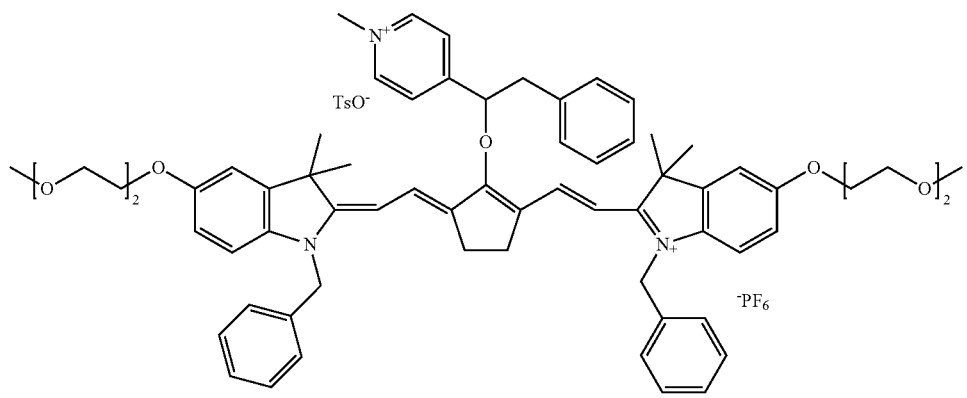
(A-36)
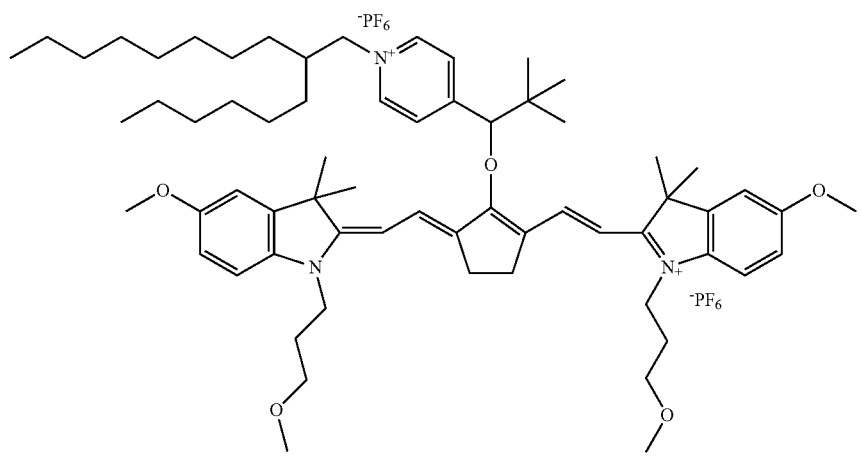
(A-37)
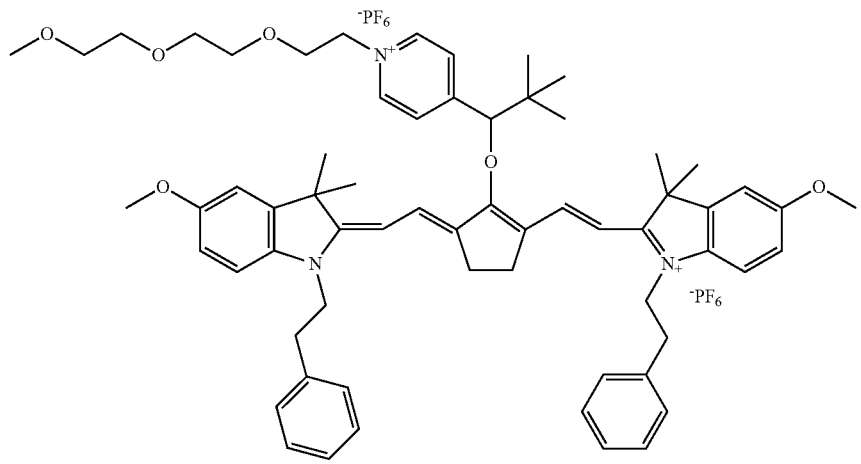
(A-38)
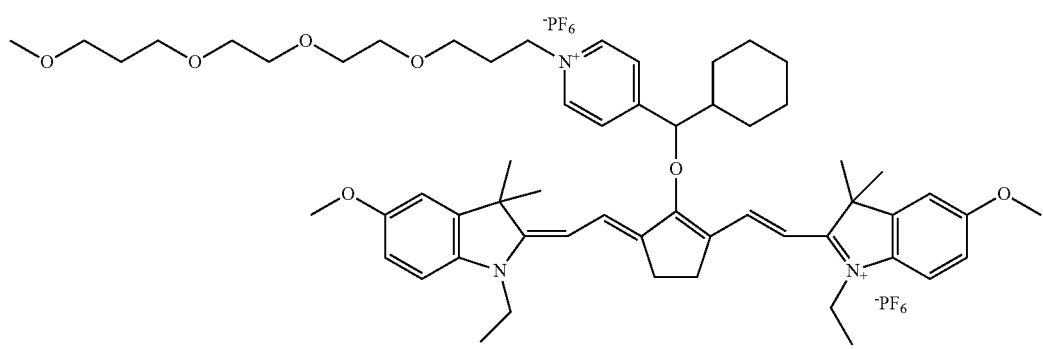
(A-39)

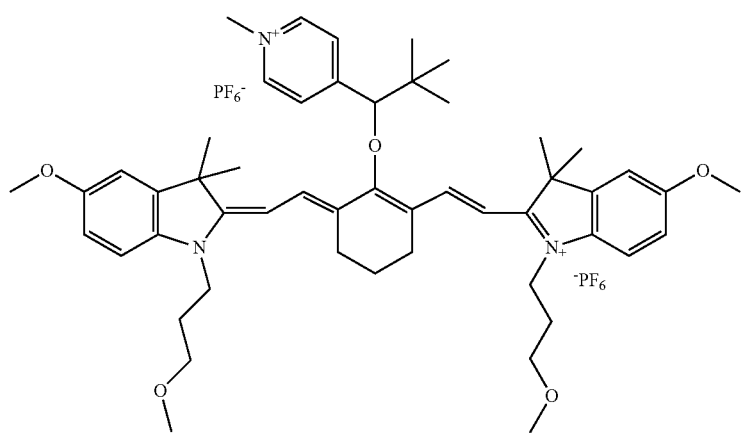
(A-40)
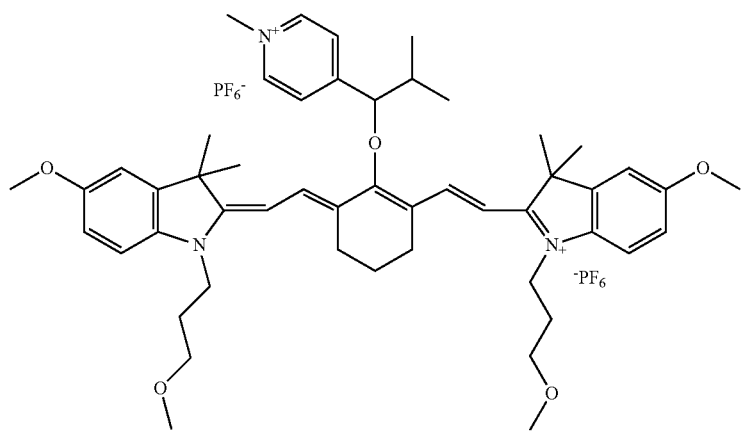
(A-41)
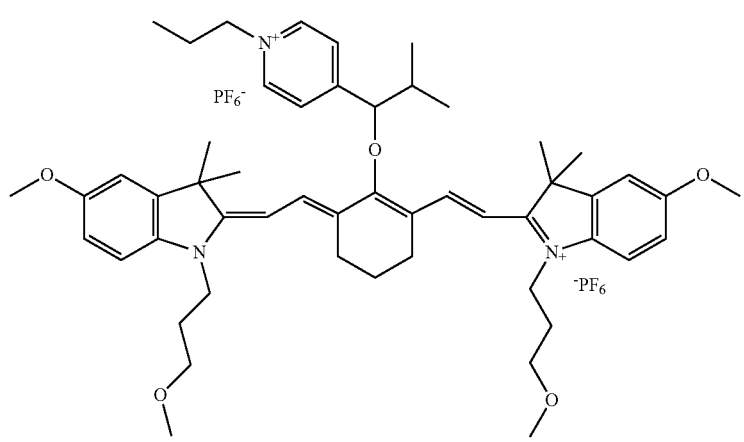
(A-42)

(A-43)
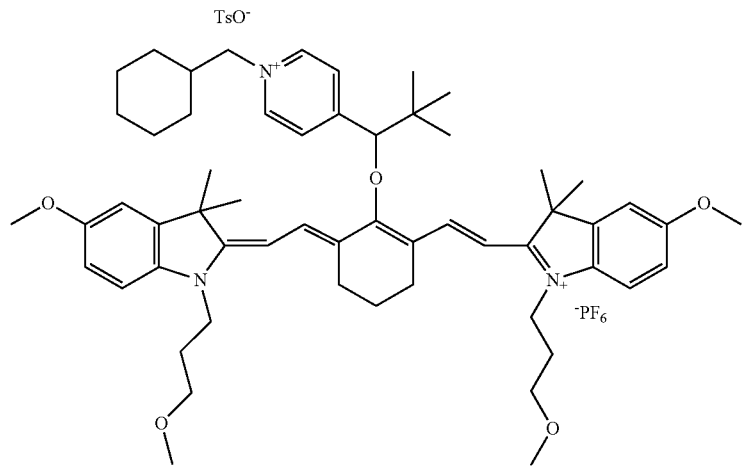
(A-44)
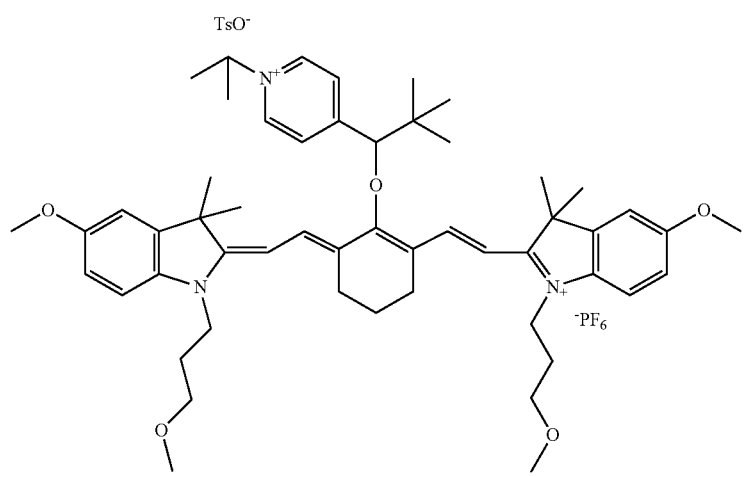
(A-45)
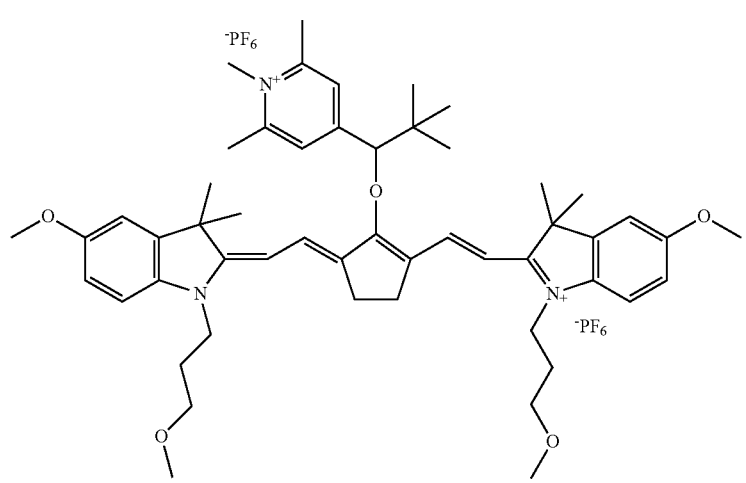

(A-46)
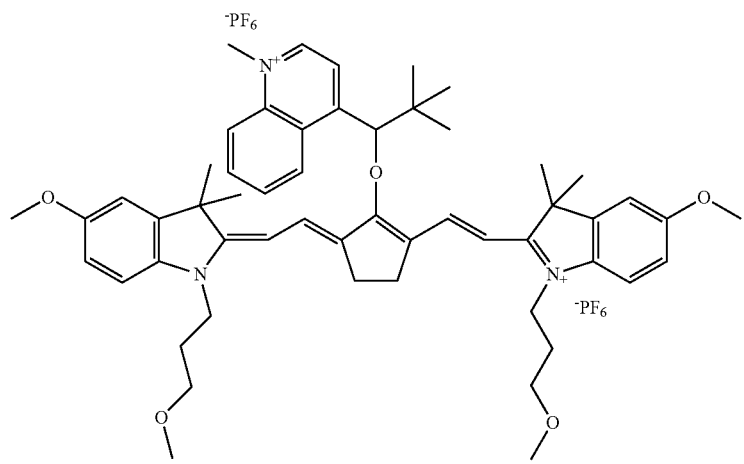
(A-47)
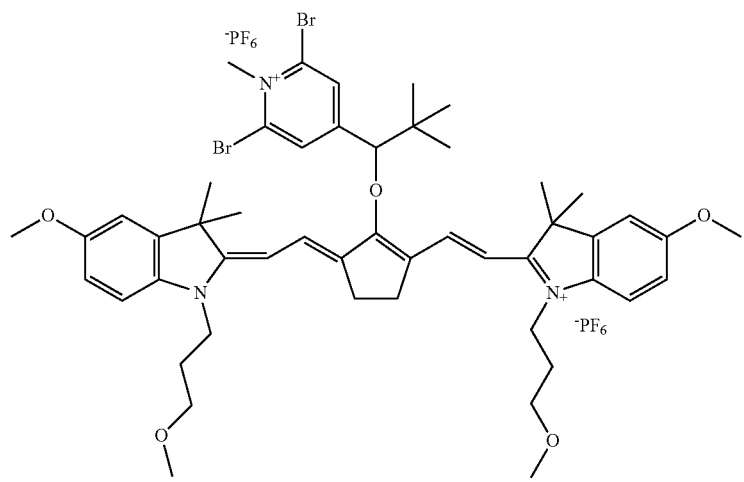
(A-48)
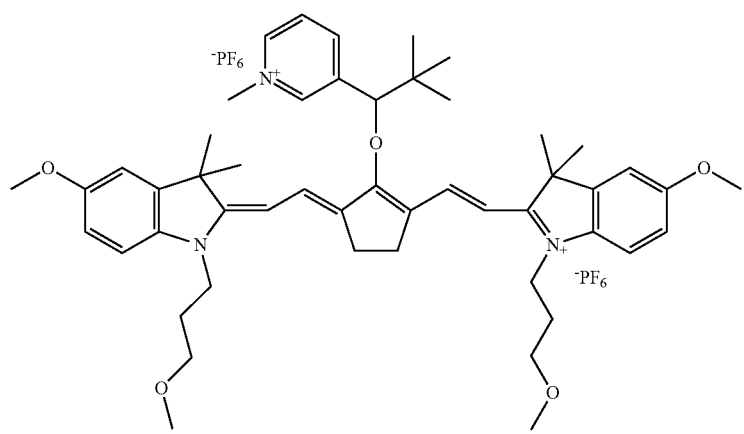

(A-49)
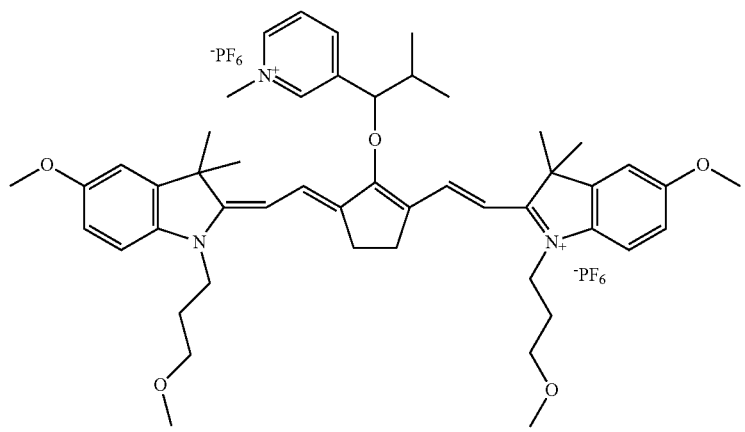
(A-50)
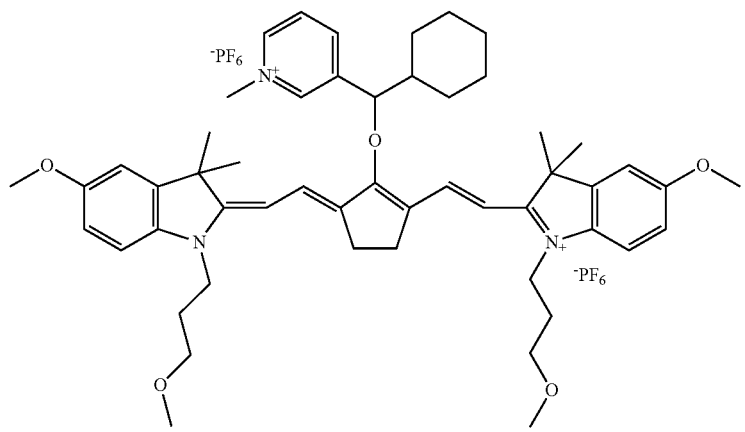
(A-51)
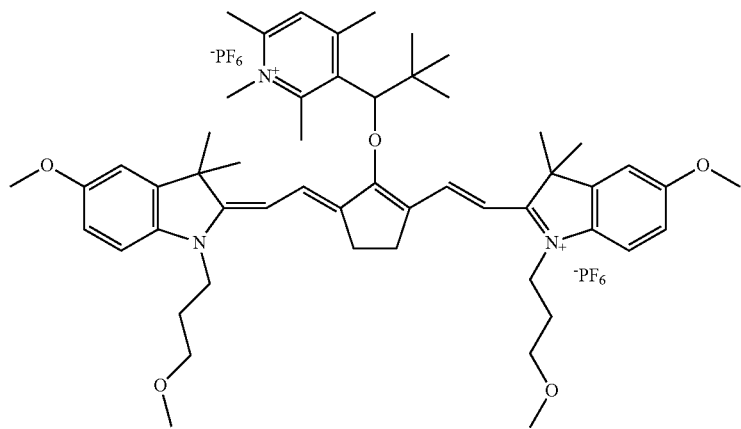

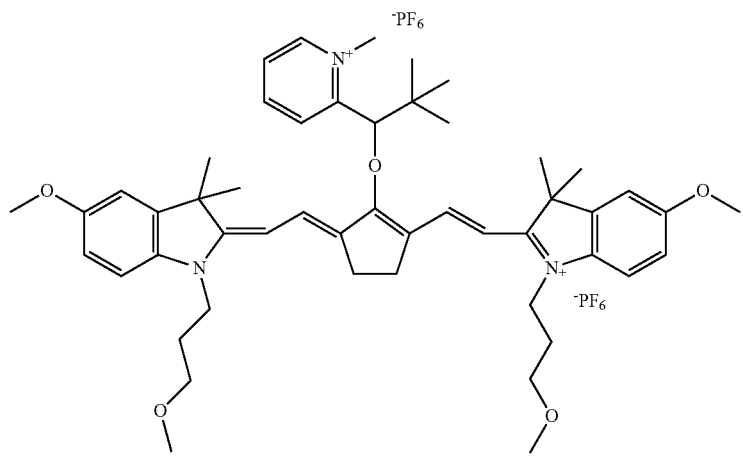
(A-52)
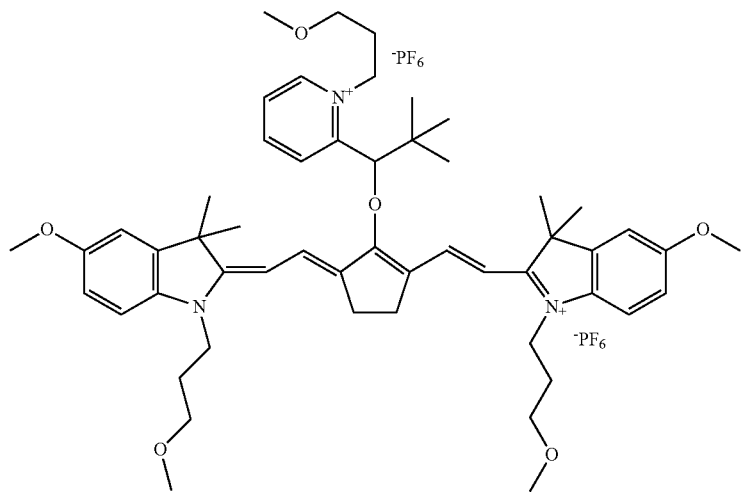
(A-53)
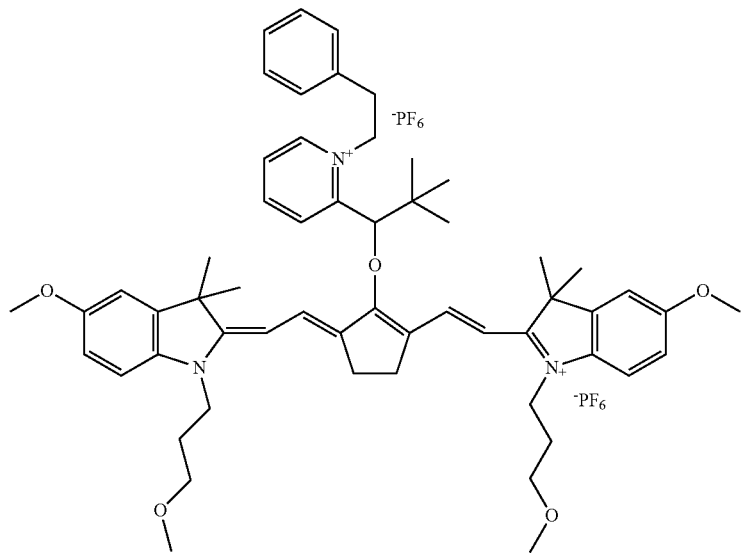
(A-54)

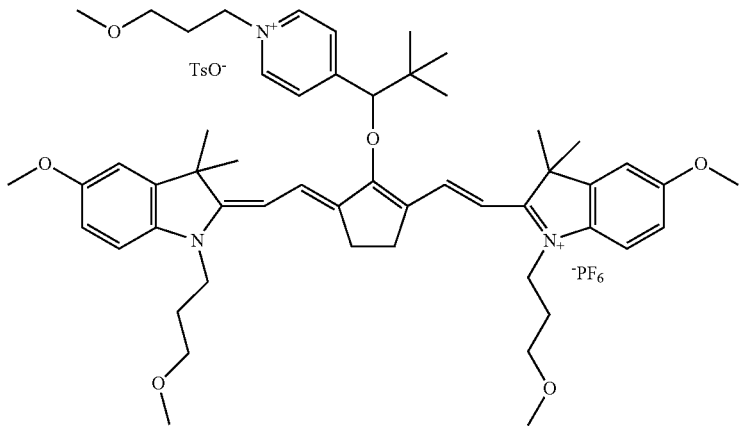

(A-55)

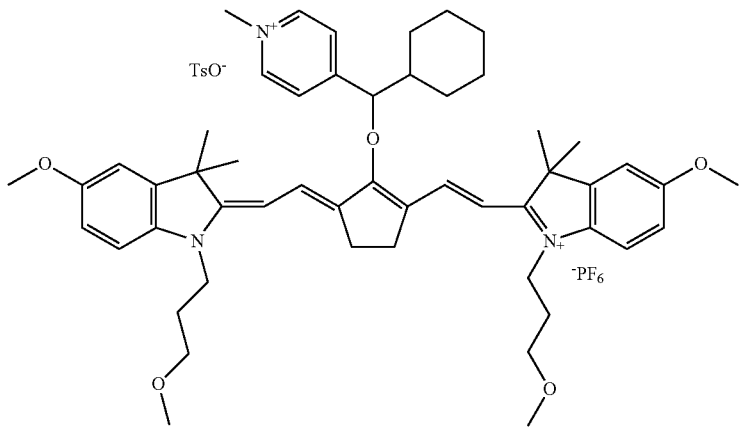

(A-56)

The compound represented by Formula (1) may be used singly or two or more of the compounds may be jointly used.

In the color developing composition according to the present invention, the content of the compound represented by Formula (1) is preferably in a range of 0.1% to 95% by mass, more preferably in a range of 1% to 50% by mass, and still more preferably in a range of 1% to 40% by mass of the total solid content of the color developing composition. The total solid content refers to the total amount of components in the composition excluding volatile components such as a solvent.

The compound represented by Formula (1) can be synthesized by applying a well-known method. For example, the compound can be synthesized according to a synthesis scheme described below.

Preferred example of a method for introducing a group represented by any of Formulae (1-1), (1-5), and (1-6) include synthesis schemes represented by Formulae (S1) to (S3). In addition, preferred examples of a method for introducing a group represented by any of Formulae (1-2) to (1-4) include a synthesis scheme represented by Formulae (S4).

In the following formulae, DMAP represents N,N-dimethylamino-4-pyridine, AcONa represents sodium acetate, NEt₃ represents triethylamine, and catecol represents catechol. In addition, R represents a group corresponding to each portion in Formula (1).

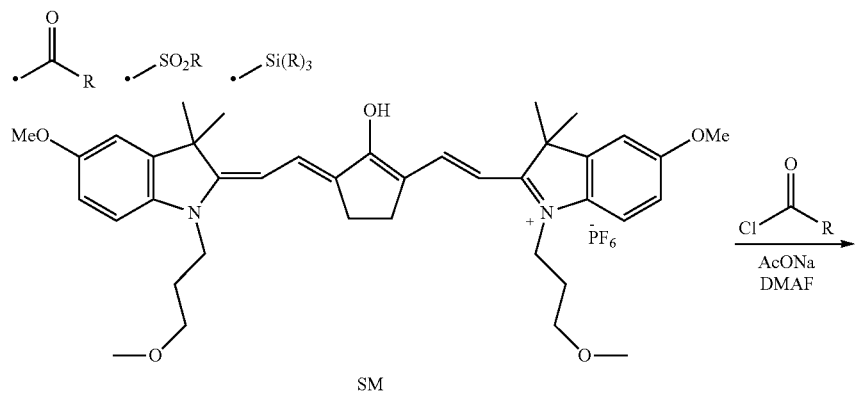

SM

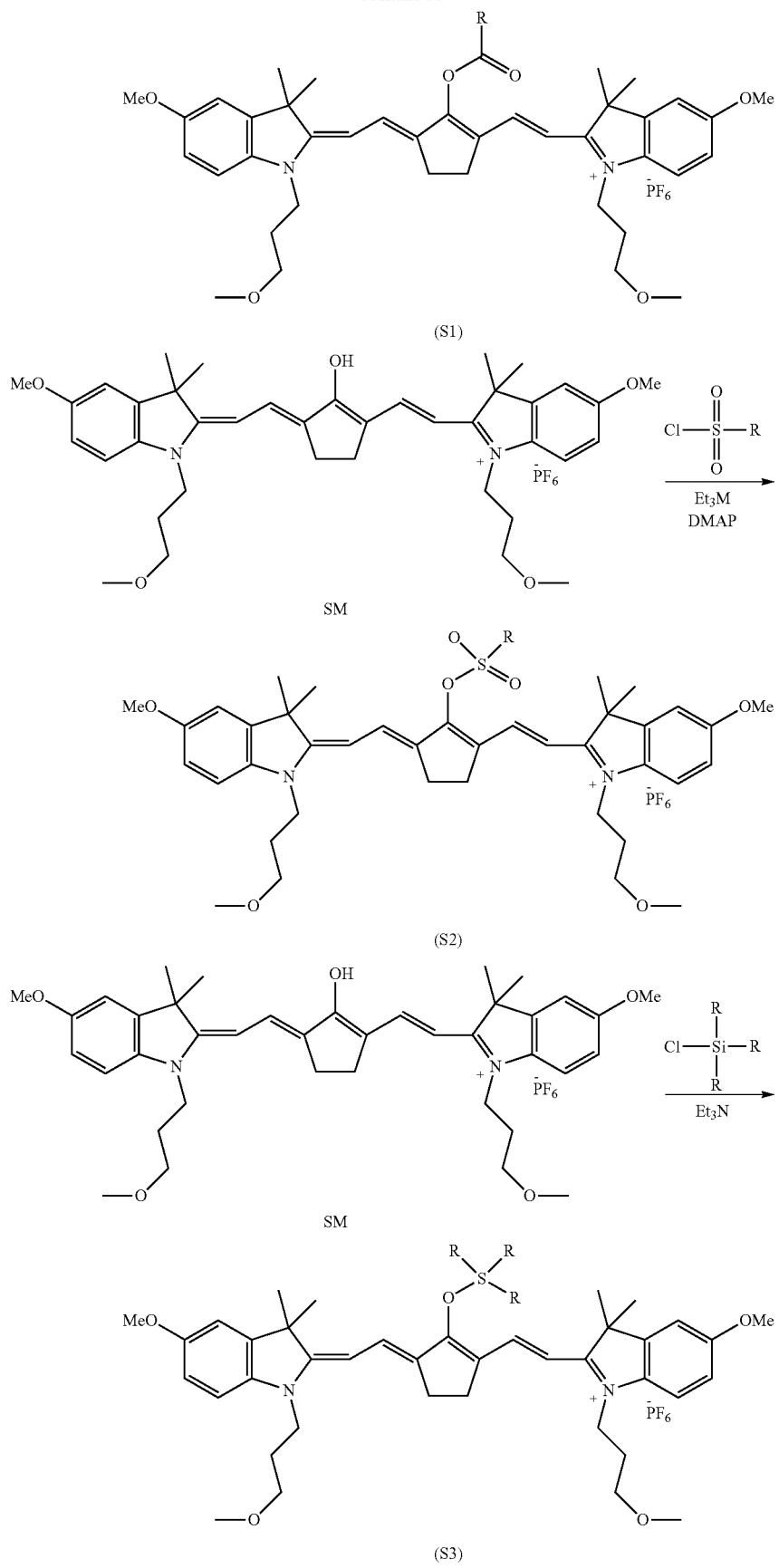

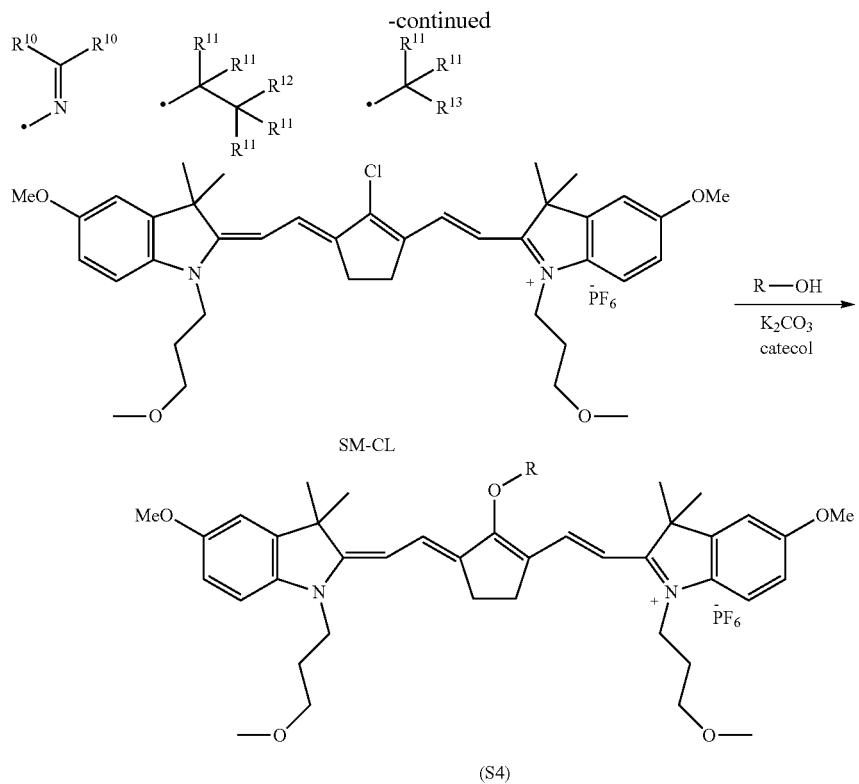

The compound represented by Formula (1) has a structure of having a group in which an $R^1$—O bond is cleaved by heat or exposure to infrared rays as $R^1$ and, furthermore, having at least one of the groups represented by Formulae (2) to (4) as $R^4$ or $R^5$ or in $R^1$, $Ar^1$, or $Ar^2$. It is considered that, due to the above-described structural characteristics, the color developing composition containing the compound represented by Formula (1) has characteristics of excellent color developability and not significantly discoloring after aged.

In addition, it is considered that a lithographic printing plate precursor containing the compound represented by Formula (1) in an image-recording layer is capable of providing a lithographic printing plate precursor which has excellent visibility by means of color development, is capable of maintaining excellent visibility even after aged, exhibits favorable on-machine developability, has excellent white light stability, and is also favorable in terms of printing resistance and tone reproducibility.

Furthermore, the compound represented by Formula (1) has an excellent infrared absorbing capability and thus favorably functions as an infrared absorber. Therefore, in a case in which the color developing composition according to the present invention is used in an image-recording layer of a lithographic printing plate precursor, actually, it is not necessary to use an infrared absorber other than the compound represented by Formula (1). This is one of the excellent effects of the present invention.

<Binder Polymer>

The color developing composition according to the present invention preferably includes a binder polymer. The binder polymer that is used in the color developing composition is preferably a polymer having film properties, and well-known binder polymers that are used for photosensitive color developing compositions or thermosensitive color developing compositions can be used. Among these, the binder polymer is preferably a (meth)acrylic resin, a polyvinyl acetal resin, or a polyurethane resin. In the present specification, "(meth)acrylic" refers to both "acrylic" and "methacrylic".

In a case in which the color developing composition is used for an image-recording layer in the lithographic printing plate precursor, as the binder polymer, it is possible to preferably use a well-known binder polymer that is used for an image-recording layer in the lithographic printing plate precursor. As an example, a binder polymer that is used in on-machine development-type lithographic printing plate precursors (hereinafter, also referred to as the binder polymer for on-machine development) will be described in detail.

The binder polymer for on-machine development is preferably a binder polymer having alkylene oxide chains. The binder polymer having alkylene oxide chains may have poly(alkylene oxide) portions in main chains or side chains and may be graft polymers having poly(alkylene oxide) in side chains or block copolymers of blocks constituted of repeating units containing poly(alkylene oxide) and blocks constituted of repeating units not containing (alkylene oxide).

In a case in which the binder polymer has poly(alkylene oxide) portions in main chains, polyurethane resins are preferred. Examples of polymers in main chains in a case in which the binder polymer has poly(alkylene oxide) portions in side chains include (meth)acrylic resins, polyvinyl acetal resins, polyurethane resins, polyurea resins, polyimide resins, polyamide resins, epoxy resins, polystyrene resins, novolac-type phenol resins, polyester resins, synthetic rubber, and natural rubber, and (meth)acrylic resins are particularly preferred.

The alkylene oxide is preferably an alkylene oxide having 2 to 6 carbon atoms and particularly preferably an ethylene oxide or a propylene oxide.

The repeating number of the alkylene oxide in the poly(alkylene oxide) portion is preferably in a range of 2 to 120, more preferably in a range of 2 to 70, and still more preferably in a range of 2 to 50.

In a case in which the repeating number of the alkylene oxide is 120 or smaller, there are no cases in which printing resistance is degraded due to both friction and ink-receiving properties, which is preferable.

The poly(alkylene oxide) portion is preferably included in a structure represented by Formula (AO) as the side chain of the binder polymer and more preferably included in the structure represented by Formula (AO) as the side chain of the (meth)acrylic resin.

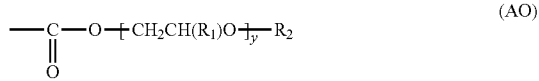

(AO)

In Formula (AO), y represents 2 to 120, $R_1$ represents a hydrogen atom or an alkyl group, and $R_2$ represents a hydrogen atom or a monovalent organic group.

The monovalent organic group is preferably an alkyl group having 1 to 6 carbon atoms, and examples thereof include a methyl group, an ethyl group, an n-propyl group, an isopropyl group, an n-butyl group, a sec-butyl group, an isobutyl group, a tert-butyl group, an n-pentyl group, an isopentyl group, a neopentyl group, an n-hexyl group, an isohexyl group, 1,1-dimethyl butyl group, 2,2-dimethyl butyl group, a cyclopentyl group, and cyclohexyl group.

In Formula (AO), y is preferably 2 to 70 and more preferably 2 to 50. $R_1$ is preferably a hydrogen atom or a methyl group and particularly preferably a hydrogen atom. $R_2$ is particularly preferably a hydrogen atom or a methyl group.

In order to improve the membrane hardness of image areas, the binder polymer may have crosslinking properties. In order to impart crosslinking properties to the polymer, it is necessary to introduce crosslinking functional groups such as ethylenically unsaturated bonds into main chains or side chains of the polymer. The crosslinking functional group may be introduced by means of copolymerization or may be introduced by a polymer reaction.

Examples of polymers having ethylenically unsaturated bonds in main chains of the molecules include poly-1,4-butadiene, poly-1,4-isoprene, and the like.

Examples of polymers having ethylenically unsaturated bonds in side chains of the molecules include polymers of esters or amides of acrylic acid or methacrylic acid in which residues (R of —COOR or —CONHR) of the esters or the amides have ethylenically unsaturated bonds.

Examples of residues (the above-described R) having ethylenically unsaturated bonds include —$(CH_2)_n$CR$^{1A}$=CR$^{2A}$R$^{3A}$, —$(CH_2O)_n$CH$_2$CR$^{1A}$=CR$^{2A}$R$^{3A}$, —$(CH_2CH_2O)_n$CH$_2$CR$^{1A}$=CR$^{2A}$R$^{3A}$, —$(CH_2)_n$NH—CO—O—CH$_2$CR$^{1A}$=CR$^{2A}$R$^{3A}$, —$(CH_2)_n$—O—CO—CR$^{1A}$=CR$^{2A}$R$^{3A}$, and —$(CH_2CH_2O)_2$—X (in the formulae, each of $R^{A1}$ to $R^{A3}$ independently represents a hydrogen atom, a halogen atom, an alkyl group having 1 to 20 carbon atoms, an aryl group, an alkoxy group, or an aryloxy group, and $R^{A1}$ and $R^{A2}$ or $R^{A3}$ may be bonded together and thus form a ring. n represents an integer of 1 to 10. X represents a dicyclopentadienyl residue.).

Specific examples of ester residues include —$CH_2CH$=$CH_2$, —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NHCOO—$CH_2CH$=$CH_2$, and —$CH_2CH_2O$—X (in the formula, X represents a dicyclopentadienyl residue.).

Specific examples of amide residues include —$CH_2CH$=$CH_2$, —$CH_2CH_2$—Y (in the formula, Y represents a cyclohexene residue), and —$CH_2CH_2$—OCO—$CH$=$CH_2$.

The binder polymer having crosslinking properties is cured as described below. For example, free radicals (polymerization-initiating radicals or radicals growing in the polymerization process of polymerizable compounds) are added to the crosslinking functional groups and are addition-polymerized between the polymers directly or through polymerization chains of the polymerizable compounds, thereby forming crosslinking between polymer molecules. Alternatively, atoms in the polymers (for example, hydrogen atoms on carbon atoms adjacent to the crosslinking functional groups) are drawn off by free radicals, thus, polymer radicals are generated, and the polymer radicals are bonded to each other, thereby forming and curing crosslinking between polymer molecules.

The content of the crosslinking groups in the binder polymer (the content of unsaturated double bonds that can be radical-polymerized by means of iodimetry) is preferably in a range of 0.1 to 10.0 mmol, more preferably in a range of 1.0 to 7.0 mmol, and particularly preferably in a range of 2.0 to 5.5 mmol per gram of the binder polymer from the viewpoint of a favorable sensitivity and favorable storage stability.

Hereinafter, specific examples 1 to 11 of the binder polymer for on-machine development will be illustrated, but the present invention is not limited thereto. In the following exemplary compounds, numeric values shown beside individual repeating units (numeric values shown beside main chain repeating units) represent the molar percentages of the repeating units. The numeric value shown beside the repeating unit of a side chain represents the number of the repeating portion repeated. In addition, Me represents a methyl group, Et represents an ethyl group, and Ph represents a phenyl group.

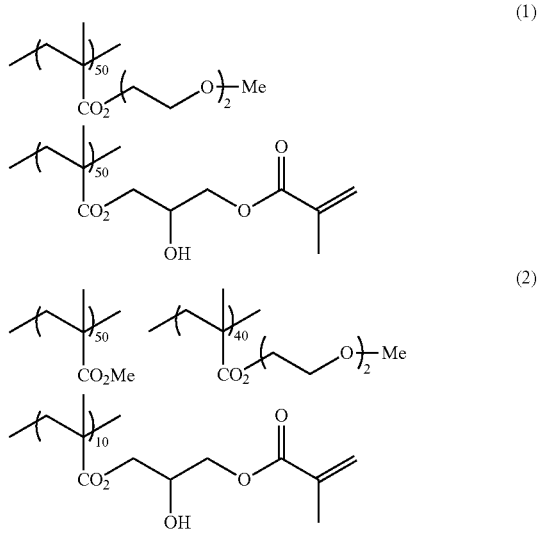

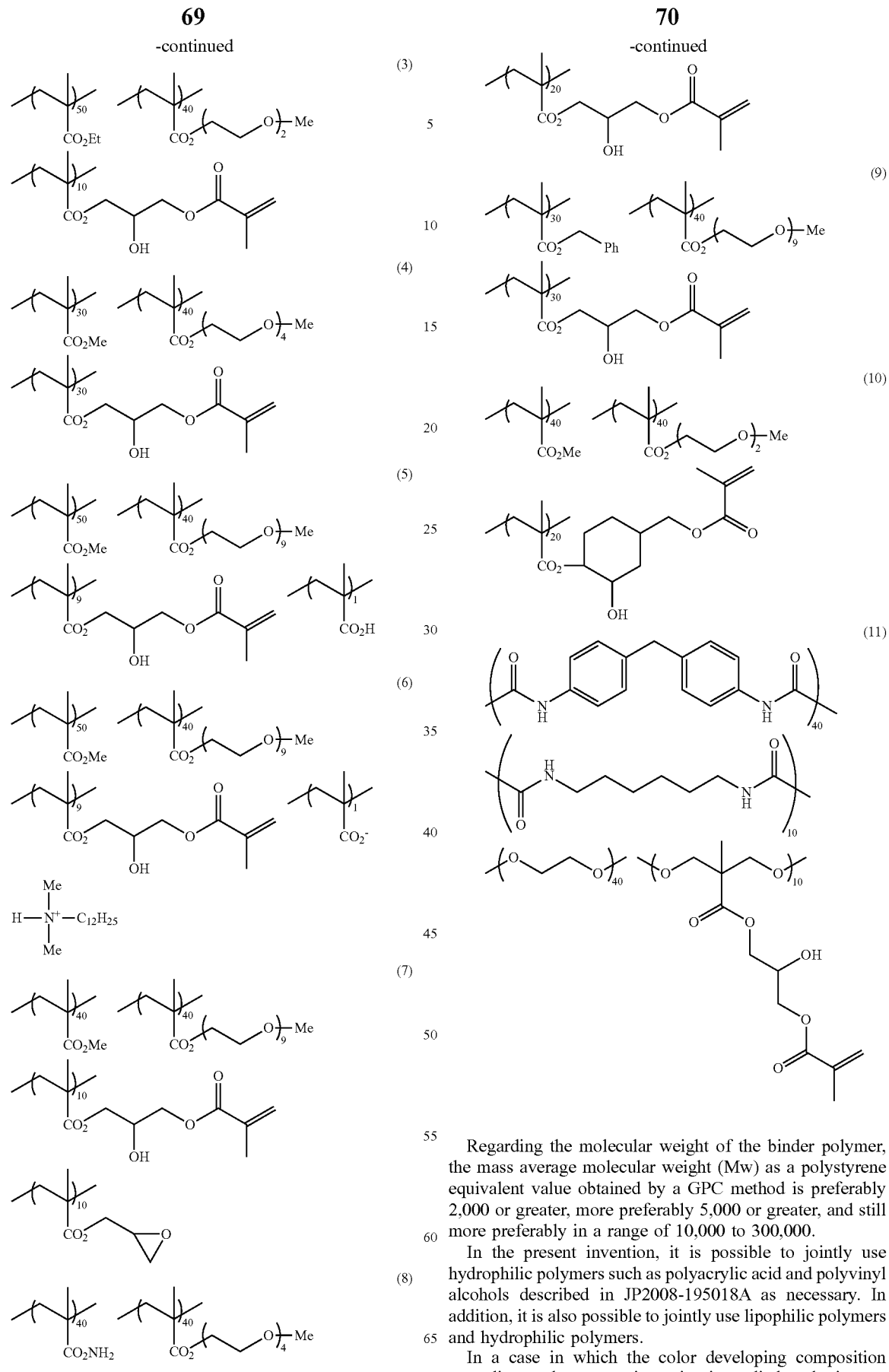

Regarding the molecular weight of the binder polymer, the mass average molecular weight (Mw) as a polystyrene equivalent value obtained by a GPC method is preferably 2,000 or greater, more preferably 5,000 or greater, and still more preferably in a range of 10,000 to 300,000.

In the present invention, it is possible to jointly use hydrophilic polymers such as polyacrylic acid and polyvinyl alcohols described in JP2008-195018A as necessary. In addition, it is also possible to jointly use lipophilic polymers and hydrophilic polymers.

In a case in which the color developing composition according to the present invention is applied to the image-recording layer in the lithographic printing plate precursor, the binder polymer may be present as a polymer that functions as a binder of individual components or may be present in a polymer particle shape in the color developing composition. In a case in which the binder polymer is present in a particulate form, the average primary particle diameter is preferably in a range of 10 to 1,000 nm, more preferably in a range of 20 to 300 nm, and still more preferably in a range of 30 to 120 nm.

In the color developing composition according to the present invention, the binder polymer may be used singly, or two or more binder polymers may be jointly used.

An arbitrary amount of the binder polymer can be added to the color developing composition. The content of the binder polymer can be appropriately selected depending on the use or the like of the color developing composition; however, generally, is preferably 1% to 90% by mass and more preferably 5% to 80% by mass of the total solid content of the color developing composition.

<Polymerization Initiator>

The color developing composition according to the present invention may include a polymerization initiator. The polymerization initiator that is used in the color developing composition is a compound that generates polymerization-initiating species such as radicals or cations using the energy of either or both light and heat, and it is possible to appropriately select and use well-known thermopolymerization initiators, compounds having bonds with a small bond dissociation energy, photopolymerization initiators, and the like.

The polymerization initiator is preferably an infrared-sensitive polymerization initiator. In addition, the polymerization initiator is preferably a radical polymerization initiator.

Examples of the radical polymerization initiator include (a) organic halides, (b) carbonyl compounds, (c) azo compounds, (d) organic peroxides, (e) metallocene compounds, (f) azide compounds, (g) hexaarylbiimidazole compounds, (h) organic borate compounds, (i) disulfone compounds, (j) oxime ester compounds, and (k) onium salt compounds.

(a) The organic halides are preferably, for example, compounds described in Paragraphs 0022 and 0023 of JP2008-195018A.

(b) The carbonyl compounds are preferably, for example, compounds described in Paragraph 0024 of JP2008-195018A.

(c) Examples of the azo compounds include azo compounds described in JP1996-108621A (JP-H08-108621A).

(d) The organic peroxides are preferably, for example, compounds described in Paragraph 0025 of JP2008-195018A.

(e) The metallocene compounds are preferably, for example, compounds described in Paragraph 0026 of JP2008-195018A.

(f) Examples of the azide compounds include compounds such as 2,6-bis(4-azidebenzylidene)-4-methylcyclohexanone.

(g) The hexaarylbiimidazole compounds are preferably, for example, compounds described in Paragraph 0027 of JP2008-195018A.

(h) The organic borate compounds are preferably, for example, compounds described in Paragraph 0028 of JP2008-195018A.

(i) Examples of the disulfone compounds include compounds described in each of JP1986-166544A (JP-S61-166544A) and JP2002-328465A.

(j) The oxime ester compounds are preferably, for example, compounds described in Paragraphs 0028 to 0030 of JP2008-195018A.

Among the polymerization initiators, from the viewpoint of curing properties, more preferred examples of the polymerization initiator include oxime esters and onium salts, and still more preferred examples thereof include onium salts such as iodonium salts, sulfonium salts, and azinium salts. In a case in which the polymerization initiator is used in the lithographic printing plate precursor, iodonium salts and sulfonium salts are particularly preferred. Specific examples of the iodonium salts and the sulfonium salts will be described below, but the present invention is not limited thereto.

Examples of the iodonium salts are preferably diphenyl iodonium salts, particularly preferably diphenyl iodonium salts having an electron-donating group as a substituent, for example, diphenyl iodonium salts substituted with alkyl groups or alkoxyl groups, and preferably asymmetric diphenyl iodonium salts. Specific examples thereof include diphenyliodonium=hexafluorophosphate, 4-methoxyphenyl-4-(2-methylpropyl)phenyliodonium=hexafluorophosphate, 4-(2-methylpropyl)phenyl-p-tolyliodonium=hexafluorophosphate, 4-hexyloxyphenyl-2,4,6-trimethoxyphenyliodonium=hexafluorophosphate, 4-hexyloxyphenyl-2,4-diethoxyphenyliodonium=tetrafluoroborate, 4-octyloxyphenyl-2,4,6-trimethoxyphenyliodonium=1-perfluorobutane sulfonate, 4-octyloxyphenyl-2,4,6-trimethoxyphenyliodonium=hexafluorophosphate, and bis(4-t-butylphenyl)iodonium=hexafluorophosphate.

Examples of the sulfonium salts are preferably triarylsulfonium salts, particularly preferably triarylsulfonium salts having an electron-donating group as a substituent, for example, triarylsulfonium salts in which at least some of electron-attracting groups, for example, groups on aromatic rings are substituted with halogen atoms, and still more preferably triarylsulfonium salts in which the total number of substituted halogen atoms on aromatic rings is four or greater. Specific examples thereof include triphenylsulfonium=hexafluorophosphate, triphenylsulfonium=benzoyl formate, bis(4-chlorophenyl)phenylsulfonium=benzoyl formate, bis(4-chlorophenyl)-4-methylphenylsulfonium=tetrafluoroborate, tris(4-chlorophenyl)sulfonium=3,5-bis(methoxycarbonyl)benzenesulfonate, tris(4-chlorophenyl)sulfonium=hexafluorophosphate, and tris(2,4-dichlorophenyl)sulfonium=hexafluorophosphate.

The polymerization initiator may be used singly or two or more polymerization initiators may be jointly used.

The content of the polymerization initiator is preferably in a range of 0.1% to 50% by mass, more preferably in a range of 0.5% to 30% by mass, and particularly preferably in a range of 0.8% to 20% by mass of the total solid content of the color developing composition.

<Polymerizable Compound>

The color developing composition according to the present invention may include a polymerizable compound. The color developing composition of the present invention including the polymerizable compound is a curable color developing composition having a polymerization curing function in addition to color developability by means of heat supply and/or exposure to infrared rays.

In addition, the color developing composition of the present invention can be preferably used as a curable composition including the polymerization initiator and the polymerizable compound and can be more preferably used as an infrared ray-curable or infrared-sensitive color developing composition.

The polymerizable compound that is used in the color developing composition may be, for example, a radical polymerizable compound or a cationic polymerizable compound, but is preferably an addition polymerizable compound having at least one ethylenically unsaturated bond (ethylenically unsaturated compound). The ethylenically unsaturated compound is preferably a compound having at least one terminal ethylenically unsaturated bond and more preferably a compound having two or more terminal ethylenically unsaturated bonds. The polymerizable compound may have a chemical form, for example, a monomer, a prepolymer, that is, a dimer, a trimer, or an oligomer, or a mixture thereof.

Examples of the monomer include unsaturated carboxylic acids (for example, acrylic acid, methacrylic acid, itaconic acid, crotonic acid, isocrotonic acid, and maleic acid), esters thereof, and amides thereof, and esters of unsaturated carboxylic acids and polyvalent amine compounds and amides of unsaturated carboxylic acids and polyhydric alcohol compounds are preferably used. In addition, addition reaction products between unsaturated carboxylic acid esters or amides having nucleophilic substituents such as hydroxy groups, amino groups, or mercapto groups and monofunctional or polyfunctional isocyanates or epoxies, dehydration condensation reaction products with monofunctional or polyfunctional carboxylic acids, and the like are also preferably used. In addition, addition reaction products between unsaturated carboxylic acid esters or amides having electrophilic substituents such as isocyanate groups and epoxy groups and monofunctional or polyfunctional alcohols, amines, or thiols, furthermore, substitution reaction products between unsaturated carboxylic acid esters or amides having dissociable substituents such as halogen atoms and tosyloxy groups and monofunctional or polyfunctional alcohols, amines, or thiols are also preferred. In addition, as additional examples, compound groups obtained by substituting the unsaturated carboxylic acids with unsaturated phosphonic acids, styrene, vinyl ethers, or the like can also be used. These monomers are described in JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-294935A, JP2006-243493A, JP2002-275129A, JP2003-64130A, JP2003-280187A, JP1998-333321A (JP-H10-333321A), and the like.

As specific examples of monomers of esters of polyhydric alcohol compounds and unsaturated carboxylic acids, examples of acrylic acid esters include ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, polyester acrylate oligomers, and the like. Examples of methacrylic acid esters include tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl] dimethyl methane, bis[p-(methacryloxyethoxy)phenyl] dimethyl methane, and the like. In addition, specific examples of monomers of amides of polyvalent amine compounds and unsaturated carboxylic acids include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, and the like.

In addition, urethane-based addition polymerizable compounds produced using an addition reaction between an isocyanate and a hydroxy group are also preferred, and specific examples thereof include vinyl urethane compounds having two or more polymerizable vinyl groups in one monomer obtained by adding vinyl monomers having a hydroxy group represented by Formula (M) to a polyisocyanate compound having two or more isocyanate groups in one molecule which is described in, for example, JP1973-41708B (JP-S48-41708B).

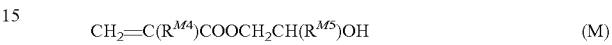

In Formula (M), each of $R^{M4}$ and $R^{M5}$ independently represents a hydrogen atom or a methyl group.

In addition, urethane acrylates described in JP1976-37193A (JP-S51-37193A), JP1990-32293B (JP-H02-32293B), JP1990-16765B (JP-H02-16765B), JP2003-344997A, and JP2006-65210A, urethane compounds having ethylene oxide-based skeletons described in JP1983-49860B (JP-S58-49860B), JP1981-17654B (JP-S56-17654B), JP1987-39417B (JP-S62-39417B), JP1987-39418B (JP-S62-39418B), JP2000-250211A, and JP2007-94138A, and urethane compounds having hydrophilic groups described in U.S. Pat. No. 7,153,632B, JP1996-505958A (JP-H08-505958A), JP2007-293221A, and JP2007-293223A are also preferred.

The details of the structures of the polymerizable compound and the method for using the polymerizable compound such as whether to use the polymerizable compound singly or jointly and the amount of the polymerizable compound added can be arbitrarily set in consideration of the applications and the like of the final color developing composition.

The content of the polymerizable compound is preferably in a range of 5% to 75% by mass, more preferably in a range of 10% to 70% by mass, and particularly preferably in a range of 15% to 60% by mass of the total solid content of the color developing composition.

<Radical Production Aid>

The color developing composition according to the present invention may contain a radical production aid. The radical production aid contributes to the improvement of the printing resistance in lithographic printing plates in a case in which the color developing composition is used for image-recording layers in the lithographic printing plate precursors. Examples of the radical production aid include five kinds of radical production aids described below.

(i) Alkyl or arylate complexes: It is considered that carbon-hetero bonds are oxidatively cleaved and active radicals are generated. Specific examples thereof include borate compounds and the like.

(ii) Amino acetate compounds: It is considered that C—X bonds on carbon adjacent to nitrogen are cleaved due to oxidation and active radicals are generated. X is preferably a hydrogen atom, a carboxy group, a trimethylsilyl group, or a benzyl group. Specific examples thereof include N-phenylglycines (which may have a substituent in a phenyl group), N-phenyl iminodiacetic acids (which may have a substituent in a phenyl group), and the like.

(iii) Sulfur-containing compounds: The above-described amino acetate compounds in which a nitrogen atom is substituted with a sulfur atom are capable of generating active radicals by means of the same action. Specific examples thereof include phenylthioacetic acids (which may have a substituent in a phenyl group) and the like.

(iv) Tin-containing compounds: The above-described amino acetate compounds in which a nitrogen atom is substituted with a tin atom are capable of generating active radicals by means of the same action.

(v) Sulfinates: Active radicals can be generated by means of oxidation. Specific examples thereof include sodium aryl sulfinate and the like.

Among these radical production aids, the color developing composition preferably contains a borate compound. The borate compound is preferably a tetraaryl borate compound or a monoalkyltriaryl borate compound, more preferably a tetraaryl borate compound from the viewpoint of the stability of the compound and the potential difference described below, and particularly preferably a tetraaryl borate compound having one or more aryl groups having an electron-attracting group from the viewpoint of the potential difference described below.

The electron-attracting group is preferably a group having a positive σ value of the Hammett equation and more preferably a group having a σ value of the Hammett equation in a range of 0 to 1.2. The σ value of the Hammett (the σp value and the σm value) are described in detail in Hansch, C.; Leo, A.; Taft, R. W., Chem. Rev., 1991, 91, 165 to 195.

The electron-attracting group is preferably a halogen atom, a trifluoromethyl group, or a cyano group and more preferably a fluorine atom, a chlorine atom, a trifluoromethyl group, or a cyano group.

A counter cation in the borate compound is preferably an alkali metal ion or a tetraalkyl ammonium ion and more preferably a sodium ion, a potassium ion, or a tetrabutylammonium ion.

In addition, in a case in which the color developing composition of the present invention includes the borate compound, the potential difference ΔG2 between the highest occupied molecular orbital (HOMO) of the compound represented by Formula (1) and the highest occupied molecular orbital of the borate compound (ΔG2=the HOMO of a HOMO borate compound of the compound represented by Formula (1)) is preferably 0.500 eV or more, more preferably 0.585 eV or more, and particularly preferably 0.608 to 1.000 eV.

In a case in which the potential difference between the HOMO of the compound represented by Formula (1) and the HOMO of the borate compound is in the above-described range, it is considered that the stability of the borate compound while not exposed to heat or infrared rays is excellent, and, in a case in which the borate compound is exposed to heat or infrared rays, electrons migrate from the HOMO of the borate compound to the HOMO of the compound represented by Formula (1), and thus the excitation of electrons to the lowest unoccupied molecular orbital (LUMO) of the compound represented by Formula (1) is accelerated, and the decomposition of the compound represented by Formula (1) is accelerated. In addition, it is considered that the electron migration from the compound represented by Formula (1) to the polymerization initiator is also accelerated, and contribution is made to the improvement of the printing resistance in lithographic printing plates in a case in which the color developing composition is used for an image-recording layer in the lithographic printing plate precursor.

The HOMO and LUMO of the compound represented by Formula (1) are computed using the following method.

First, counter anions in compounds which are computation subjects are ignored.

Quantum chemical calculation software Gaussian 09 is used, and structure optimization is carried out in DFT (B3LYP/6-31G(d)).

The molecular orbital (MO) energy is calculated using the structure obtained by means of the structure optimization in DFT (B3LYP/6-31+G(d,p)/CPCM (solvent=methanol)).

The MO energy Epre (unit: hartree) obtained by the above-described MO energy calculation is converted to Eaft (unit: eV) which is used as the HOMO and LUMO values in the present invention using the following expression.

$$E\text{aft} = 0.823168 \times 27.2114 \times E\text{pre} - 1.07634$$

Meanwhile, 27.2114 is simply a coefficient for converting hartree to eV, 0.823168 and −1.07634 are adjustment coefficients, and the HOMO and LUMO of compounds which are computation subjects are specified so that computation matches actually measured values.

ΔG2 is obtained from the difference between the HOMO of the compound represented by Formula (1) and the HOMO of the borate compound (ΔG2=the HOMO of the compound represented by Formula (1)—the HOMO of the borate compound).

Specific examples of the borate compound include compounds illustrated below. Here, $X_c^-$ represents a monovalent cation and is preferably an alkali metal ion or a tetraalkyl ammonium ion and more preferably an alkali metal ion or a tetrabutyl ammonium ion. In addition, Bu represents an n-butyl group.

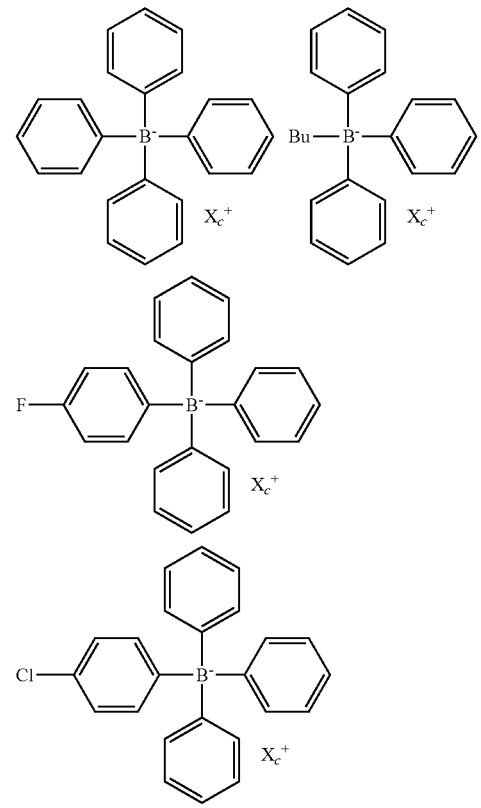

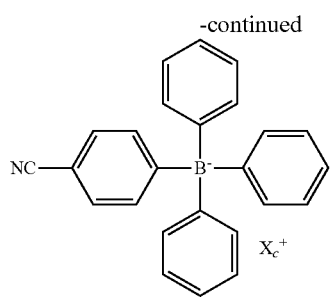
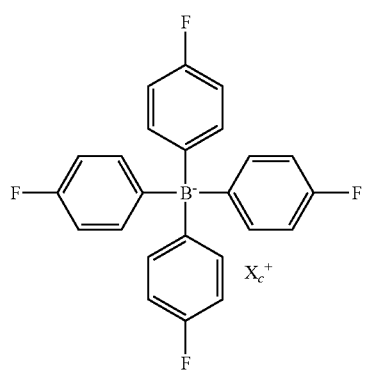
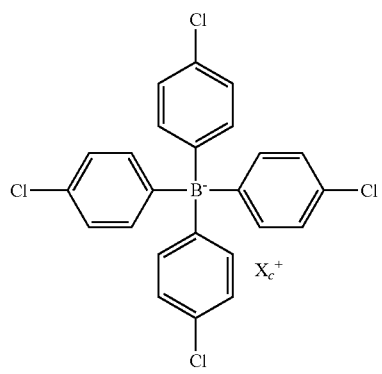
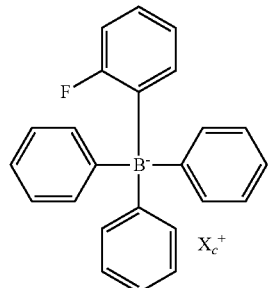
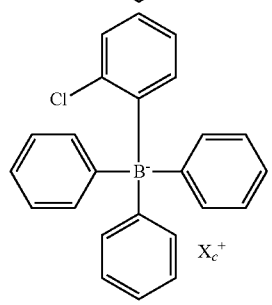
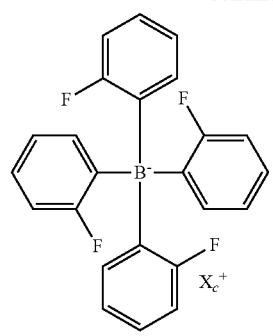
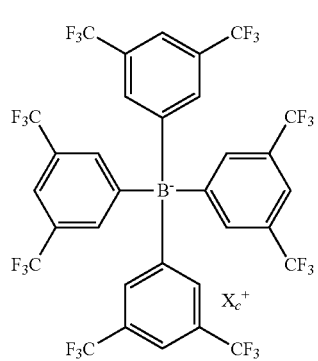
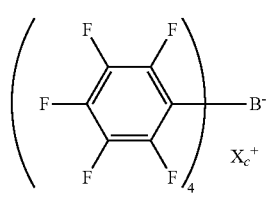
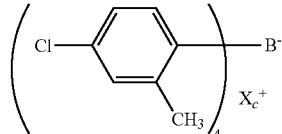
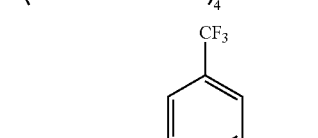
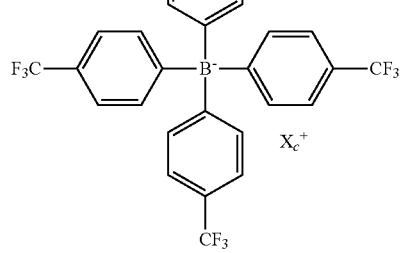
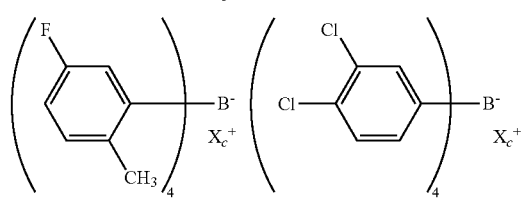

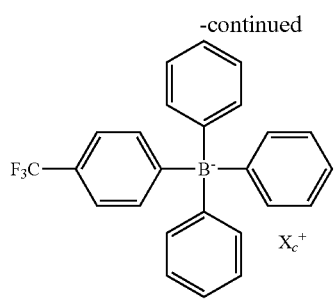
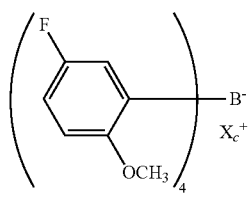
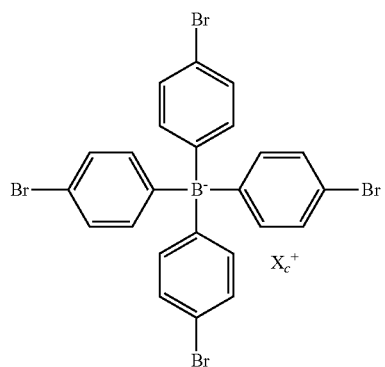
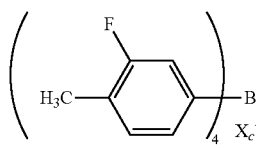
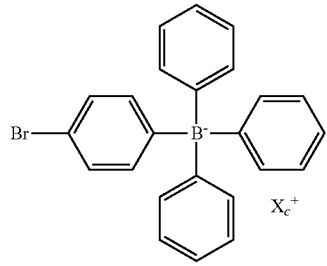
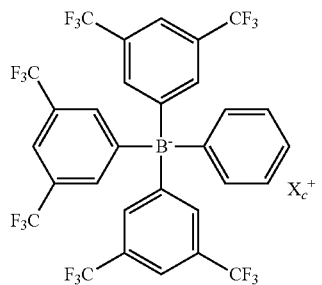
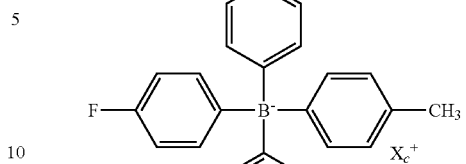
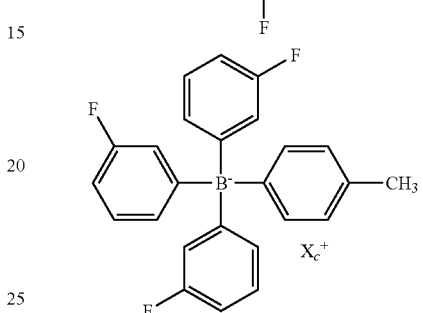
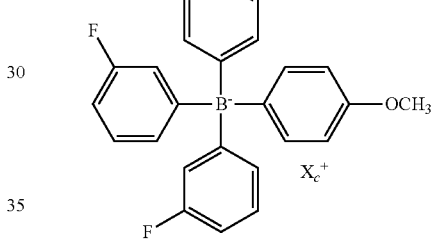
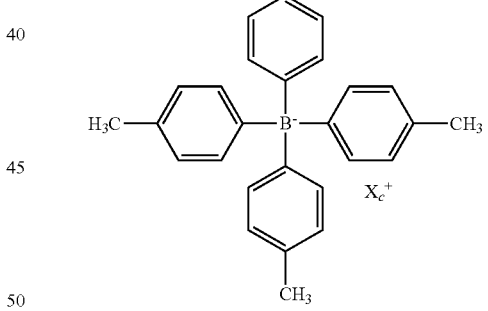
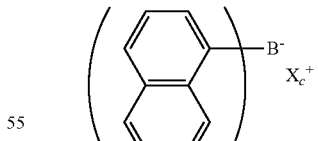
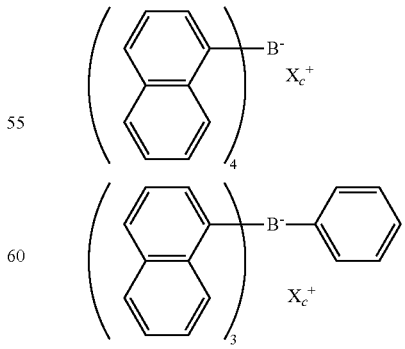
Only one radical production aid may be added thereto or two or more radical production aids may be jointly used.

The content of the radical production aid is preferably 0.01% to 30% by mass, more preferably 0.05% to 25% by mass, and still more preferably 0.1% to 20% by mass of the total solid content of the color developing composition.

<Chain Transfer Agent>

The color developing composition of the present invention may contain a chain transfer agent. The chain transfer agent contributes to the improvement of the printing resistance in lithographic printing plates in a case in which the color developing composition is used for the image-recording layer in the lithographic printing plate precursor.

The chain transfer agent is preferably a thiol compound, more preferably a thiol having 7 or more carbon atoms from the viewpoint of the boiling point (difficulty of being volatilized), and still more preferably a compound having a mercapto group on an aromatic ring (aromatic thiol compound). The thiol compound is preferably a monofunctional thiol compound.

Specific examples of the chain transfer agent include the following compounds.

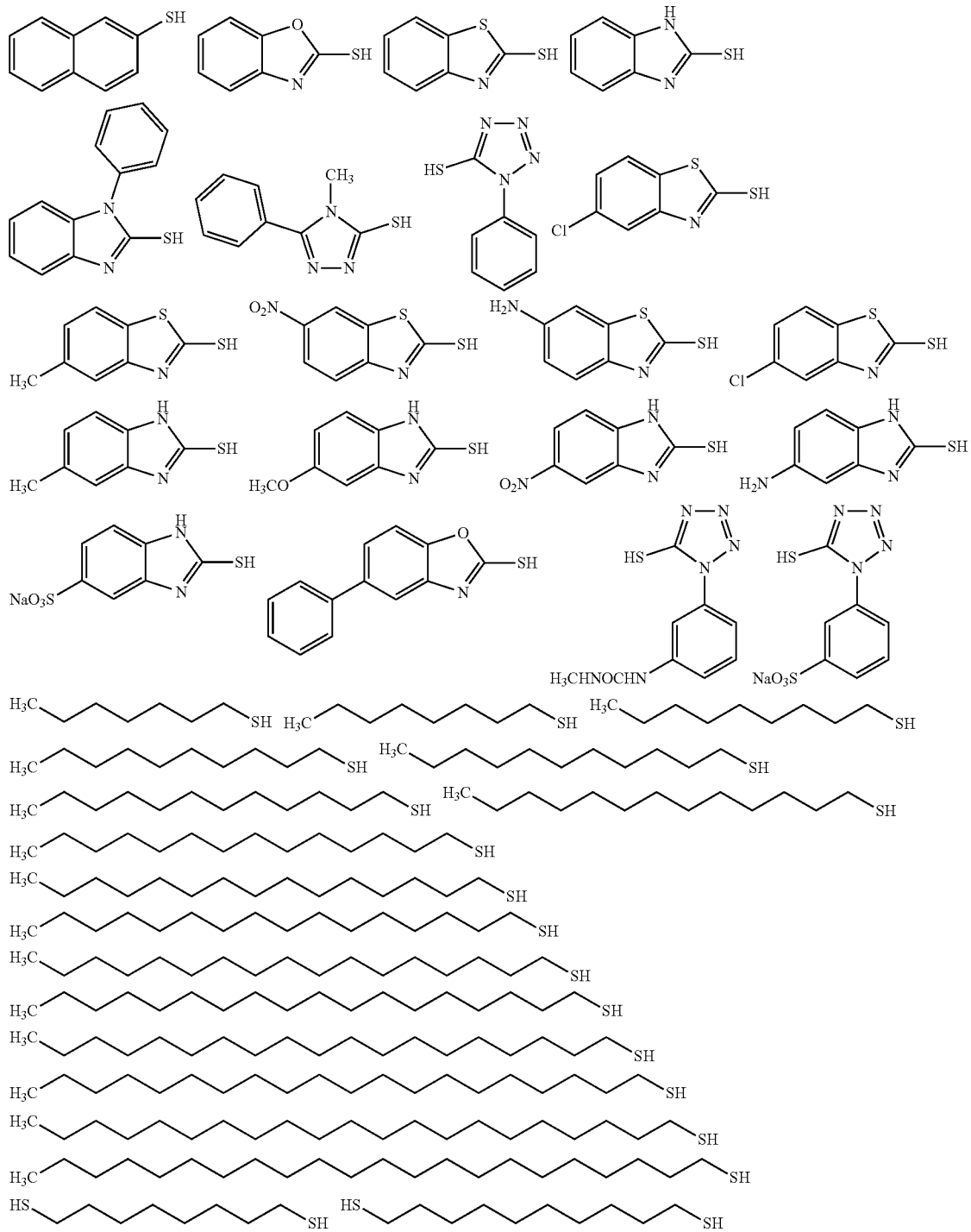

-continued

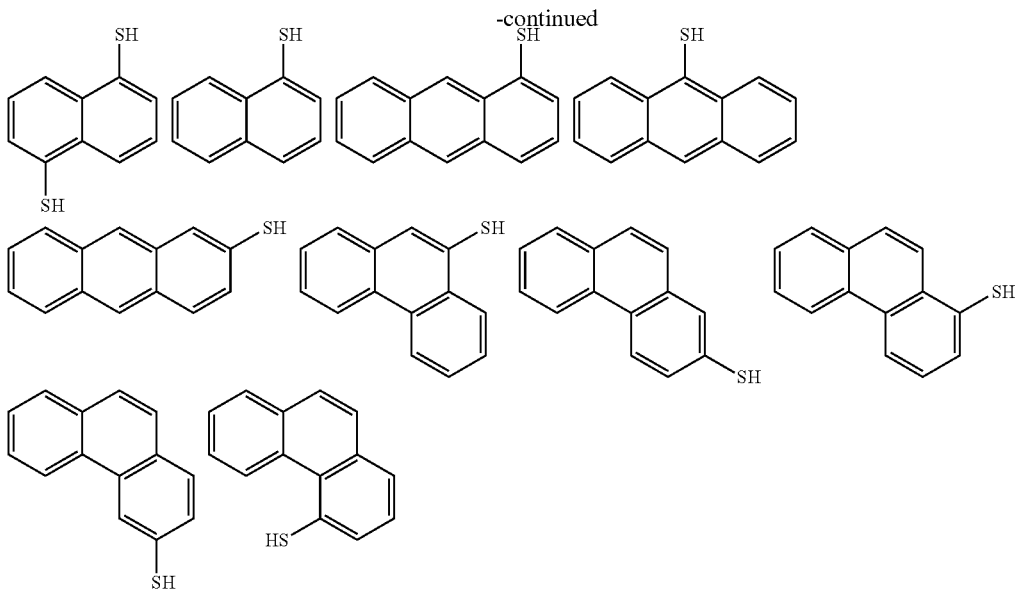

Only one chain transfer agent may be added thereto or two or more chain transfer agents may be jointly used.

The content of the chain transfer agent is preferably 0.01% to 50% by mass, more preferably 0.05% to 40% by mass, and still more preferably 0.1% to 30% by mass of the total solid content of the color developing composition.

<Infrared Absorber>

The color developing composition according to the present invention may contain an infrared absorber. In the case of containing an infrared absorber, the color developing composition according to the present invention can be more preferably used as an infrared-sensitive color developing composition.

In addition, even in the case of being used as a thermosensitive color developing composition, the color developing composition according to the present invention may contain an infrared absorber.

The infrared absorber is a compound having a function of converting absorbed infrared rays to heat. In addition, the infrared absorber may also have a function of migrating electrons and/or energy to a polymerization initiator or the like described below by being excited by infrared rays.

The infrared absorber preferably has the maximum absorption in a wavelength range of 750 to 1,400 nm. As the infrared absorber, a dye or a pigment is preferably used.

As the dye, a commercially available dye and a well-known dye described in documents such as "Dye Handbook" (edited by The Society of Synthetic Organic Chemistry, Japan, published on 1970) can be used. Specific examples thereof include dyes such as azo dyes, metal complex salt azo dyes, pyrazolone azo dyes, naphthoquinone dyes, anthraquinone dyes, phthalocyanine dyes, carbonium dyes, quinone imine dyes, methine dyes, cyanine dyes, squarylium colorants, pyrylium salts, and metal thiolate complexes.

Among these dyes, preferred examples include cyanine colorants, squarylium colorants, and pyrylium salts. Among these, cyanine colorants are preferred, and indolenine cyanine colorants are particularly preferred.

Specific examples of the cyanine colorants include the compounds described in Paragraphs 0017 to 0019 of JP2001-133969A, the compounds described in Paragraphs 0016 to 0021 of JP2002-023360A, and Paragraphs 0012 to 0037 of JP2002-040638A, preferably, the compounds described in Paragraphs 0034 to 0041 of JP2002-278057A and Paragraphs 0080 to 0086 of JP2008-195018A, and, particularly preferably, the compounds described in Paragraphs 0035 to 0043 of JP2007-90850A.

In addition, the compounds described in Paragraphs 0008 and 0009 of JP1993-5005A (JP-H05-5005A) and Paragraphs 0022 to 0025 of JP2001-222101A can also be preferably used.

As the pigment, the compounds described in Paragraphs 0072 to 0076 of JP2008-195018A are preferred.

The infrared absorber may be used singly, two or more infrared absorbers may be jointly used. In addition, a pigment and a dye may be jointly used as the infrared absorber.

An arbitrary amount of the infrared absorber can be added to the color developing composition. The content of the infrared absorber is preferably in a range of 0.05% to 30% by mass, more preferably in a range of 0.1% to 20% by mass, and still more preferably in a range of 0.2% to 10% by mass with respect to 100 parts by mass of the total solid content in the color developing composition.

<Acid Color Developer>

The color developing composition according to the present invention preferably includes an acid color developer.

The "acid color developer" that is used in the present invention refers to a compound having a property of developing color by being heated in a state of receiving an electron-receiving compound (for example, a proton such as an acid). The acid color developer is particularly preferably a colorless compound which has a partial skeleton such as lactone, lactam, sultone, spiropyran, an ester, or an amide and in which the partial skeleton rapidly ring-opens or cleavages in the case of coming into contact with the electron-receiving compound.

Examples of the above-described acid color developer include phthalides such as 3,3-bis(4-dimethylaminophenyl)-6-dimethylaminophthalide (referred to as "crystal violet lactone"), 3,3-bis(4-dimethylphenyl)phthalide, 3-(4-dimethylaminophenyl)-3-(4-diethylamino-2-methylphenyl)-6-dimethylaminophthalide, 3-(4-dimethylaminophenyl)-3-(1,2-dimethylindol-3-yl)phthalide, 3-(4-dimethylaminophenyl)-3-

(2-methylindol-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazole-3-yl)-6-dimethylaminophthalide, 3,3-bis(2-phenylindol-3-yl)-6-dimethylaminophthalide, 3-(4-dimethylaminophenyl)-3-(1-methylpyrrole-3-yl)-6-dimethylaminophthalide, 3,3-bis[1,1-bis(4-dimethylaminophenyl)ethylene-2-yl]-4,5,6,7-tetrachlorophthalide, 3,3-bis[1,1-(4-pyrrolidinophenyl)ethylene-2-yl]-4,5,6,7-tetrabromophthalide, 3,3-bis[1-(4-dimethylaminophenyl)-1-(4-methoxyphenyl)ethylene-2-yl]-4,5,6,7-tetrachlorophthalide, 3,3-bis[1-(4-pyrrolidinophenyl)-1-(4-methoxyphenyl)ethylene-2-yl]-4,5,6,7-tetrachlorophthalide, 3-[1,1-di(1-ethyl-2-methylindol-3-yl)ethylene-2-yl]-3-(4-diethylaminophenyl)phthalide, 3-[1,1-di(1-ethyl-2-methylindol-3-yl)ethylene-2-yl]-3-(4-N-ethyl-N-phenylaminophenyl)phthalide, 3-(2-ethoxy-4-diethylaminophenyl)-3-(1-n-octyl-2-methylindol-3-yl)-phthalide, 3,3-bis(1-n-octyl-2-methylindol-3-yl)-phthalide, and 3-(2-methyl-4-diethylaminophenyl)-3-(1-n-octyl-2-methylindol-3-yl)-phthalide, fluoranthenes such as 4,4-bis-dimethylaminobenzhydryl benzyl ether, N-halophenyl-leucoauramine, N-2,4,5-trichlorophenyl leucoauramine, rhodamine-B-anilinolactam, rhodamine-(4-nitroanilino) lactam, rhodamine-B-(4-chloroanilino) lactam, 3,7-bis(diethylamino)-10-benzoylphenoxazine, benzoyl leuco methylene blue, 4-nitrobenzoylmethylene blue, 3,6-dimethoxyfluoran, 3-dimethylamino-7-methoxyfluoran, 3-diethylamino-6-methoxyfluoran, 3-diethylamino-7-methoxyfluoran, 3-diethylamino-7-chlorofluoran, 3-diethylamino-6-methyl-7-chlorofluoran, 3-diethylamino-6,7-dimethylfluoran, 3-N-cyclohexyl-N-n-butylamino-7-methylfluoran, 3-diethylamino-7-dibenzoylaminofluoran, 3-diethylamino-7-octylaminofluoran, 3-diethylamino-7-di-n-hexylaminofluoran, 3-diethylamino-7-anilinofluoran, 3-diethylamino-7-(2'-fluorophenylamino)fluoran, 3-diethylamino-7-(2'-chlorophenylamino)fluoran, 3-diethylamino-7-(3'-chlorophenylamino)fluoran, 3-diethylamino-7-(2',3'-dichlorophenylamino)fluoran, 3-diethylamino-7-(3'-trifluoromethylphenylamino)fluorane, 3-di-n-butylamino-7-(2'-fluorophenylamino)fluoran, 3-di-n-butylamino-7-(2'-chlorophenylamino)fluoran, 3-N-isopentyl-N-ethylamino-7-(2'-chlorophenylamino)fluorane, 3-N-n-hexyl-N-ethylamino-7-(2'-chlorophenylamino)fluoran, 3-diethylamino-6-chloro-7-anilinofluoran, 3-di-n-butylamino-6-chloro-7-anilinofluoran, 3-diethylamino-6-methoxy-7-anilinofluoran, 3-di-n-butylamino-6-ethoxy-7-anilinofluoran, 3-pyrrolidino-6-methyl-7-anilinofluoran, 3-piperidino-6-methyl-7-anilinofluoran, 3-morpholino-6-methyl-7-anilinofluoran, 3-dimethylamino-6-methyl-7-anilinofluoran, 3-diethylamino-6-methyl-7-anilinofluoran, 3-di-n-butylamino-6-methyl-7-anilinofluoran, 3-di-n-pentylamino-6-methyl-7-anilinofluoran, 3-N-ethyl-N-methyl-amino-6-methyl-7-anilinofluoran, 3-N-n-propyl-N-methyl-amino-6-methyl-7-anilinofluoran, 3-N-n-propyl-N-ethylamino-6-methyl-7-anilinofluoran, 3-N-n-butyl-N-methylamino-6-methyl-7-anilinofluoran, 3-N-isobuyl-N-methylamino-6-methyl-7-anilinofluoran, 3-N-isobutyl-N-ethylamino-6-methyl-7-anilinofluoran, 3-N-isobutyl-N-ethylamino-6-methyl-7-anilinofluoran, 3-N-isopentyl-N-ethylamino-6-methyl-7-anilinofluoran, 3-N-n-hexyl-N-ethylamino-6-methyl-7-anilinofluoran, 3-N-cyclohexyl-N-ethylamino-6-methyl-7-anilinofluoran, 3-N-cyclohexyl-N-n-propylamino-6-methyl-7-anilinofluoran, 3-N-cyclohexyl-N-n-butylamino-6-methyl-7-anilinofluoran, 3-N-cyclohexyl-N-n-hexylamino-6-methyl-7-anilinofluoran, 3-N-cyclohexyl-N-n-octylamino-6-methyl-7-anilinofluoran, 3-N-(2'-methoxyethyl)-N-methylamino-6-methyl-7-anilinofluoran, 3-N-(2'-methoxyethyl)-N-ethylamino-6-methyl-7-anilinofluoran, 3-N-(2'-methoxyethyl)-N-isobutylamino-6-methyl-7-anilinofluoran, 3-N-(2'-ethoxyethyl)-N-methylamino-6-methyl-7-anilinofluoran, 3-N-(2'-ethoxyethyl)-N-ethylamino-6-methyl-7-anilinofluoran, 3-N-(3'-methoxypropyl)-N-methylamino-6-methyl-7-anilinofluoran, 3-N-(3'-methoxypropyl)-N-ethylamino-6-methyl-7-anilinofluoran, 3-N-(3'-ethoxypropyl)-N-ethylamino-6-methyl-7-anilinofluoran, 3-N-(3'-ethoxypropyl)-N-methylamino-6-methyl-7-anilinofluoran, 3-N-(2'-tetrahydrofurfuryl)-N-ethylamino-6-methyl-7-anilinofluoran, 3-N-(4'-methylphenyl)-N-ethylamino-6-methyl-7-anilinofluoran, 3-diethylamino-6-methyl-7-anilinofluran, 3-diethylamino-6-methyl-7-(3'-methylphenylamino)fluoran, 3-diethylamino-6-methyl-7-(2',6'-methylphenylamino)fluoran, 3-di-n-butylamino-6-methyl-7-(2',6'-methylphenylamino)fluoran, 3-di-n-butylamino-7-(2',6'-dimethylphenylamino)fluoran, 2,2-bis[4'-(3-N-cyclohexyl-N-methylamino-6-methylfluoran)-7-ylaminophenyl]propane, 3-[4'-(4-phenylaminophenyl)aminophenyl]amino-6-methyl-7-chlorofluoran, and 3-[4'-(dimethylaminophenyl)] amino-5,7-dimethylfluoran, phthalides such as 3-(2-methyl-4-diethylaminophenyl)-3-(1-ethyl-2-methylindol-3-yl)-4-azaphthalide, 3-(2-n-propoxycarbonylamino-4-di-n-propylaminophenyl)-3-(1-ethyl-2-methylindol-3-yl)-4-azaphthalide, 3-(2-methylamino-4-di-n-propylaminophenyl)-3-(1-ethyl-2-methylindol-3-yl)-4-azaphthalide, 3-(2-methyl-4-di n-hexylaminophenyl)-3-(1-n-octyl-2-methylindol-3-yl)-4,7-diazaphthalide, 3,3-bis(2-ethoxy-4-diethylaminophenyl)-4-azaphthalide, 3,3-bis(1-n-octyl-2-methylindol-3-yl)-4-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-octyl-2-methylindol-3-yl)-4 or 7-azaphthalide, 3-(2-ethoxy-4-diethylaminophenyl)-3-(1-ethyl-2-methylindol-3-yl)-4 or 7-azaphthalide, 3-(2-hexyloxy-4-diethylaminophenyl)-3-(1-ethyl-2-methylindol-3-yl)-4 or 7-azaphthalide, 3-(2-ethoxy-4-diethylaminophenyl)-3-(1-ethyl-2-phenylindol-3-yl)-4 or 7-azaphthalide, 3-(2-butoxy-4-diethylaminophenyl)-3-(1-ethyl-2-phenylindol-3-yl)-4 or 7-azaphthalide, 3-methyl-spiro-dinaphthopyran, 3-ethyl-spiro-dinaphthopyran, 3-phenyl-spiro-dinaphthopyran, 3-benzyl-spiro-dinaphthopyran, 3-methyl-naphtho-(3-methoxybenzo)spiropyran, 3-propyl-spiro-dibenzopyran-3,6-bis(dimethylamino)fluorene-9-spiro-3'-(6'-dimethylamino)phthalide, and 3,6-bis(diethylamino)fluorene-9-spiro-3'-(6'-dimethylamino)phthalide, additionally, 2'-anilino-6'-(N-ethyl-N-isopentyl)amino-3'-methylspiro[isobenzofuran-1 (3H), 9'-(9H) xanthene]-3-one, 2'-anilino-6'-(N-ethyl-N-(4-methylphenyl))amino-3'-methylspiro[isobenzofuran-1 (3H), 9'-(9H) xanthen]-3-one, 3'-N,N-dibenzylamino-6'-N,N-diethylaminospiro[isobenzofuran-1 (3H), 9'-(9H) xanthen]-3-one, 2'-(N-methyl-N-phenyl)amino-6'-(N-ethyl-N-(4-methylphenyl)) aminospiro [isobenzofuran-1 (3H), 9'-(9H) xanthen]-3-one, and the like.

Among these, the acid color developer that is used in the present invention is preferably at least one compound selected from the group consisting of a spiropyran compound, a spirooxazine compound, a spirolactone compound, and a spirolactam compound.

The hue of the colorant after color development is preferably green, blue, or black from the viewpoint of visibility.

As the acid color developer, it is also possible to use commercially available products, and examples thereof include ETAC, RED 500, RED 520, CVL, S-205, BLACK 305, BLACK 400, BLACK 100, BLACK 500, H-7001, GREEN 300, NIRBLACK 78, BLUE 220, H-3035, BLUE 203, ATP, H-1046, H-2114 (all manufactured by Fukui Yamada Chemical Co., Ltd.), ORANGE-DCF, Vermilion-DCF, PINK-DCF, RED-DCF, BLMB, CVL, GREEN-DCF, TH-107 (all manufactured by Hodogaya Chemical Co., Ltd.), ODB, ODB-2, ODB-4, ODB-250, ODB-Black XV, Blue-63, Blue-502, GN-169, GN-2, Green-118, Red-40, Red-8 (all manufactured by Yamamoto Chemicals Inc.), crystal violet lactone (manufactured by Tokyo Chemical Industry Co., Ltd.), and the like. Among these commercially available products, ETAC, S-205, BLACK 305, BLACK 400, BLACK 100, BLACK 500, H-7001, GREEN 300, NIRBLACK 78, H-3035, ATP, H-1046, H-2114, GREEN-DCF, Blue-63, GN-169, and crystal violet lactone are preferred since the visible light absorbance of films to be formed is favourable.

These acid color developers may be used singly, or two or more components can also be used in combination.

The color developing composition according to the present invention may contain additives other than the above-described components (for example, a surfactant) as necessary.

The respective components that are included in the color developing composition according to the present invention can be dissolved or dispersed in an appropriate solvent so as to prepare a coating fluid, applying and drying the coating fluid on a support or the like, and forming a color developing composition film.

As the solvents, well-known solvents can be used. Specific examples thereof include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethyl formamide, dimethyl sulfoxide, γ-butyrolactone, methyl lactate, ethyl lactate, and the like. These solvent may be used singly or two or more solvents may be used in a mixed form. The concentration of the solid content in the coating fluid is preferably in a range of approximately 1% to 50% by mass. The concentration of the solid content refers to the concentration of all components excluding solvents.

The color developing composition according to the present invention can be used for thermosensitive color developing materials, infrared-sensitive color developing materials, and the like. Thermosensitive color developing materials can be used in a broad range as thermosensitive recording media such as tickets or receipts in terminal printers of facsimiles or computers, automatic vending machines, measurement recorders, cash counters in supermarkets or convenience stores, and the like.

In addition, the color developing composition according to the present invention is preferably used as image-forming materials. Examples of the image-forming materials include image-forming materials in which color development is used by means of image exposure such as lithographic printing plate precursors, print wiring substrates, color filters, and photo masks and image-forming materials in which color development and polymerization curing is used.

Image-forming materials for which the color developing composition according to the present invention is used form a color developing image by means of heating or exposure to light sources that radiate infrared rays. As heating means, well-known heating means can be used, and examples thereof include heaters, ovens, hot plates, infrared lamps, infrared lasers, and the like. Examples of the light sources that radiate infrared rays include solid-state lasers that radiate infrared rays, semiconductor lasers, and the like.

[Lithographic Printing Plate Precursor]

Next, an example of applying the color developing composition according to the present invention to a lithographic printing plate precursor will be described.

The lithographic printing plate precursor according to the present invention has an image-recording layer including the color developing composition according to the present invention on a support.

Hereinafter, an on-machine development-type lithographic printing plate precursor in which the characteristics of the color developing composition according to the present invention are significantly developed will be described as an example.

[Image-Recording Layer]

For the image-recording layer in the lithographic printing plate precursor, development aptitude and printing aptitude are required. Therefore, the color developing composition that is used for the image-recording layer preferably contains the compound represented by Formula (1) and the binder polymer. In the case of an on-machine development-type lithographic printing plate precursor, as the binder polymer, a binder polymer for on-machine development is preferably used.

The color developing composition that is used for the image-recording layer preferably further contains a polymerizable compound.

The color developing composition that is used for the image-recording layer preferably further contains a polymerization initiator, a radical production aid, and a chain transfer agent singly or in combination.

That is, the image-recording layer in the lithographic printing plate precursor according to the present invention contains the respective components that the color developing composition contains.

Regarding the respective constituent components such as the compound represented by Formula (1), the binder polymer, the polymerizable compound, the polymerization initiator, the radical production aid, and the chain transfer agent which are included in the image-recording layer and the contents thereof, it is possible to refer to the description in the section of the color developing composition according to the present invention.

The image-recording layer may further contain polymer particles, a low-molecular-weight hydrophilic compound, a sensitization agent, and other components in addition to the above-described constituent components.

(Polymer Particles)

In order to improve the on-machine developability of the lithographic printing plate precursor, the image-recording layer may contain polymer particles. The polymer particles are preferably polymer particles capable of converting the image-recording layer to be hydrophobic in the case of being irradiated with heat. The polymer particles are preferably at least one selected from hydrophobic thermoplastic polymer particles, thermally reactive polymer particles, polymer particles having polymerizable groups, microcapsules including hydrophobic compounds, and micro gels (crosslinking polymer particles). Among these, polymer particles having polymerizable groups and micro gels are preferred.

Preferred examples of the hydrophobic thermoplastic polymer particles include hydrophobic thermoplastic polymer particles described in Research Disclosure No. 33303 of January 1992 and the specifications of JP1997-123387A (JP-H09-123387A), JP1997-131850A (JP-H09-131850A), JP1997-171249A (JP-H09-171249A), JP1997-171250A (JP-H09-171250A), and EP931647B.

Specific examples of polymers that constitute the hydrophobic thermoplastic polymer particles include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures thereof. Preferred examples thereof include copolymers having polystyrene, styrene, and acrylonitrile and methyl polymethacrylate. The average particle diameter of the hydrophobic thermoplastic polymer particles is preferably in a range of 0.01 µm to 2.0 µm.

Examples of the thermally reactive polymer particles include polymer particles having thermally reactive groups. Polymer particles having thermally reactive groups form hydrophobilized regions through crosslinking by thermal reactions and changes in functional groups at this time.

The thermally reactive groups in the polymer particles having thermally reactive groups may be functional groups that cause any reactions as long as chemical bonds are formed, but are preferably polymerizable groups. Preferred examples thereof include ethylenically unsaturated groups that cause radical polymerization reactions (for example, acryloyl groups, methacryloyl groups, vinyl groups, allyl groups, and the like), cationic polymerizable groups (for example, vinyl groups, vinyloxy groups, epoxy groups, oxetanyl groups, and the like), isocyanato groups that cause addition reactions or blocked bodies thereof, epoxy groups, vinyloxy groups, functional groups having active hydrogen atoms that are reaction partners thereof (for example, amino groups, hydroxy groups, carboxy groups, and the like), carboxy groups that cause condensation reactions, hydroxy groups or amino groups that are reaction partners, acid anhydrides that cause ring-opening addition reactions, amino groups or hydroxy groups which are reaction partners, and the like.

Examples of the microcapsules include microcapsules including all or part of the constituent components of the image-recording layer as described in JP2001-277740A and JP2001-277742A. The constituent components of the image-recording layer can also be added outside the microcapsules. A preferred aspect of the image-recording layer including the microcapsules is an image-recording layer including hydrophobic constituent components in the microcapsules and including hydrophilic constituent components outside the microcapsules.

Micro gels (crosslinking polymer particles) are capable of containing some of the constituent components of the image-recording layer in at least one of the inside or surface thereof, and particularly, an aspect of micro capsules that have radical polymerizable groups on the surfaces and thus turn into reactive micro gels is preferred from the viewpoint of image-forming sensitivity or printing resistance.

In order to put the constituent components of the image-recording layer into microcapsules or micro gels, well-known methods can be used.

The average particle diameter of the microcapsules or the micro gels is preferably in a range of 0.01 to 3.0 µm, more preferably in a range of 0.05 to 2.0 µm, and particularly preferably in a range of 0.10 to 1.0 µm. Within this range, favorable resolution and temporal stability can be obtained.

The content of the polymer particles is preferably 5% to 90% by mass of the total solid content of the image-recording layer.

(Low-Molecular-Weight Hydrophilic Compound)

In order to improve on-machine developability without degrading printing resistance, the image-recording layer may include a low-molecular-weight hydrophilic compound. Meanwhile, the low-molecular-weight hydrophilic compound is preferably a compound having a molecular weight of smaller than 1,000, more preferably a compound having a molecular weight of smaller than 800, and still more preferably a compound having a molecular weight of smaller than 500.

As the low-molecular-weight hydrophilic compound, examples of water-soluble organic compounds include glycols such as ethylene glycol, diethylene glycol, triethylene glycol, propylene glycol, dipropylene glycol, and tripropylene glycol and ethers or ester derivative thereof, polyols such as glycerin, pentaerythritol, and tris(2-hydroxyethyl) isocyanurate, organic amines such as triethanolamine, diethanolamine, and monoethanolamine and salts thereof, organic sulfonic acids such as alkyl sulfonic acid, toluenesulfonic acid, and benzenesulfonic acid and salts thereof, organic sulfamic acids such as alkyl sulfamate and salts thereof, organic sulfuric acids such as alkyl sulfates and alkyl ether sulfates and salts thereof, organic phosphonic acids such as phenylphosphonic acid and salts thereof, organic carboxylic acids such as tartaric acid, oxalic acid, citric acid, malic acid, lactic acid, gluconic acid, and amino acid and salts thereof, betaines, and the like.

As the low-molecular-weight hydrophilic compound, it is preferable to add at least one selected from polyols, organic sulfates, organics sulfonates, and betaines.

Specific examples of the organic sulfonates include alkyl sulfonates such as sodium n-butyl sulfonate, sodium n-hexyl sulfonate, sodium 2-ethylhexyl sulfonate, sodium cyclohexyl sulfonate, and sodium n-octyl sulfonate; alkyl sulfonates having ethylene oxide chains such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, sodium 5,8,11,14-tetraoxatetracosane-1-sulfonate; aryl sulfonates such as sodium benzene sulfonate, sodium p-toluenesulfonate, sodium p-hydroxybenzene sulfonate, sodium p-styrene sulfonate, sodium dimethyl isophthalate-5-sulfonate, sodium 1-naphthyl sulfonate, sodium 4-hydroxynaphthylsulfonate, sodium 1,5-naphthalene disulfonate, and trisodium 1,3,6-naphthalene trisulfonate; compounds described in Paragraphs 0026 to 0031 of JP2007-276454A and Paragraphs 0020 to 0047 of JP2009-154525A; and the like. The salts may be potassium salts or lithium salts.

Examples of the organic sulfates include sulfates of alkyls, alkenyls, alkynyls, aryls, or heterocyclic monoethers such as polyethylene oxides. The number of ethylene oxide units is preferably in a range of 1 to 4, and the salts are preferably sodium salts, potassium salts, or lithium salts. Specific examples thereof include compounds described in Paragraphs 0034 to 0038 of JP2007-276454A.

The betaines are preferably compounds in which the number of carbon atoms in hydrocarbon substituents into nitrogen atoms is in a range of 1 to 5, and specific examples thereof include trimethyl ammonium acetate, dimethyl propyl ammonium acetate, 3-hydroxy-4-trimethyl ammonio butyrate, 4-(1-pyridinio) butyrate, 1-hydroxyethyl-1-imidazolio acetate, trimethyl ammonium methanesulfonate, dimethyl propyl ammonium methanesulfonate, 3-trimethylammonio-1-propane sulfonate, 3-(1-pyridinio)-1-propane sulfonate, and the like.

Since the low-molecular-weight hydrophilic compound has a small structure in hydrophobic portions and barely has surfactant actions, there are no cases in which dampening water permeates exposed portions (image areas) in the image-recording layer and thus the hydrophobic properties or membrane hardness of the image areas degrade, and it is possible to favorably maintain the ink-receiving properties or printing resistance of the image-recording layer.

The content of the low-molecular-weight hydrophilic compound is preferably in a range of 0.5% to 20% by mass, more preferably in a range of 1% to 15% by mass, and still more preferably in a range of 2% to 10% by mass of the total solid content of the image-recording layer. Within this range, favorable on-machine developability and printing resistance can be obtained.

The low-molecular-weight hydrophilic compound may be used singly or two or more low-molecular-weight hydrophilic compound may be used in a mixed form.

(Sensitization Agent)

In order to improve ink-absorbing properties, the image-recording layer may contain a sensitization agent such as a phosphonium compound, a nitrogen-containing low-molecular-weight compound, or an ammonium group-containing polymer. Particularly, in a case in which an inorganic lamellar compound is added to the protective layer, these compounds function as surface coating agents for the inorganic lamellar compound and are capable of suppressing the ink-absorbing properties from being degraded in the middle of printing due to the inorganic lamellar compound.

Among these, a phosphonium compound, a nitrogen-containing low-molecular-weight compound, and an ammonium group-containing polymer are preferably jointly used as the sensitization agent, and a phosphonium compound, quaternary ammonium salts, and an ammonium group-containing polymer are more preferably jointly used.

Examples of a preferred phosphonium compound include phosphonium compounds described in JP2006-297907A and JP2007-50660A. Specific examples thereof include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, 1,9-bis(triphenylphosphonio)nonane=naphthalene-2,7-disulfonate, and the like.

Examples of the nitrogen-containing low-molecular-weight compound include amine salts and quaternary ammonium salts. In addition, examples thereof include imidazolinium salts, benzo imidazolinium salts, pyridinium salts, and quinolinium salts. Among these, quaternary ammonium salts and pyridinium salts are preferred. Specific examples thereof include tetramethylammonium=hexafluorophosphate, tetrabutylammonium=hexafluorophosphate, dodecyltrimethylammonium=p-toluene sulfonate, benzyltriethylammonium=hexafluorophosphate, benzyldimethyloctylammonium=hexafluorophosphate, benzyldimethyldodecylammonium=hexafluorophosphate, compounds described in Paragraphs 0021 to 0037 of JP2008-284858A and Paragraphs 0030 to 0057 of JP2009-90645A, and the like.

The ammonium group-containing polymer needs to have an ammonium group in the structure, and polymers including 5% by mol to 80% by mol of (meth)acrylate having ammonium groups in side chains as copolymerization components are preferred. Specific examples thereof include polymers described in Paragraphs 0089 to 0105 of JP2009-208458A.

In the ammonium group-containing polymer, the value of the reducing specific viscosity (unit: ml/g) obtained according to the measurement method described in JP2009-208458A is preferably in a range of 5 to 120, more preferably in a range of 10 to 110, and particularly preferably in a range of 15 to 100. In a case in which the reducing specific viscosity is converted to the mass average molecular weight (Mw), the mass average molar mass is preferably in a range of 10,000 to 150,000, more preferably in a range of 17,000 to 140,000, and particularly preferably in a range of 20,000 to 130,000.

Hereinafter, specific examples of the ammonium group-containing polymer will be described.

(1) 2-(Trimethylammonio)ethyl methacrylate=p-toluenesulfonate/3,6-di oxaheptyl methacrylate copolymer (molar ratio: 10/90, Mw: 45,000)

(2) 2-(Trimethylammonio)ethyl methacrylate=hexafluorophosphate/3,6-dioxaheptyl methacrylate copolymer (molar ratio: 20/80, Mw: 60,000)

(3) 2-(Ethyldimethylammonio)ethyl methacrylate=p-toluenesulfonate/hexyl methacrylate copolymer (molar ratio: 30/70, Mw: 45,000)

(4) 2-(Trimethylammonio)ethyl methacrylate=hexafluorophosphate/2-ethylhexyl methacrylate copolymer (molar ratio: 20/80, Mw: 60,000)

(5) 2-(Trimethylammonio)ethyl methacrylate=methylsulfate/hexyl methacrylate copolymer (molar ratio: 40/60, Mw: 70,000)

(6) 2-(Butyldimethylammonio)ethyl methacrylate=hexafluorophosphate/3,6-dioxaheptyl methacrylate copolymer (molar ratio: 25/75, Mw: 65,000)

(7) 2-(Butyldimethylammonio)ethyl acrylate=haxafluorophosphate/3,6-dioxaheptyl methacrylate copolymer (molar ratio: 20/80, Mw: 65,000)

(8) 2-(Butyldimethylammonio)ethyl methacrylate=13-ethyl-5,8,11-trioxa-1-heptadecanesulfonate/3,6-dioxaheptyl methacrylate copolymer (molar ratio: 20/80, Mw: 75,000)

(9) 2-(Butyldimethylammonio)ethyl methacrylate=haxafluorophosphate/3,6-dioxaheptyl methacrylate/2-hydroxy-3-methacryloyloxypropyl methacrylate copolymer (molar ratio: 15/80/5, Mw: 65,000)

The content of the sensitization agent is preferably in a range of 0.01% to 30.0% by mass, more preferably in a range of 0.1% to 15.0% by mass, and still more preferably in a range of 1% to 10% by mass of the total solid content in the image-recording layer.

(Other Components)

Furthermore, to the image-recording layer, as other components, it is possible to add a surfactant, a polymerization inhibitor, higher fatty acid derivatives, a plasticizer, inorganic particles, inorganic lamellar compounds, and the like. Specifically, it is possible to refer to the description in Paragraphs 0114 to 0159 of JP2008-284817A.

<Formation of Image-Recording Layer>

The image-recording layer in the lithographic printing plate precursor according to the present invention is formed by, for example, as described in Paragraphs 0142 and 0143 of JP2008-195018A, dispersing or dissolving the necessary components described above in a well-known solvent so as to prepare a coating fluid, applying the coating fluid onto a support using a well-known method such as bar coating, and drying the coating fluid. The coating amount (solid content) of the image-recording layer after application and drying varies depending on applications; however, generally, is preferably in a range of 0.3 to 3.0 g/m$^2$. Within this range, a favorable sensitivity and favorable membrane characteristics of the image-recording layer can be obtained.

[Undercoat Layer]

The lithographic printing plate precursor according to the present invention preferably has an undercoat layer (in some cases, referred to as the interlayer) between the image-recording layer and the support. The undercoat layer strengthens adhesiveness between the support and the image-recording layer in exposed portions and facilitates peeling the support and the image-recording layer in non-exposed portions, and thus the undercoat layer contributes to improving developability without impairing printing resistance. In addition, in the case of exposure using infrared lasers, the undercoat layer functions as an adiabatic layer and thus has an effect of preventing the sensitivity from being degraded due to the diffusion of heat generated by exposure in the support.

Examples of compounds that can be used for the undercoat layer include polymers having adsorbent groups that can be adsorbed to the surface of the support and hydrophilic groups. In order to improve adhesiveness to the image-recording layer, polymers having adsorbent groups and hydrophilic groups and further having crosslinking groups are preferred. The compounds that can be used for the undercoat layer may be low-molecular-weight compounds or polymers. The compounds that can be used for the undercoat layer may be used in a mixed form of two or more kinds as necessary.

In a case in which the compounds that are used for the undercoat layer are polymers, copolymers of monomers having adsorbent groups, monomers having hydrophilic groups, and monomers having crosslinking groups are preferred.

The adsorbent groups that can be adsorbed to the surface of the support are preferably phenolic hydroxy groups, carboxy groups, —PO$_3$H$_2$, —OPO$_3$H$_2$, —CONHSO$_2$—, —SO$_2$NHSO$_2$—, —COCH$_2$COCH$_3$. The hydrophilic groups are preferably sulfo groups or salts thereof and salts of carboxy groups. The crosslinking groups are preferably acrylic groups, methacryl groups, acrylamide groups, methacrylamide groups, allyl groups, and the like.

The polymers may have crosslinking groups introduced due to the formation of salts between polar substituents of the polymers and compounds having substituents having opposite charges of the above-described polar substituents and ethylenically unsaturated bonds and may be further copolymerized with monomers other than the above-described monomers, preferably, hydrophilic monomers.

Specifically, preferred examples thereof include silane coupling agents having ethylenic double bond reactive groups that are capable of addition polymerization described in JP1998-282679A (JP-H10-282679A) and phosphorus compounds having ethylenic double bond reactive groups described in JP1990-304441A (JP-H02-304441A). Low-molecular-weight or high-molecular-weight compounds having crosslinking groups (preferably ethylenically unsaturated bond groups), functional groups that interact with the surface of the support, and hydrophilic groups described in JP2005-238816A, JP2005-125749A, JP2006-239867A, and JP2006-215263A are also preferably used.

More preferred examples thereof include high-molecular-weight polymers having adsorbent groups that can be adsorbed to the surface of the support, hydrophilic groups, and crosslinking groups described in JP2005-125749A and JP2006-188038A.

The content of ethylenically unsaturated bonds in the polymer that is used in the undercoat layer is preferably in a range of 0.1 to 10.0 mmol and more preferably in a range of 0.2 to 5.5 mmol per gram of the polymer.

The mass average molecular weight (Mw) of the polymer that is used in the undercoat layer is preferably 5,000 or higher and more preferably in a range of 10,000 to 300,000.

In addition to the above-described compounds for the undercoat layer, the undercoat layer may also include a chelating agent, secondary or tertiary amines, a polymerization inhibitor, compounds having amino groups or functional groups having a polymerization-inhibiting function and groups that interact with the surfaces of supports (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylenediamine diacetic acid, hydroxyethyl iminodiacetic acid, and the like), and the like in order to prevent contamination over time.

The undercoat layer is formed using well-known coating methods. The coating amount (solid content) of the undercoat layer is preferably in a range of 0.1 to 100 mg/m$^2$ and more preferably in a range of 1 to 30 mg/m$^2$.

<Protective Layer>

The lithographic printing plate precursor according to the present invention preferably has a protective layer (in some cases, also referred to as the overcoat layer) on the image-recording layer. The protective layer has a function of suppressing image formation-inhibiting reactions caused by the shielding of oxygen and additionally has a function of preventing the generation of damage in the image-recording layer and abrasion prevention during exposure using high-luminance lasers.

Protective layers having the above-described characteristics are described in, for example, the specification of U.S. Pat. No. 3,458,311A and JP1980-49729B (JP-S55-49729B). As poor oxygen-transmissible polymers that can be used for the protective layer, it is possible to appropriately select and use any one of water-soluble polymers and water-insoluble polymers, and, if necessary, it is also possible to use two or more polymers in a mixed form. Specific examples thereof include polyvinyl alcohols, modified polyvinyl alcohols, polyvinyl pyrrolidone, water-soluble cellulose derivatives, poly(meth)acrylonitrile, and the like.

As the modified polyvinyl alcohols, acid-modified polyvinyl alcohols having carboxy groups or sulfo groups are preferably used. Specific examples thereof include modified-polyvinyl alcohols described in JP2005-250216A and JP2006-259137A.

The protective layer preferably includes inorganic lamellar compounds in order to enhance oxygen-shielding properties. The inorganic lamellar compounds refer to particles having thin flat plate shapes, and examples thereof include mica groups such as natural mica and synthetic mica, talc represented by Formula 3MgO.4SiO.H$_2$O, taeniolite, montmorillonite, saponite, hectorite, zirconium phosphate, and the like.

The inorganic lamellar compounds that can be preferably used are mica compounds. Examples of mica compounds include mica groups such as natural mica and synthetic mica represented by Formula: A(B, C)$_{2-5}$D$_4$O$_{10}$(OH, F, O)$_2$ [here, A is any one of K, Na, and Ca, B and C are any of Fe (II), Fe (III), Mn, Al, Mg, and V, and D is Si or Al.].

In the mica groups, examples of natural mica include white mica, soda mica, gold mica, black mica, and lepidolite. Examples of synthetic mica include non-swelling mica such as fluorphlogopite KMg$_3$(AlSi$_3$O$_{10}$)F$_2$, potassium tetrasilic mica KMg$_{2.5}$(Si$_4$O$_{10}$)F$_2$, and, Na tetrasilylic mica NaMg$_{2.5}$(Si$_4$O$_{10}$)F$_2$, swelling mica such as Na or Li taeniolite (Na, Li)Mg$_2$Li(Si$_4$O$_{10}$)F$_2$, montmorillonite-based Na or Li hectorite (Na, Li)$_{1/8}$Mg$_{2/5}$Li$_{1/8}$(Si$_4$O$_{10}$)F$_2$, and the like. Furthermore, synthetic smectite is also useful.

In the present invention, among the above-described mica compounds, fluorine-based swelling mica is particularly useful. That is, swelling synthetic mica has a laminate structure consisting of unit crystal lattice layers having a thickness in a range of approximately 10 angstroms to 15 angstroms, and metal atoms in lattices are more actively substituted than in any other clay minerals. As a result, positive charges are deficient in the lattice layers, and positive ions such as Li$^+$, Na$^+$, Ca$^{2+}$, and Mg$^{2+}$ are adsorbed between the layers in order to compensate for the deficiency. Positive ions interposed between the layers are referred to as exchangeable positive ions and are exchangeable with various positive ions. Particularly, in a case in which the positive ions between the layers are Li$^+$ and Na$^+$, the ionic radii are small, and thus the bonds between lamellar crystal lattices are weak, and mica is significantly swollen by water. In a case in which shear is applied in this state, mica easily cleavages and forms a stable sol in water. The above-described tendency of swelling synthetic mica is strong, and the swelling synthetic mica is particularly preferably used.

From the viewpoint of diffusion control, regarding the shapes of the mica compounds, the thickness is preferably thin, and the planar size is preferably large as long as the smoothness and active light ray-transmitting properties of coated surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from projection views obtained from the microphotograph of the particle. As the aspect ratio increases, the obtained effect becomes stronger.

Regarding the particle diameters of the mica compound, the average long diameter thereof is preferably in a range of 0.3 to 20 μm, more preferably in a range of 0.5 to 10 μm, and particularly preferably in a range of 1 to 5 μm. The average thickness of the particles is preferably 0.1 μm or smaller, more preferably 0.05 μm or smaller, and particularly preferably 0.01 μm or smaller. Specifically, for example, in the case of swelling synthetic mica which is a typical compound, a preferred aspect has a thickness in a range of approximately 1 to 50 nm and a surface size (long diameter) in a range of approximately 1 to 20 μm.

The content of the inorganic lamellar compound is preferably in a range of 0% to 60% by mass and more preferably in a range of 3% to 50% by mass of the total solid content of the protective layer. Even in a case in which multiple kinds of inorganic lamellar compounds are jointly used, the total amount of the inorganic lamellar compounds is preferably the above-described content. Within the above-described range, the oxygen-shielding properties improve, and a favorable sensitivity can be obtained. In addition, the degradation of the ink-absorbing properties can be prevented.

The protective layer may include well-known additives such as a plasticizer for imparting flexibility, a surfactant for improving coating properties, and inorganic fine particles for controlling sliding properties on the surface. In addition, the sensitization agent described in the section of the image-recording layer may be added to the protective layer.

The protective layer is formed using a well-known coating method. The coating amount of the protective layer (solid content) is preferably in a range of 0.01 to 10 g/m$^2$, more preferably in a range of 0.02 to 3 g/m$^2$, and particularly preferably in a range of 0.02 to 1 g/m$^2$.

<Support>

A support in the lithographic printing plate precursor according to the present invention can be appropriately selected from well-known supports for a lithographic printing plate precursor and used. Examples thereof include well-known supports for lithographic printing plate precursors. The support is preferably an aluminum plate which has been roughened using a well-known method and anode-oxidized.

On the aluminum plate, as necessary, enlargement processes or sealing processes of micropores in anode oxide films described in JP2001-253181A and JP2001-322365A, surface hydrophilization processes using alkali metal silicate as described in the specifications of U.S. Pat. Nos. 2,714,066A, 3,181,461A, 3,280,734A, and 3,902,734A, and surface hydrophilization processes using polyvinyl phosphate or the like as described in the specifications of U.S. Pat. Nos. 3,276,868A, 4,153,461A, and 4,689,272A may be appropriately selected and carried out.

In the support, the center line average roughness is preferably in a range of 0.10 to 1.2 μm.

The support may have, as necessary, a backcoat layer including an organic polymer compound described in JP1993-45885A (JP-H05-45885A) or an alkoxy compound of silicon described in JP1994-35174A (JP-H06-35174A) on the surface opposite to the image-recording layer.

[Method for Producing Lithographic Printing Plate]

A method for producing a lithographic printing plate according to the present invention preferably includes a step of exposing the lithographic printing plate precursor according to the present invention in an image pattern (exposure step), and a step of removing a non-exposed portion in the image-recording layer using at least one of printing ink or dampening water in the lithographic printing plate precursor that has been exposed in an image pattern on a printer (on-machine development step).

<Exposure Step>

Exposure in an image pattern is preferably carried out using a method in which digital data are scanned and exposed using an infrared laser or the like.

The wavelength of the exposure light source is preferably in a range of 750 nm to 1,400 nm. The light source having a wavelength in a range of 750 nm to 1,400 nm is preferably a solid-state laser or a semiconductor laser that radiates infrared rays. The exposure mechanism may be any one of in-plane drum methods, external surface drum methods, flat head methods, and the like.

The exposure step can be carried out using platesetters or the like and well-known methods. In addition, exposure may be carried out on a printer using a printer including an exposure device after the lithographic printing plate precursor is mounted on the printer.

<On-Machine Development Step>

In the on-machine development step, in a case in which printing is initiated by supplying printing ink and dampening water on the printer without carrying out any development processes on the lithographic printing plate precursor that has been exposed in an image pattern, non-exposed portions on the lithographic printing plate precursor are removed at the initial stage of printing, and accordingly, the hydrophilic surface of the support is exposed, and non-image areas are formed. As the printing ink and the dampening water, well-known printing ink and dampening water for lithographic printing are used. Any of printing ink and dampening water may be first supplied to the surface of the lithographic printing plate precursor, but it is preferable to first supply printing ink from the viewpoint of preventing contamination by the components of the image-recording layer from which dampening water is removed.

In the above-described manner, the lithographic printing plate precursor is on-machine-developed on an off-set printer and is used as it is for printing a number of pieces of paper.

The method for producing a lithographic printing plate according to the present invention may also include other well-known steps in addition to the above-described steps.

Examples of other steps include a plate-inspecting step of checking a position, a direction, or the like of a lithographic printing plate precursor before each step, or a checking step of checking a printed image after an on-machine development step.

The lithographic printing plate precursor according to the present invention can be used to produce lithographic printing plates by means of a development process in which a development fluid is used by appropriately selecting the binder polymer and the like which are the constituent components of the image-recording layer. Examples of the development process in which a development fluid is used include an aspect in which a development fluid having a high pH of 14 or less which includes an alkaline agent is used (also referred to as alkali development) and an aspect in which a development fluid having a pH of approximately 2 to 11 which contains a surfactant and/or a water-soluble polymer compound is used (also referred to as simple development). The alkali development and the simple development can be carried out using a well-known method.

[Color Developing Compound]

A color developing compound according to the present invention is a compound represented by Formula (1).

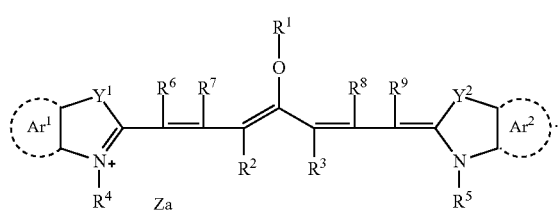

In Formula (1), $R^1$ represents a group in which an $R^1$—O bond is cleaved by heat or exposure to infrared rays. $R^2$ and $R^3$ each independently represent a hydrogen atom or an alkyl group or $R^2$ and $R^3$ may be linked to each other to form a ring. $Ar^1$ and $Ar^2$ each independently represent a group forming a benzene ring or a naphthalene ring. $Y^1$ and $Y^2$ each independently represent an oxygen atom, a sulfur atom, —$NR^0$—, or a dialkyl methylene group. $R^4$ and $R^5$ each independently represent an alkyl group or a group represented by one of Formulae (2) to (4). $R^6$ to $R^9$ each independently represent a hydrogen atom or an alkyl group. $R^0$ represents a hydrogen atom, an alkyl group, or an aryl group. Za represents a counter ion for neutralizing a charge. Here, the compound represented by Formula (1) has at least one of groups represented by Formulae (2) to (4) as $R^4$ or $R^5$ or in $R^1$, $Ar^1$, or $Ar^2$.

$$—R^{13}—PO_3M_2 \quad (4)$$

In Formulae (2) to (4), $R^{10}$ represents an alkylene group having 2 to 6 carbon atoms. W represents a single bond or an oxygen atom. n1 represents an integer of 1 to 45. $R^{11}$ represents an alkyl group having 1 to 12 carbon atoms or —C(=O)—$R^{14}$. $R^{14}$ represents an alkyl group having 1 to 12 carbon atoms. $R^{12}$ and $R^{13}$ each independently represent a single bond or an alkylene group having 1 to 12 carbon atoms. M represents a hydrogen atom, a Na atom, a K atom, or an onium group.

The compound represented by Formula (1) is a new compound and has excellent color developability. The compound represented by Formula (1) can be preferably used as a color developing composition as described above.

EXAMPLES

Hereinafter, the present invention will be described in detail using examples, but the present invention is not limited thereto. Meanwhile, for polymer compounds, unless particularly otherwise described, the molecular weight refers to the mass average molecular weight (Mw) converted to a polystyrene equivalent value by the gel permeation chromatography (GPC) method, and the ratio of a repeating unit refers to the molar percentage. In addition, "parts" and "%" indicate "parts by mass" and "% by mass" unless particularly otherwise described.

Synthesis examples of compounds A according to the present invention will be described below. Other compounds A can also be synthesized in the same manner by appropriately changing a raw material or a reaction intermediate.

Synthesis Example 1

Syntheses of Compounds A-19 and A-1

(Synthesis of Intermediate SM-3)

The synthesis scheme of an intermediate SM-3 will be illustrated below.

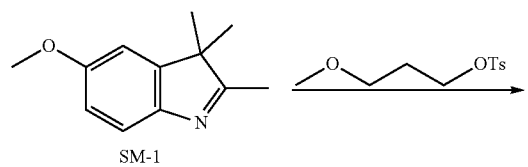

-continued

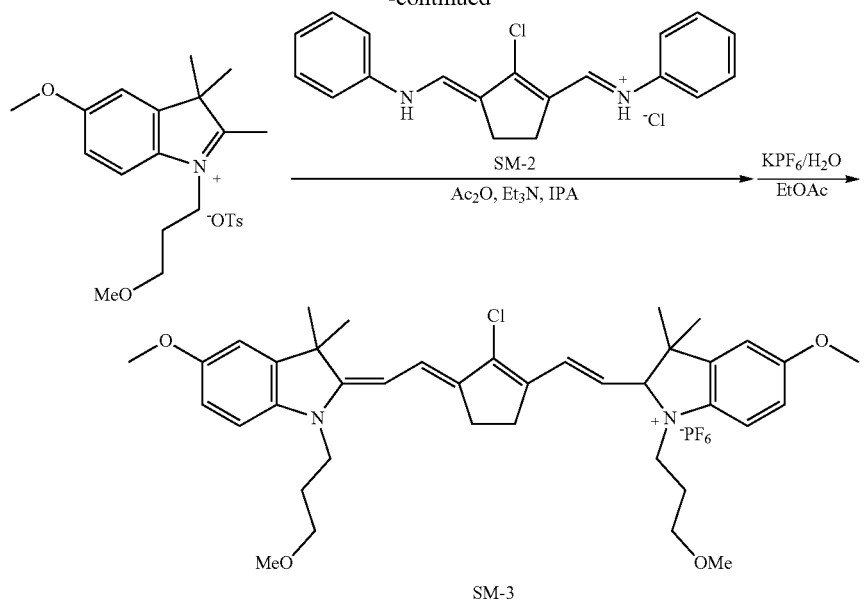

5-Methoxy-2,3,3-trimethyl indolenine (SM-1) (manufactured by Inui Corporation) (147.9 g, 0.782 mol) and 3-methoxypropyl tosylate (229.1 g, 0.938 mol) were added to a 3 L three-neck flask and stirred at 130° C. for two hours. The reaction liquid was cooled to 80° C., then, isopropanol (1,147 g) was added thereto, and the components were stirred at 20° C. Furthermore, SM-2 (105.8 g, 0.307 mol) and an acetic anhydride (68.8 g, 0.674 mol) were added thereto, and the reaction liquid was stirred while being cooled to 5° C. Triethylamine (170.6 g, 1.69 mol) was added dropwise thereto so as to prevent the inner temperature from exceeding 10° C., and the components were stirred at 20° C. for three hours. Separately, distilled water (1,771 g), potassium hexafluorophosphate (93.1 g, 0.506 mol), and ethyl acetate (482 g) were added to a 10 L stainless steel beaker, the reaction liquid in the 3 L three-neck flask was added dropwise thereto under stirring, the components were stirred for 30 minutes after the end of the dropwise addition, then, the stirring was stopped, and the components were left to stand. The obtained precipitates were collected by means of filtration and washed with distilled water (500 mL) four times and isopropanol (300 mL) three times. The obtained solid was dried at a reduced pressure, thereby obtaining an intermediate SM-3 (222 g, 0.281 mol).

(Synthesis of Intermediate SM-4)

The synthesis scheme of an intermediate SM-4 will be illustrated below.

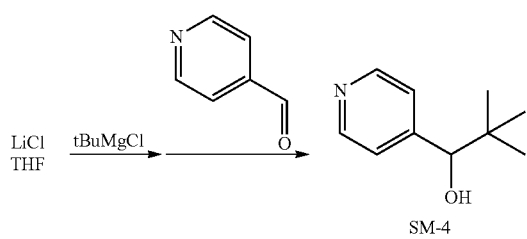

Lithium chloride (42.4 g, 1.00 mol) and tetrahydrofuran (THF) (647 g) were added to a 3 L three-neck flask and cooled to −10° C. in a nitrogen atmosphere. tert-Butylmagnesium chloride (2 M, THF solution) (500 mL, 1.00 mol) was added dropwise thereto so as to prevent the inner temperature from exceeding −5° C., and then the components were stirred at −10° C. for 30 minutes. A THF (79.3 g) solution of 4-pyridinecarboxyaldehyde (79.3 g, 0.74 mol) was added dropwise thereto so as to prevent the inner temperature from exceeding −5° C., and the components were stirred at 0° C. or lower for two hours. Distilled water (72 g) was added dropwise thereto so as to prevent the inner temperature from exceeding 25° C., a 2 M aqueous solution of hydrochloric acid (531 g) was added thereto, and the components were stirred for 30 minutes. Ethyl acetate (200 g) was added thereto, the reaction liquid was moved to a separating funnel, and then a water layer was removed. An organic layer was washed with saturated salt water (200 mL), and then the solvent was distilled away at a reduced pressure. Ethyl acetate (35 g) was added to the obtained solid, the solid was dissolved by heating and stirring the solid at 60° C., then, cooled to 0° C., and left to stand for five hours. The obtained crystals were collected by means of filtration, washed with toluene (100 mL) twice, and dried at a reduced pressure, thereby obtaining an intermediate SM-4 (37 g, 0.22 mol).

(Synthesis of Intermediate SM-5)

The synthesis scheme of an intermediate SM-5 will be illustrated below.

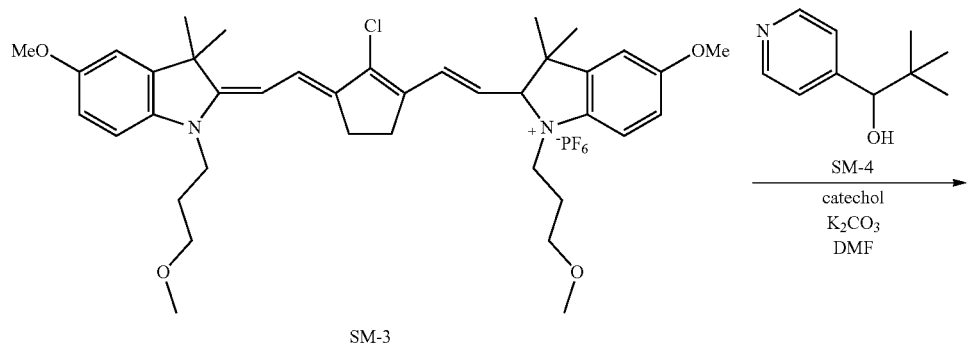

SM-3

SM-4

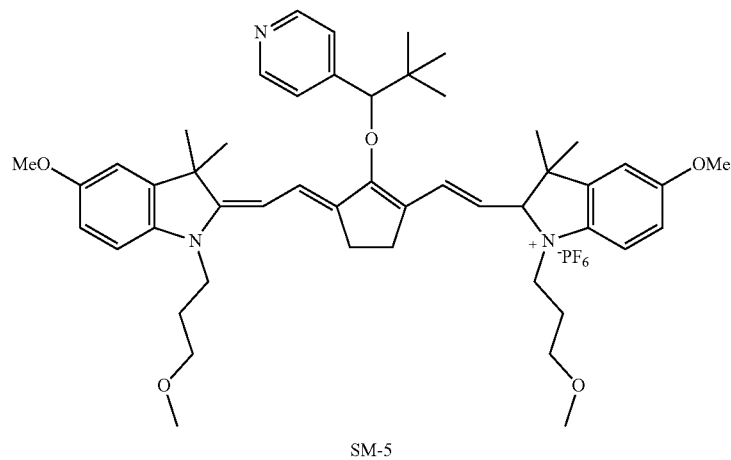

SM-5

SM-3 (116.7 g, 0.147 mol), SM-4 (26.8 g, 0.162 mol), catechol (8.12 g, 0.07 mol), potassium carbonate (21.4 g, 0.155 mol), and N,N-dimethylformamide (462 g) were added to a 1 L eggplant-type flask and stirred at 25° C. for 24 hours, and acetone (233 mL) was added thereto. Separately, distilled water (5.8 kg) was added to a 10 L stainless steel beaker, and the reaction liquid was added dropwise thereto under stirring. The obtained precipitates were collected by means of filtration, washed with distilled water (500 mL) four times, and dried by blowing the air, thereby obtaining an intermediate SM-5 (122 g, 0.133 mol).

(Syntheses of Compounds A-19 and A-1)

The synthesis schemes of compounds A-19 and A-1 will be illustrated below.

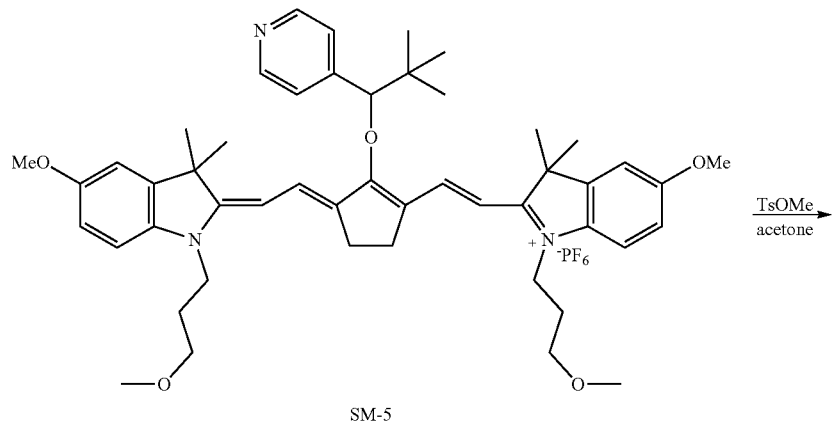

SM-5

-continued

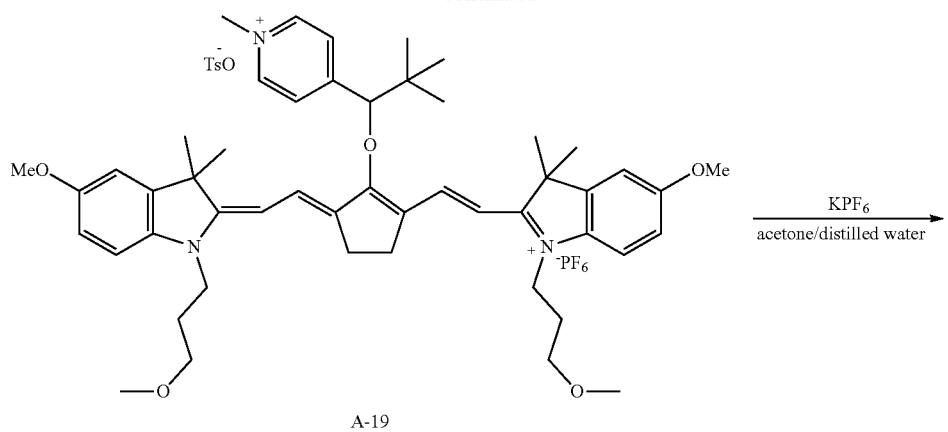

A-19

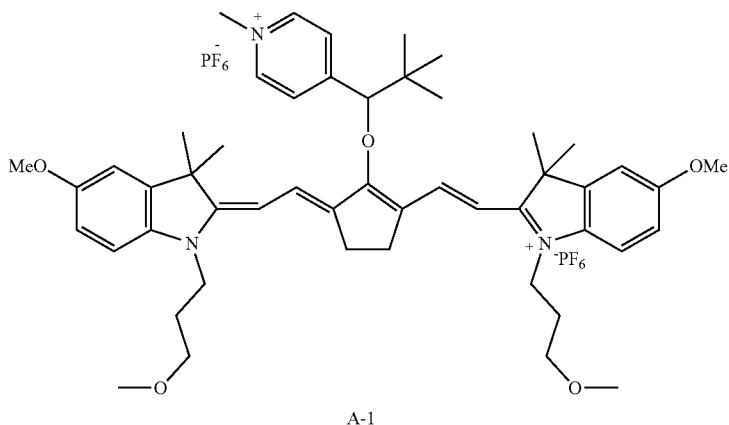

A-1

SM-5 (26.0 g, 28.3 mmol), methyl para-tolouenesulfonate (26.3 g, 141.3 mmol), and acetone (26.0 g) were added to a 300 mL eggplant-type flask and stirred at 25° C. for 24 hours. Acetone (52.0 g) was added thereto, and the reaction liquid was cooled to 0° C. under stirring and held for two hours. The obtained crystals were collected by means of filtration, washed with a liquid (500 mL) obtained by mixing hexane and ethyl acetate in a volume ratio of 2/1, and then dried by blowing the air, thereby obtaining a compound A-19 (22.5 g, 20.4 mmol). The structure of the obtained compound A-19 was identified by means of NMR. The identification result is described below.

$^1$H-NMR (400 MHz, heavy dimethyl sulfoxide) δ=1.10 (s, 9H), 1.23 (s, 6H), 1.59 (s, 6H), 1.88-1.98 (m, 4H), 2.28 (s, 3H), 2.65-2.86 (m, 4H), 3.20 (s, 6H), 3.28-3.38 (m, 4H), 3.80 (s, 6H), 4.11 (t, 4H), 4.48 (s, 3H), 5.81 (s, 1H), 5.86 (d, 2H), 6.96 (dd, 2H) 7.10 (d, 2H), 7.21 (d, 2H), 7.25 (d, 2H), 7.42 (d, 2H), 7.48 (d, 2H), 8.30 (d, 2H), 9.15 (d, 2H)

Next, the compound A-19 (22.5 g, 20.4 mmol), acetone (67.5 g), potassium hexafluorophosphoate (15.0 g, 81.6 mmol), and distilled water (22.5 g) were added to a 500 mL eggplant-type flask, and distilled water (225 g) was added dropwise thereto while stirring the components at room temperature. The obtained precipitates were collected by means of filtration, washed with distilled water (1 L), and dried at a reduced pressure, thereby obtaining a compound A-1 (21.4 g, 19.8 mmol). The structure of the obtained compound A-1 was identified by means of NMR. The identification result is described below.

$^1$H-NMR (400 MHz, heavy dimethyl sulfoxide) δ=1.10 (s, 9H), 1.23 (s, 6H), 1.58 (s, 6H), 1.93 (m, 4H), 2.64-2.86 (m, 4H), 3.20 (s, 6H), 3.30-3.46 (m, 4H), 3.80 (s, 6H), 4.11 (t, 4H), 4.47 (s, 3H), 5.78-5.89 (m, 3H), 6.97 (dd, 2H) 7.20 (d, 2H), 7.25 (d, 2H), 7.41 (d, 2H), 8.30 (d, 2H), 9.12 (d, 2H)

Synthesis Example 2

Syntheses of Compounds A-55 and A-7

The synthesis schemes of compounds A-55 and A-7 will be illustrated below.

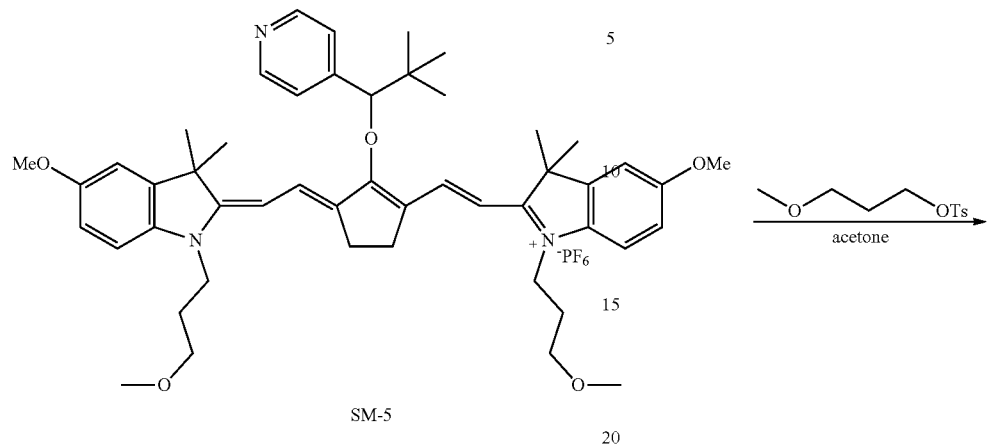
SM-5
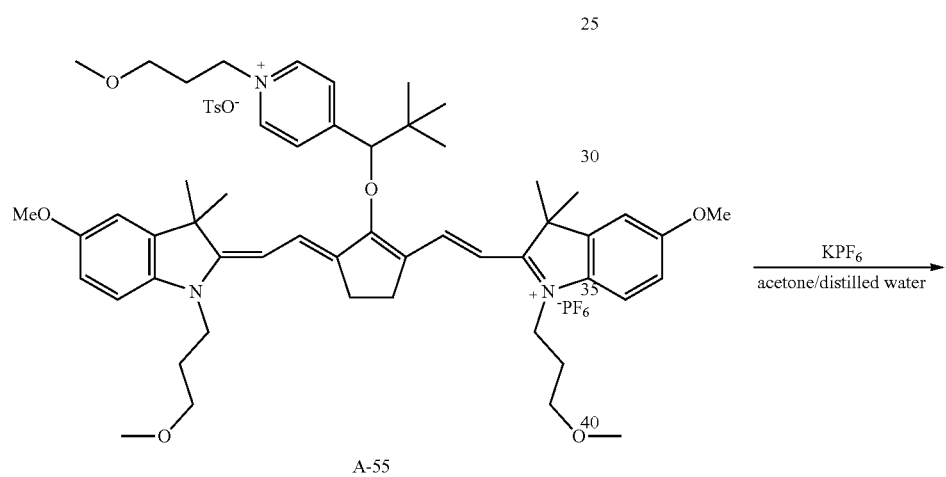
A-55
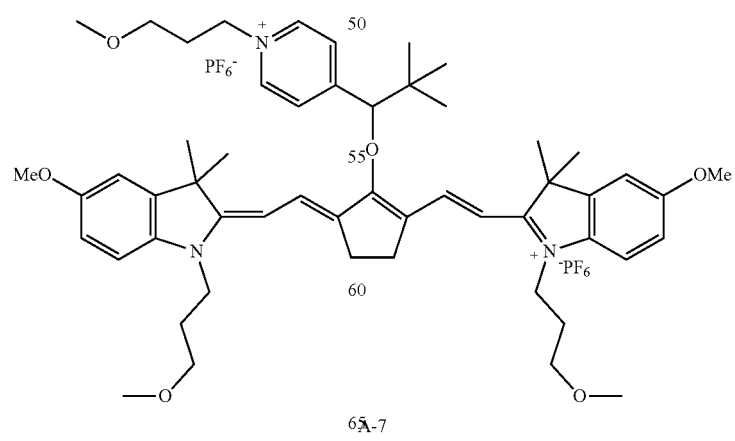
A-7

The intermediate SM-5 (3.0 g, 3.26 mmol) and 3-methoxypropyl tosylate (15.0 g, 61.4 mmol) were added to a 100 mL eggplant-type flask and stirred at 70° C. for six hours. Acetone (15 mL) was added to the reaction liquid, and the reaction liquid was added dropwise to a liquid (1 L) obtained by mixing hexane and ethyl acetate in a volume ratio of 2/1. The supernatant was removed, and the obtained precipitates were washed with a liquid mixture (100 mL) of hexane and ethyl acetate (the volume ratio: 2/1) three times and dissolved in acetone (30 mL). This solution was added dropwise to a liquid mixture (1 L) of hexane and ethyl acetate (the volume ratio: 2/1). The supernatant was removed, and the obtained precipitates were washed with a liquid mixture (100 mL) of hexane and ethyl acetate (the volume ratio: 2/1) three times and dried at a reduced pressure, thereby obtaining a compound A-55 (3.20 g, 2.75 mmol). The structure of the obtained compound A-55 was identified by means of NMR. The identification result is described below.

$^1$H-NMR (400 MHz, heavy dimethyl sulfoxide) δ=1.10 (s, 9H), 1.23 (s, 6H), 1.61 (s, 6H), 1.87-1.97 (m, 4H), 2.20-2.33 (m, 5H), 2.65-2.86 (m, 4H), 3.14-3.23 (m, 9H), 3.27-3.38 (m, 4H), 3.41-3.50 (m, 2H), 3.79 (s, 6H), 4.11 (t, 4H), 4.71-4.90 (m, 2H), 5.83 (S, 1H), 5.86 (d, 2H), 6.96 (dd, 2H), 7.11 (d, 2H), 7.20 (d, 2H), 7.25 (d, 2H), 7.42 (d, 2H), 7.48 (d, 2H), 8.31 (d, 2H), 9.25 (d, 2H).

Next, the compound A-55 (3.20 g, 2.75 mmol), acetone (10 g), potassium hexafluorophosphate (2.02 g, 11.0 mmol), and distilled water (3.0 g) were added to a 200 mL eggplant-type flask, and distilled water (45 g) was added dropwise thereto while stirring the components at room temperature. The obtained precipitates were collected by means of filtration, washed with distilled water (500 mL), and dried at a reduced pressure, thereby obtaining a compound A-7 (3.05 g, 2.68 mmol). The structure of the obtained compound A-7 was identified by means of NMR. The identification result is described below.

$^1$H-NMR (400 MHz, heavy dimethyl sulfoxide) δ=1.10 (s, 9H), 1.23 (s, 6H), 1.60 (s, 6H), 1.88-1.97 (m, 4H), 2.18-2.34 (m, 2H), 2.68-2.87 (m, 4H), 3.19 (s, 6H), 3.20 (s, 3H), 3.28-3.37 (m, 4H), 3.42-3.52 (m, 2H), 3.80 (s, 6H), 4.11 (t, 4H), 4.70-4.88 (m, 2H), 5.82 (s, 1H), 5.86 (d, 2H), 6.97 (dd, 2H), 7.18 (d, 2H), 7.25 (d, 2H), 7.43 (d, 2H), 8.31 (d, 2H), 9.21 (d, 2H)

Synthesis Example 3

Syntheses of Compounds A-56 and A-16

(Synthesis of Intermediate SM-6)
The synthesis scheme of an intermediate SM-6 will be illustrated below.

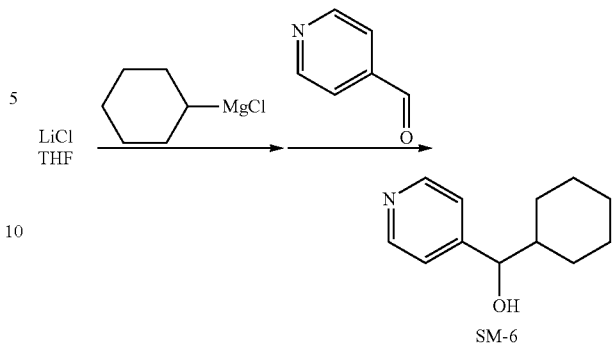

Lithium chloride (30.5 g, 0.72 mol) and THF (157.4 g) were added to a 3 L three-neck flask and cooled to −10° C. in a nitrogen atmosphere. Cyclohexylmagnesium chloride (1 M, THF solution) (724 mL, 0.72 mol) was added dropwise thereto so as to prevent the inner temperature from exceeding −5° C., and then the components were stirred at −10° C. for 30 minutes. A THF (33.1 g) solution of 4-pyridinecarboxyaldehyde (57.1 g, 0.53 mol) was added dropwise thereto so as to prevent the inner temperature from exceeding −5° C., and the components were stirred at 0° C. or lower for two hours. Distilled water (90 g) was added dropwise thereto so as to prevent the inner temperature from exceeding 25° C., a 2 M aqueous solution of hydrochloric acid (674 g) was added thereto, and the components were stirred for 30 minutes. Ethyl acetate (675 g) was added thereto, the reaction liquid was moved to a separating funnel, and then a water layer was removed. An organic layer was washed with saturated salt water (200 mL), and then the solvent was distilled away at a reduced pressure. A liquid mixture (500 mL) of hexane and ethyl acetate (the volume ratio: 2/1) was added to the obtained solid, the solid was dissolved by heating and stirring the solid at 60° C., then, cooled to 0° C., and left to stand for five hours. The obtained crystals were collected by means of filtration, washed with toluene (50 mL) twice, and dried at a reduced pressure, thereby obtaining an intermediate SM-6 (51 g, 0.27 mol).

(Synthesis of Intermediate SM-7)
The synthesis scheme of an intermediate SM-7 will be illustrated below.

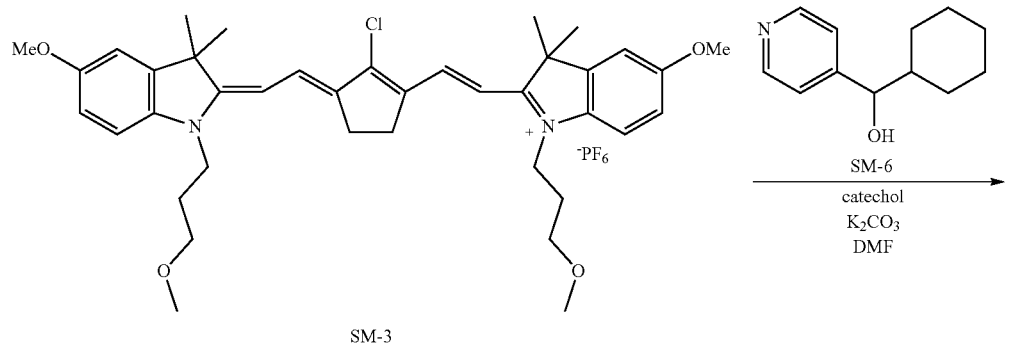

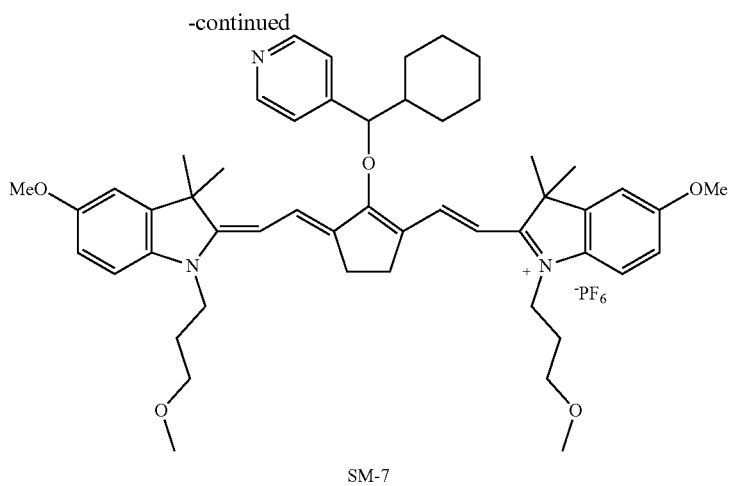

SM-7

SM-3 (60.0 g, 75.8 mmol), SM-6 (36.3 g, 189.6 mmol), catechol (4.17 g, 37.9 mmol), potassium carbonate (10.5 g, 75.8 mmol), and N,N-dimethylformamide (300 g) were added to a 1 L eggplant-type flask and stirred at 25° C. for 24 hours. Separately, distilled water (3.6 kg) was added to a 5 L stainless steel beaker, and the reaction liquid was added dropwise thereto under stirring. The obtained precipitates were collected by means of filtration, washed with distilled water (250 mL) four times, and dried by blowing the air, thereby obtaining an intermediate SM-7 (63 g, 66.6 mmol).

(Syntheses of Compounds A-56 and A-16)

The synthesis schemes of compounds A-56 and A-16 will be illustrated below.

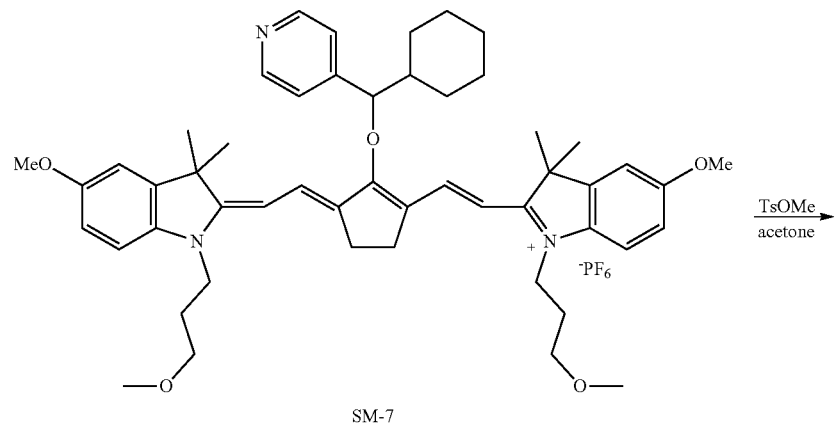

SM-7

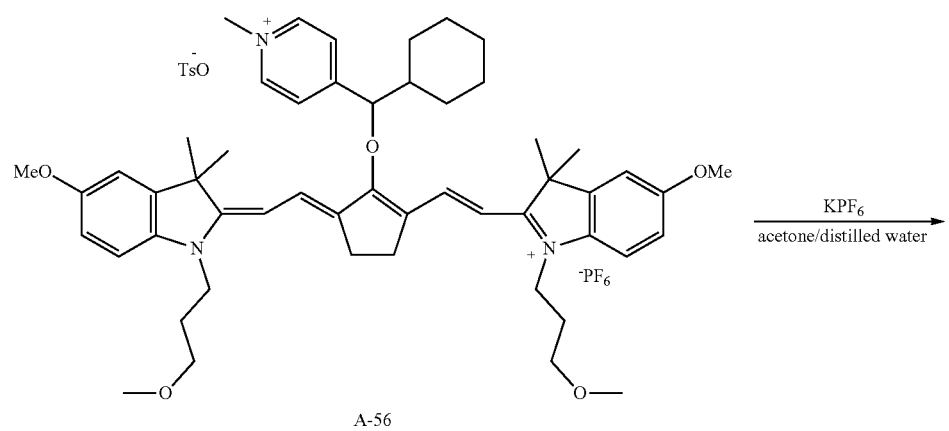

A-56

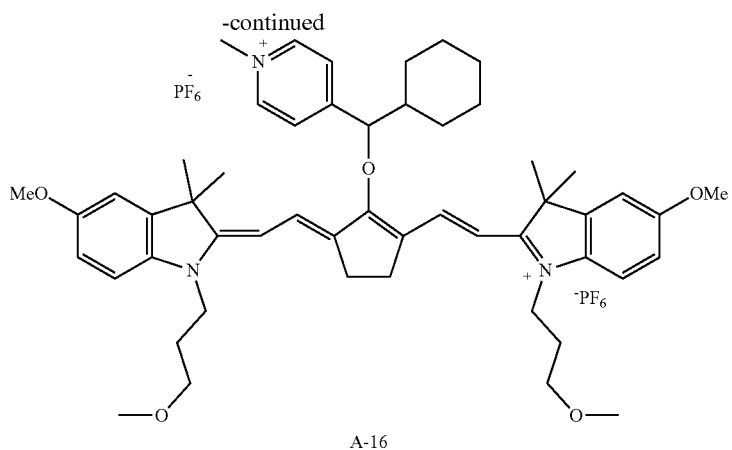

A-16

SM-7 (26.0 g, 27.5 mmol), methyl para-tolouenesulfonate (25.6 g, 137.4 mmol), and acetone (26.0 g) were added to a 300 mL eggplant-type flask and stirred at 25° C. for 24 hours. Acetone (52 g) was added to the reaction liquid, and the reaction liquid was added dropwise to a liquid (3 L) obtained by mixing hexane and ethyl acetate in a volume ratio of 2/1. The supernatant was removed, and the obtained precipitates were washed with a liquid mixture (200 mL) of hexane and ethyl acetate (the volume ratio: 2/1) three times and dissolved in acetone (75 mL). This solution was added dropwise to a liquid mixture (3 L) of hexane and ethyl acetate (the volume ratio: 2/1). The supernatant was removed, and the obtained precipitates were washed with a liquid mixture (200 mL) of hexane and ethyl acetate (the volume ratio: 2/1) three times and dried at a reduced pressure, thereby obtaining a compound A-56 (27.1 g, 23.9 mmol). The structure of the obtained compound A-56 was identified by means of NMR. The identification result is described below.

$^1$H-NMR (400 MHz, heavy dimethyl sulfoxide) δ=1.09-1.35 (m, 12H), 1.49 (s, 6H), 1.64-1.82 (m, 4H), 1.86-1.97 (m, 4H), 2.08-2.16 (m, 1H), 2.29 (s, 3H), 2.69-2.86 (m, 4H), 3.19 (s, 6H), 3.31-3.43 (m, 4H), 3.80 (s, 6H), 4.11 (t, 4H), 4.45 (s, 3H), 5.86 (d, 2H), 5.91 (s, 1H), 6.96 (dd, 2H), 7.11 (dd, 2H), 7.21 (dd, 2H), 7.25 (d, 2H), 7.39 (d, 2H), 7.47 (d, 2H), 8.34 (d, 2H), 9.11 (d, 2H)

Next, the compound A-56 (27.1 g, 23.9 mmol), acetone (78 g), potassium hexafluorophosphoate (17.6 g, 95.6 mmol), and distilled water (26 g) were added to a 1 L eggplant-type flask, and distilled water (260 g) was added dropwise thereto while stirring the components at room temperature. The obtained precipitates were collected by means of filtration, washed with distilled water (2 L), and dried at a reduced pressure, thereby obtaining a compound A-16 (25.4 g, 23.0 mmol). The structure of the obtained compound A-16 was identified by means of NMR. The identification result is described below.

$^1$H-NMR (400 MHz, heavy dimethyl sulfoxide) δ=1.08-1.38 (m, 12H), 1.48 (s, 6H), 1.65-1.83 (m, 4H), 1.86-1.98 (m, 4H), 2.09-2.17 (m, 1H), 2.69-2.86 (m, 4H), 3.20 (s, 6H), 3.26-3.43 (m, 4H), 3.80 (s, 6H), 4.10 (t, 4H), 4.45 (s, 3H), 5.85 (d, 2H), 5.91 (d, 1H), 6.96 (dd, 2H), 7.20 (d, 2H), 7.24 (d, 2H), 7.39 (d, 2H), 8.34 (d, 2H), 9.11 (d, 2H)

Synthesis Example 4

Synthesis of Compound A-22

The synthesis scheme of a compound A-22 will be illustrated below.

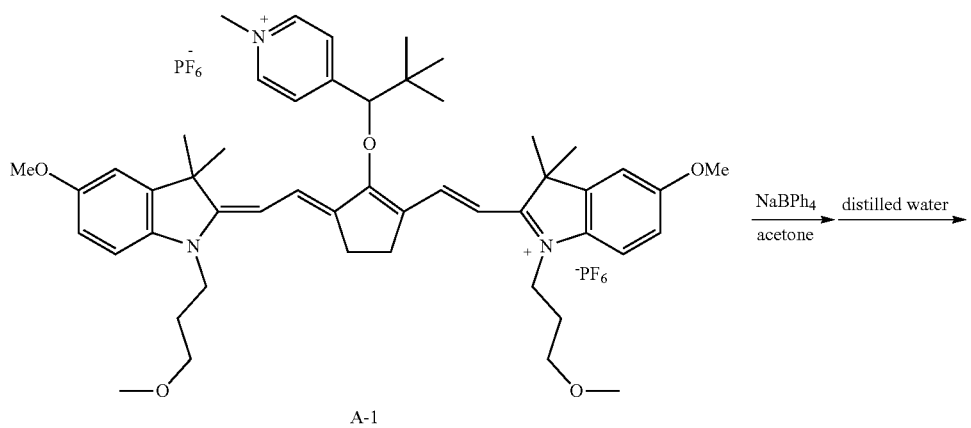

A-1

-continued

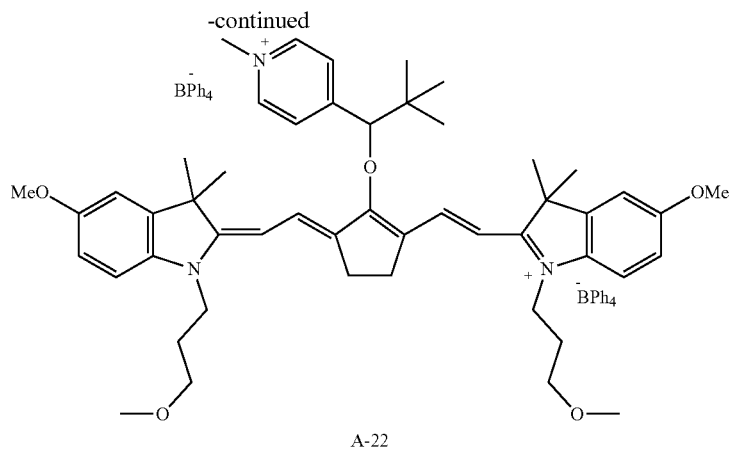

A-22

Next, the compound A-1 (3.0 g, 2.78 mmol), acetone (10 g), potassium hexafluorophoshoate (3.81 g, 11.12 mmol), and distilled water (3.0 g) were added to a 200 mL eggplant-type flask, and distilled water (45 g) was added dropwise thereto while stirring the components at room temperature. The obtained precipitates were collected by means of filtration, washed with distilled water (500 mL), and dried at a reduced pressure, thereby obtaining a compound A-22 (3.97 g, 2.78 mmol). The structure of the obtained compound A-22 was identified by means of NMR. The identification result is described below.

$^1$H-NMR (400 MHz, heavy dimethyl sulfoxide) δ=1.11 (s, 9H), 1.24 (s, 6H), 1.59 (s, 6H), 1.88-1.99 (m, 4H), 2.66-2.86 (m, 4H), 3.20 (s, 6H), 3.30-3.41 (m, 4H), 3.80 (s, 6H), 4.11 (t, 4H), 4.44 (s, 3H), 5.81 (s, 1H), 5.86 (d, 2H), 6.76-6.83 (m, 8H), 6.89-7.01 (m, 18H), 7.14-7.29 (m, 20H), 7.43 (d, 2H), 8.28 (d, 2H), 9.09 (d, 2H)

Examples 1 to 18 and Comparative Examples 1 to 7

1. Production of Infrared-Sensitive Color Developing Material
<Production of Support>

In order to remove rolling oil on the surface of a 0.3 mm-thick aluminum plate (material JIS A 1050), a defatting process was carried out thereon using an aqueous solution of 10% by mass of sodium aluminate at 50° C. for 30 seconds, and then, the surface of the aluminum plate was grained using three implanted nylon brushes having hair diameters of 0.3 mm and a suspension of pumice having a median diameter of 25 μm and water (specific gravity: 1.1 g/cm$^3$) and well washed with water. The aluminum plate was etched by being immersed in an aqueous solution of 25% by mass of sodium hydroxide at 45° C. for nine seconds, was washed with water, then, was further immersed in an aqueous solution of 20% by mass of nitric acid at 60° C. for 20 seconds, and was washed with water. The etched amount of the grained surface was approximately 3 g/m$^2$.

Next, an electrochemical roughening process was continuously carried out thereon using alternating-current voltage of 60 Hz. An electrolytic solution was an aqueous solution of 1% by mass of nitric acid (including 0.5% by mass of aluminum ions), and the liquid temperature was 50° C. The electrochemical roughening process was carried out thereon using an alternating current source waveform in which the time TP taken for the current value to reach the peak from zero was 0.8 msec, a duty ratio of 1:1, a trapezoidal square-wave alternating current, and a carbon electrode as an opposite electrode. As an auxiliary anode, ferrite was used. The current density was 30 A/dm$^2$ in terms of the peak value of the current, and 5% of the current coming from the power supply was divided into the auxiliary positive electrode. Regarding the quantity of electricity during nitric acid electrolysis, the quantity of electricity was 175 C/dm$^2$ in a case in which the aluminum plate served as the positive electrode. After that, the plate was washed with water by means of spraying.

Subsequently, an electrochemical roughening process was carried out thereon using the same method as nitric acid electrolysis in an aqueous solution of 0.5% by mass of hydrochloric acid (including 0.5% by mass of aluminum ions) and an electrolytic solution having a liquid temperature of 50° C. under a condition of the quantity of electricity of 50 C/dm$^2$ in a case in which the aluminum plate served as the positive electrode, and then, the plate was washed with water by means of spraying.

Next, 2.5 g/m$^2$ of a direct current anode oxide film was formed on the aluminum plate at a current density of 15 A/dm$^2$ using an aqueous solution of 15% by mass of sulfuric acid (including 0.5% by mass of aluminum ions) as an electrolytic solution, and then water washing and drying were carried out thereon, thereby producing a support A. The average pore diameter of the surface layer of the anode oxide film (surface average pore diameter) was 10 nm.

The pore diameter of the surface layer of the anode oxide film was measured using a method in which the surface was observed an ultrahigh resolution SEM (Hitachi S-900) at a relatively low acceleration voltage of 12 V at a magnification of 150,000 times without carrying out a deposition process or the like for imparting conductive properties, 50 pores were randomly extracted, and the average value was obtained. The standard deviation was ±10% or less.

After that, in order to ensure the hydrophilicity of a non-image area, a silicate process was carried out on the support A using an aqueous solution of 2.5% by mass of No. 3 sodium silicate at 60° C. for ten seconds, and then the support was washed with water, thereby producing a support B. The attached amount of Si was 10 mg/m$^2$. The center line average roughness (Ra) of the support B was measured using a needle having a diameter of 2 μm and was found to be 0.51 μm.

A support C was produced in the same manner as in the method for producing the support A except for the fact that, in the production of the support A, the electrolytic solution in the formation of the direct current anode oxide film was changed to an aqueous solution of 22% by mass of phosphoric acid. The average pore diameter of the surface layer of the anode oxide film (surface average pore diameter) was measured using the same method as described above and found out to be 25 nm.

After that, a silicate process was carried out on the support C using an aqueous solution of 2.5% by mass of No. 3 silicate soda at 60° C. for 10 seconds in order to ensure the hydrophilicity of a non-image area and then washed with water, thereby producing a support D. The amount of Si attached was 10 mg/m². The center line average roughness (Ra) of the support D was measured using a needle having a diameter of 2 μm and found out to be 0.52 μm.

<Formation of Infrared-Sensitive Color Developing Composition Film>

Infrared-sensitive color developing compositions having a composition A or composition B below were prepared respectively, applied onto the aluminum support B by means of bar coating so that the dried coating amount reached 1.0 g/m², dried in an oven at 120° C. for 40 seconds so as to form an infrared-sensitive color developing composition film, thereby respectively producing infrared-sensitive color developing materials for Examples 1 to 18 and Comparative Examples 1 to 7. The compositions of the infrared-sensitive color developing compositions used to produce the respective infrared-sensitive color developing materials and the compound A or a compound for comparison in the infrared-sensitive color developing compositions are summarized in Table 1 and Table 2.

<Composition of Infrared-Sensitive Color Developing Composition A>

| | |
|---|---|
| Polymethyl methacrylate (Mw: 12,000) | 0.69 parts by mass |
| Compound A or compound for comparison shown in Table 1 | 0.046 parts by mass |
| Tetraphenyl borate•sodium salt | 0.010 parts by mass |
| 2-Butanone | 11.3 parts by mass |

<Composition of Infrared-Sensitive Color Developing Composition B>

| | |
|---|---|
| Polymethyl methacrylate (Mw: 12,000) | 0.53 parts by mass |
| Polymerization initiator (1) [the following structure] | 0.16 parts by mass |
| Compound A or compound for comparison shown in Table 2 | 0.046 parts by mass |
| Tetraphenyl borate•sodium salt | 0.010 parts by mass |
| 2-Butanone | 11.3 parts by mass |

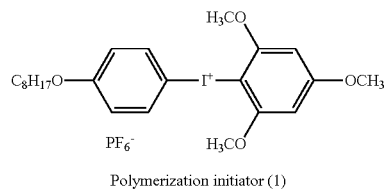

Polymerization initiator (1)

The structure of the compound for comparison will be illustrated below.

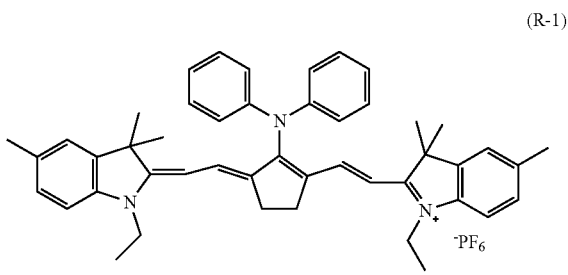

(R-1)

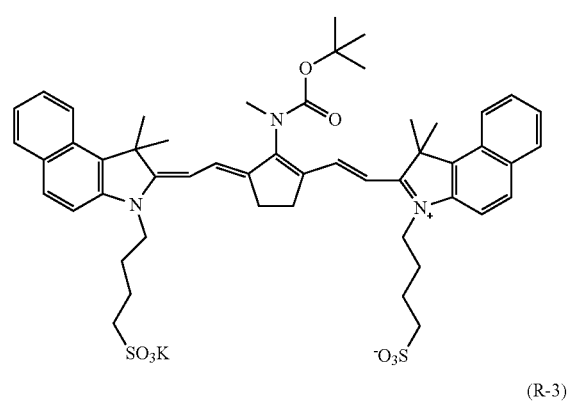

(R-2)

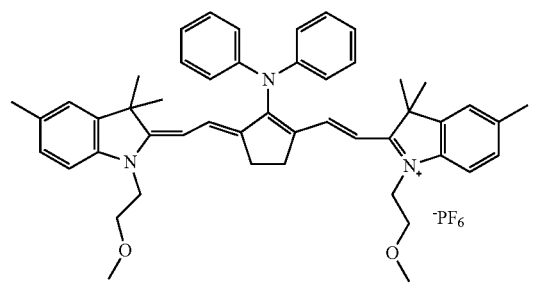

(R-3)

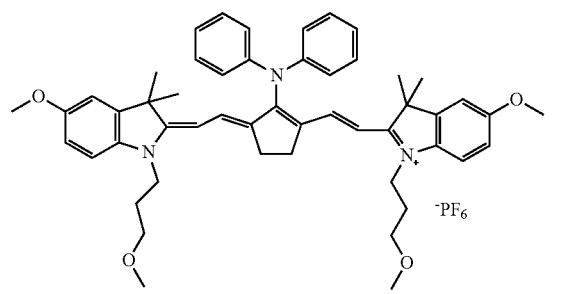

(R-4)

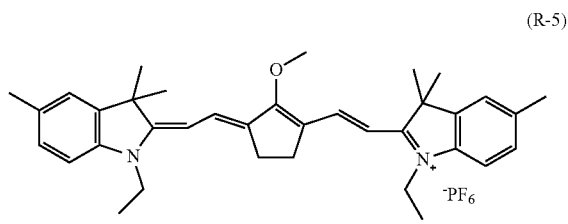

(R-5)

-continued

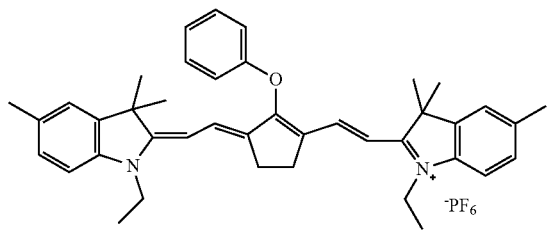
(R-6)

2. Evaluation of Color Developability of Infrared-Sensitive Color Developing Materials The infrared-sensitive color developing materials were exposed in a Trendsetter 3244VX equipped with a water cooling-type 40 W infrared semiconductor laser manufactured by Creo Co., Ltd. under conditions of an output of 11.7 W, an external surface drum rotation speed of 250 rpm, a resolution of 2,400 dpi (dot per inch, 1 inch=25.4 mm). The materials were exposed in an environment of 25° C. and 50% RH.

Color development of the infrared-sensitive color developing materials was measured immediately after the exposure and after two hours of storage in a dark place (25° C.) after the exposure. The color development was measured using a spectrophotometer CM2600d and operation software CM-S100W manufactured by Konica Minolta, Inc. by means of a specular component excluded (SCE) method. The color developability were evaluated using the difference $\Delta L$ between the $L^*$ value of an exposed portion and the $L^*$ value of a non-exposed portion using $L^*$ values (brightness) in the $L^*a^*b^*$ color specification system. A larger value of $\Delta L$ indicates superior color developability.

The evaluation results are summarized in Tables 1 and 2.

TABLE 1

|  | Infrared-sensitive color developing composition | Compound A or compound for comparison | Color developability (immediately after exposure to light) | Color developability (after two hours) |
|---|---|---|---|---|
| Example 1 | A | A-1 | 11.4 | 11.8 |
| Example 2 | A | A-4 | 11.2 | 11.7 |
| Example 3 | A | A-7 | 10.5 | 10.9 |
| Example 4 | A | A-9 | 10.0 | 10.5 |
| Example 5 | A | A-13 | 11.9 | 12.3 |
| Example 6 | A | A-16 | 11.5 | 11.9 |
| Example 7 | A | A-21 | 6.8 | 6.8 |
| Example 8 | A | A-46 | 11.8 | 12.2 |
| Example 9 | A | A-55 | 10.9 | 11.3 |
| Comparative Example 1 | A | R-2 | 3.8 | 3.9 |

TABLE 2

|  | Infrared-sensitive color developing composition | Compound A or compound for comparison | Color developability (immediately after exposure to light) | Color developability (after two hours) |
|---|---|---|---|---|
| Example 10 | B | A-1 | 7.8 | 8.5 |
| Example 11 | B | A-4 | 7.4 | 8.2 |
| Example 12 | B | A-7 | 7.1 | 7.9 |
| Example 13 | B | A-9 | 7.0 | 7.7 |
| Example 14 | B | A-13 | 8.2 | 8.9 |
| Example 15 | B | A-16 | 7.9 | 8.8 |
| Example 16 | B | A-21 | 6.8 | 7.2 |
| Example 17 | B | A-46 | 8.0 | 8.9 |
| Example 18 | B | A-55 | 7.1 | 7.8 |
| Comparative Example 2 | B | R-1 | 3.2 | 2.2 |
| Comparative Example 3 | B | R-2 | 3.8 | 3.9 |
| Comparative Example 4 | B | R-3 | 3.1 | 2.1 |
| Comparative Example 5 | B | R-4 | 3.0 | 1.9 |
| Comparative Example 6 | B | R-5 | 1.4 | 1.4 |
| Comparative Example 7 | B | R-6 | 1.2 | 1.2 |

From the results shown in Tables 1 and 2, it is found that the infrared-sensitive color developing materials having the infrared-sensitive color developing composition film containing the compound A according to the present invention are infrared-sensitive color developing materials which have favorable color developability after exposure to infrared rays and do not discolor even after two hours.

Examples 19 to 85 and Comparative Examples 8 to 34

1. Production of Lithographic Printing Plate Precursor A
<Formation of Undercoat Layer>
A coating fluid for an undercoat layer (1) having the following composition was applied onto the support so that the dried coating amount reached 20 mg/m², thereby forming an undercoat layer.
<Coating Fluid for Undercoat Layer (1)>

| Polymer (P-1) [the following structure] | 0.18 g |
| Hydroxyethyl iminodiacetic acid | 0.10 g |
| Water | 61.4 g |

(P-1)

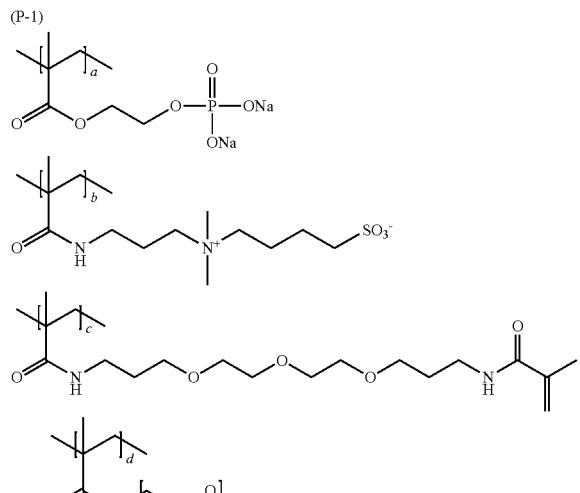

a/b/c/d/ = 14.2/71.8/9.0/5.0 (wt %)
a/b/c/d/ = 19.0/72.8/7.8/0.4 (mol %)
Mass average molecular weight = 200,000

A method for synthesizing the polymer P-1 will be described below.
(Synthesis of Monomer M-1)
ANCAMINE 1922A (diethylene glycol di(aminopropyl) ether, manufactured by Air Products) (200 g, 0.91 mol), distilled water (435 g), and methanol (410 g) were added to a 3 L three-neck flask and cooled to 5° C. Next, benzoic acid (222.5 g, 1.82 mol) and 4-hydroxy-2,2,6,6-tetramethylpiperidine-1-oxyl (4-OH-TEMPO) (25 mg, 0.15 mmol) were added thereto, and a methacrylic anhydride (280 g, 1.82 mmol) was added dropwise thereto so that the inner temperature of the reaction liquid reached 10° C. or lower. The reaction liquid was stirred at 5° C. for six hours and, subsequently, stirred at 25° C. for 12 hours, and then phosphoric acid (70 g) was added thereto so as to adjust the pH to 3.3. The reaction liquid was moved to a 10 L stainless steel beaker, ethyl acetate (3.7 L), methyl-tert butyl ether (MTBE) (1.5 L), and distilled water (0.65 L) were added thereto, and the components were strongly stirred and then left to stand. The upper layer (organic layer) was disposed of, then, ethyl acetate (1.8 L) was added thereto, the components were strongly stirred and then left to stand, and the upper layer was disposed of. Furthermore, ethyl acetate (1.5 L) was added thereto, the components were strongly stirred and then left to stand, and the upper layer was disposed of Next, MTBE (1.6 L) was added thereto, the components were strongly stirred and then left to stand, and the upper layer was disposed of. 4-OH-TEMP (62.5 mg, 0.36 mmol) was added to the obtained aqueous solution, thereby obtaining an aqueous solution of a monomer M-1 (1.2 kg, 20.1% by mass in terms of the solid content).

(Purification of Monomer M-2)
LIGHT ESTER P-1M (2-methacryloyloxyethyl acid phosphate, manufactured by Kyoeisha Chemical Co., Ltd.) (420 g), diethylene glycol dibutyl ether (1,050 g), and distilled water (1,050 g) were added to a separating funnel, strongly stirred, and then left to stand. The upper layer was disposed of, diethylene glycol dibutyl ether (1,050 g) was added thereto, and the components were strongly stirred and then left to stand. The upper layer was disposed of, thereby obtaining an aqueous solution of a monomer M-2 (1.3 kg, 10.5% by mass in terms of the solid content).

(Synthesis of Polymer P-1)
Distilled water (600.6 g), the aqueous solution of the monomer M-1 (33.1 g), and a monomer M-3 described below (46.1 g) were added to a 3 L three-neck flask and heated to 55° C. in a nitrogen atmosphere. Next, a dropwise addition liquid (1) described below was added dropwise thereto for two hours, the components were stirred for 30 minutes, then, VA-046B (manufactured by Wako Pure Chemical Industries Ltd.) (3.9 g) was added thereto, and the components were heated to 80° C. and stirred for 1.5 hours. The reaction liquid was returned to room temperature, and then an aqueous solution of 30% by mass of sodium hydroxide (175 g) was added thereto, thereby adjusting the pH to 8.3. Next, 4-OH-TEMP (152.2 mg) was added thereto, and the components were heated to 53° C. A methacrylic anhydride (66.0 g) was added thereto, and the components were stirred at 53° C. for three hours. The components were returned to room temperature, then, the reaction liquid was moved to a 10 L stainless steel beaker, MTBE (1,800 g) was added thereto, the components were strongly stirred and then left to stand, and the upper layer was disposed of A washing operation using MTBE (1,800 g) was further repeated twice in the same manner, and then distilled water (1,700 g) and 4-OH-TEMPO (212 mg) were added to the obtained water layer, thereby obtaining a polymer P-1 (4.1 kg, 11.0% in terms of the solid content) as a homogeneous solution. The mass average molecular weight (Mw) converted to a polyethylene glycol equivalent value by the gel permeation chromatography (GPC) method was 200,000.

Dropwise Addition Liquid (1)

| The aqueous solution of the monomer M-1 | 132.4 g |
| The aqueous solution of the monomer M-2 | 376.9 g |
| Monomer M-3 [the following structure] | 184.3 g |
| BREMMER PME 4000 (manufactured by NOF Corporation) | 15.3 g |
| VA-046B (manufactured by Wako Pure Chemical Industries Ltd.) | 3.9 g |
| Distilled water | 717.4 g |

-continued

BREMMER PME 4000: Methoxy polyethylene glycol methacrylate (the number of the oxyethylene unit repeated: 90)
VA-046B: 2,2′-Azobis[2-(2-imidazolin-2-yl)propane]disulfate dihydrate

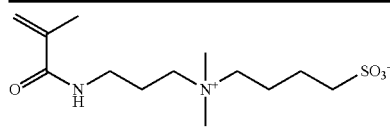

Monomer M-3

<Formation of Image-Recording Layer>

A coating fluid for an image-recording layer (1) having the following composition was applied onto the undercoat layer by means of bar coating and was dried in an oven at 100° C. for 60 seconds, thereby forming an image-recording layer having a dried coating amount of 1.0 g/m².

The coating fluid for the image-recording layer (1) was prepared by mixing and stirring the following photosensitive liquid (1) and a micro gel liquid immediately before the coating. Meanwhile, in a case in which the compound A-22 according to the present invention was used, the compound A-22 included a borate salt portion in the structure, and thus a borate compound TPB was not added thereto.

<Photosensitive Liquid (1)>

| | |
|---|---|
| Binder polymer (1) [the following structure] | 0.240 g |
| Polymerization initiator (1) [the following structure] | 0.245 g |
| Compound A or compound for comparison shown in Table 3 | 0.046 g |
| Borate compound | 0.010 g |
| TPB [the following structure] | |
| Polymerizable compound | 0.192 g |
| Tris(acryloyloxyethyl)isocyanurate | |
| (NK ester A-9300, manufactured by Shin-Nakamura Chemical Co., Ltd.) | |
| Low-molecular-weight hydrophilic compound | 0.062 g |
| Tris(2-hydroxyethyl)isocyanurate | |
| Low-molecular-weight hydrophilic compound (1) [the following structure] | 0.050 g |
| Sensitization agent | 0.055 g |
| Phosphonium compound (1) [the following structure] | |
| Sensitization agent | 0.018 g |
| Bbenzyl-dimethyl-octylammonium•PF₆ salt | |
| Sensitization agent | 0.035 g |
| Ammonium group-containing polymer (1) | |
| [the following structure, reducing specific viscosity of 44 ml/g] | |
| Fluorine-based surfactant (1) [the following structure] | 0.008 g |
| 2-Butanone | 1.091 g |
| 1-Methoxy-2-propanol | 8.609 g |

<Micro Gel Liquid>

| | |
|---|---|
| Micro gel (1) | 2.640 g |
| Distilled water | 2.425 g |

The structures of the binder polymer (1), the polymerization initiator (1), TPB, the low-molecular-weight hydrophilic compound (1), the phosphonium compound (1), the ammonium group-containing polymer (1), and the fluorine-based surfactant (1) which were used for the photosensitive agent (1) will be illustrated below.

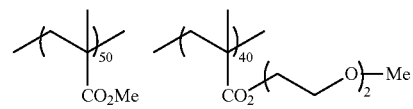

(Mw 70,000)
Binder polymer (1)

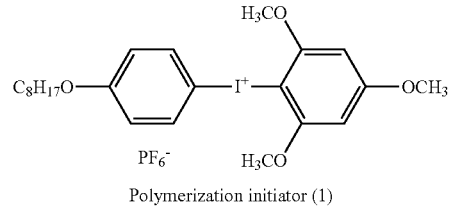

Polymerization initiator (1)

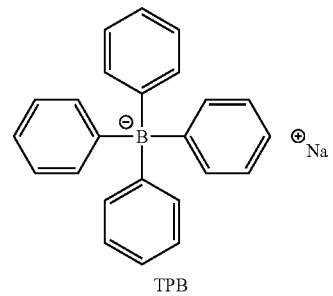

TPB

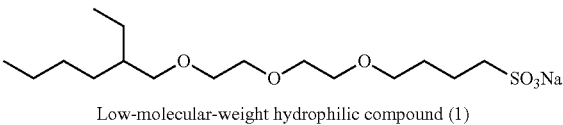

Low-molecular-weight hydrophilic compound (1)

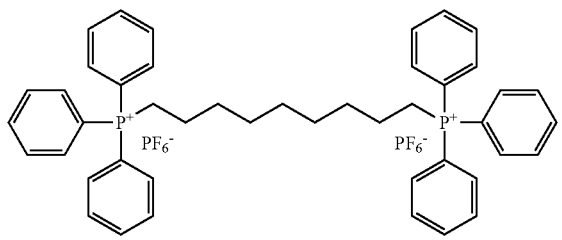

Phosphonium compound (1)

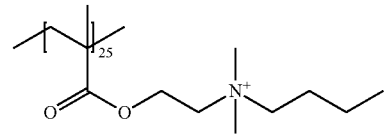

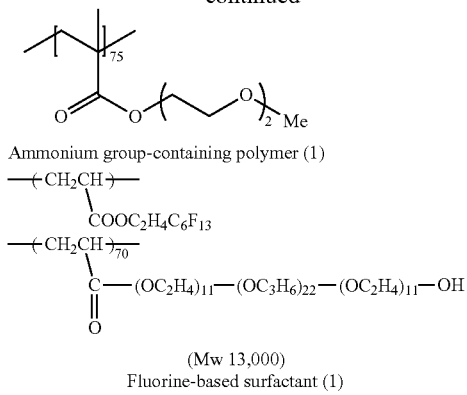

Ammonium group-containing polymer (1)

—(CH₂CH)—
   |
   COOC₂H₄C₆F₁₃
—(CH₂CH)₇₀—
   |
   C—(OC₂H₄)₁₁—(OC₃H₆)₂₂—(OC₂H₄)₁₁—OH
   ‖
   O (Mw 13,000)
Fluorine-based surfactant (1)

A method for preparing a micro gel (1) used for the micro gel liquid will be described below.

<Preparation of Polyhydric Isocyanate Compound (1)>

Bismuth tris(2-ethylhexanoate) (NEOSTAN U-600, manufactured by Nitto Kasei Co., Ltd.) (43 mg) was added to an ethyl acetate (25.31 g) suspended solution of isophorone diisocyanate (17.78 g, 80 mmol) and the following polyhydric phenol compound (1) (7.35 g, 20 mmol), and the components were stirred. The reaction temperature was set to 50° C. in a case in which the generation of heat settled, and the components were stirred for three hours, thereby obtaining an ethyl acetate solution of a polyhydric isocyanate compound (1) (50% by mass).

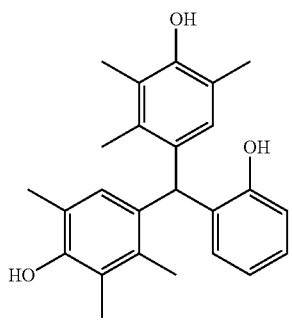

Polyhydric phenol compound (1)

<Preparation of Micro Gel (1)>

Oil-phase components described below and a water-phase component described below were mixed together and emulsified at 12,000 rpm for 10 minutes using a homogenizer. The obtained emulsion was stirred at 45° C. for four hours, an aqueous solution of 10% by mass of 1,8-diazabicyclo[5.4.0]undec-7-ene-octanoic acid salt (U-CAT SA102, manufactured by San-Apro Ltd.) (5.20 g) was added thereto, and the components were stirred at room temperature for 30 minutes and left to stand at 45° C. for 24 hours. Adjustment was made using distilled water so that the concentration of the solid content reached 20% by mass, thereby obtaining a water dispersion liquid of a micro gel (1). The average particle diameter was measured using a light scattering method and found out to be 0.28 μm.

(Oil-Based Components)

(Component 1) Ethyl acetate: 12.0 g (Component 2) An adduct obtained by adding trimethylolpropane (6 mol) and xylylene diisocyanate (18 mol) and adding methyl terminal polyoxy ethylene (1 mol, the number of the oxyethylene unit repeated: 90) thereto (a solution of 50% by mass of ethyl acetate, manufactured by Mitsui Chemicals Inc.): 3.76 g (Component 3) Polyhydric isocyanate compound (1) (as a solution of 50% by mass of ethyl acetate): 15.0 g (Component 4) An ethyl acetate solution of 65% by mass of dipentaerythritol pentacrylate (SR-399, Sartomer Japan Inc.): 11.54 g (Component 5) An ethyl acetate solution of 10% by mass of a sulfonate-type surfactant (BIONINE A-41-C, manufactured by Takemoto Oil & Fat Co., Ltd.): 4.42 g (Water-Phase Component)

Distilled water: 46.87 g

<Formation of Protective Layer>

A coating fluid for a protective layer having the following composition was applied onto the image-recording layer by means of bar coating and dried in an oven at 120° C. for 60 seconds, thereby forming a protective layer having a dried coating amount of 0.15 g/m² and thus producing each of lithographic printing plate precursors A for Examples 19 to 43 and Comparative Examples 8 to 14. Supports and compounds A or compounds for comparison in the coating fluid for an image-recording layer (1) which were used to produce the respective lithographic printing plate precursors are summarized in Table 3.

<Coating Fluid for Protective Layer>

| | |
|---|---|
| Inorganic lamellar compound dispersion liquid (1) [described below] | 1.5 g |
| Aqueous solution of 6% by mass of polyvinyl alcohol (CKS50 manufactured by The Nippon Synthetic Chemical Industry Co., Ltd., sulfonic acid-modified, degree of saponification of 99% by mol or higher, degree of polymerization of 300) | 0.55 g |
| Aqueous solution of 6% by mass of polyvinyl alcohol (PVA-405 manufactured by Kuraray Co., Ltd., degree of saponification of 81.5% by mol, degree of polymerization of 500) | 0.03 g |
| Aqueous solution of 1% by mass of a surfactant (polyoxyethylene lauryl ether, EMALEX 710, manufactured by Nihon Emulsion Co., Ltd.) | 0.86 g |
| Ion exchange water | 6.0 g |

A method for preparing the inorganic lamellar compound dispersion liquid (1) used for the coating fluid for a protective layer will be described below.

<Preparation of Inorganic Lamellar Compound Dispersion Liquid (1)>

Synthetic mica (SOMASIF ME-100 manufactured by Co-op Chemical Co., Ltd.) (6.4 g) was added to ion exchange water (193.6 g) and was dispersed using a homogenizer until the average particle diameter (the laser scattering method) reached 3 μm. The aspect ratio of the obtained dispersed particles was 100 or higher.

2. Production of Lithographic Printing Plate Precursor B

Lithographic printing plate precursors B for Examples 44 to 62 and Comparative Examples 15 to 20 were respectively produced in the same manner as in the production of the lithographic printing plate precursor A except for the fact that the following coating fluid for an image-recording layer (2) was used instead of the coating fluid for an image-recording layer (1) in the production of the lithographic printing plate precursor A. The coating fluid for an image-recording layer (2) was prepared by mixing and stirring the following photosensitive liquid (2) and the following micro gel liquid immediately before application. Supports, compounds A or compounds for comparison in the coating fluid for an image-recording layer (2), and chain transfer agents which were used to produce the respective lithographic printing plate precursors are summarized in Table 4. Meanwhile, in a case in which the compound A-22 according to the present invention was used, the compound A-22 included a borate salt portion in the structure, and thus a borate compound TPB was not added thereto.

<Photosensitive Liquid (2)>

| | |
|---|---|
| Binder polymer (1) [described above] | 0.240 g |
| Chain transfer agent [the following structure] (in the case of being contained) | 0.060 g |
| Compound A or compound for comparison shown in Table 4 | 0.038 g |
| Borate compound TPB [described above] | 0.010 g |
| Polymerizable compound Tris(acryloyloxyethyl)isocyanurate (NK ester A-9300, manufactured by Shin-Nakamura Chemical Co., Ltd.) | 0.192 g |
| Low-molecular-weight hydrophilic compound Tris(2-hydroxyethyl)isocyanurate | 0.062 g |
| Low-molecular-weight hydrophilic compound (1) [described above] | 0.050 g |
| Sensitization agent Phosphonium compound (1) [described above] | 0.055 g |
| Sensitization agent Bbenzyl-dimethyl-octylammonium•PF$_6$ salt | 0.018 g |
| Sensitization agent Ammonium group-containing polymer (1) [described above] | 0.035 g |
| Fluorine-based surfactant (1) [described above] | 0.008 g |
| 2-Butanone | 1.091 g |
| 1-Methoxy-2-propanol | 8.609 g |

<Micro Gel Liquid>

| | |
|---|---|
| Micro gel (1) [described above] | 2.640 g |
| Distilled water | 2.425 g |

The structure of the chain transfer agent used for the photosensitive agent (2) will be illustrated below.

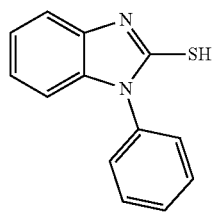
(S-1)

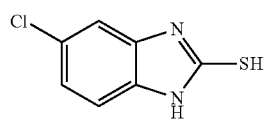
(S-2)

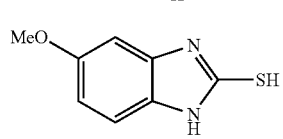
(S-3)

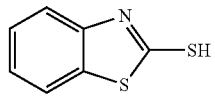
(S-4)

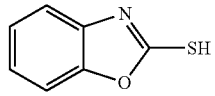
(S-5)

3. Production of Lithographic Printing Plate Precursor C

Lithographic printing plate precursors C for Examples 63 to 72 and Comparative Examples 21 to 27 were respectively produced by applying a coating fluid for an image-recording layer (3) having the following composition by means of bar coating instead of the coating fluid for an image-recording layer (1) and drying the coating fluid in an oven at 70° C. for 60 seconds, thereby forming an image-recording layer having a dried coating amount of 0.6 g/m$^2$ in the production of the lithographic printing plate precursor A. The lithographic printing plate precursor C was a lithographic printing plate precursor having no protective layer. Supports and compounds A or compounds for comparison in the coating fluid for an image-recording layer (3) which were used to produce the respective lithographic printing plate precursors are summarized in Table 5. Meanwhile, in a case in which the compound A-22 according to the present invention was used, the compound A-22 included a borate salt portion in the structure, and thus a borate compound TPB was not added thereto.

<Coating Fluid for Image-Recording Layer (3)>

| | |
|---|---|
| Compound A or compound for comparison shown in Table 5 | 0.046 g |
| Polymerization initiator (1) [described above] | 0.245 g |
| Borate compound TPB [described above] | 0.010 g |
| Polymer fine particle water dispersion liquid (1) (22% by mass) [described below] | 10.0 g |
| Polymerizable compound SR-399 (manufactured by Sartomer Japan Inc.) | 1.50 g |
| Mercapt-3-triazole | 0.2 g |
| Byk 336 (manufactured by BYK Additives & Instruments) | 0.4 g |
| Klucel M (manufactured by Hercules Incorporated) | 4.8 g |
| ELVACITE 4026 (manufactured by Ineos Acrylics) | 2.5 g |
| n-Propanol | 55.0 g |
| 2-Butanone | 17.0 g |

The compounds which were used for the coating fluid for an image-recording layer (3) and are expressed using trade names are as described below.

SR-399: Dipentaerythritol pentacrylate
Byk 336: Modified dimethyl polysiloxane copolymer (a solution of 25% by mass of xylene and methoxypropyl acetate)
Klucel M: Hydroxypropyl cellulose (2% by mass aqueous solution)
ELVACITE 4026: Highly branched polymethyl methacrylate (a solution of 10% by mass of 2-butanone)

A method for preparing the polymer fine particle water dispersion liquid (1) used for the coating fluid for an image-recording layer (3) will be described below.

<Preparation of Polymer Fine Particle Water Dispersion Liquid (1)>

A stirrer, a thermometer, a dropping funnel, a nitrogen introduction tube, and a reflux cooler were provided to a 1,000 mL four-neck flask, nitrogen gas was introduced thereinto, polyethylene glycol methyl ether methacrylate (PEGMA, the average repeating unit number of ethylene glycol: 50) (10 g), distilled water (200 g), and n-propanol (200 g) were added thereto while carrying out deoxidation, and the components were heated until the inner temperature reached 70° C. Next, a mixture obtained by mixing styrene (St) (10 g), acrylonitrile (AN) (80 g), and 2,2'-azobisisobutyronitrile (0.8 g) in advance was added dropwise thereto for one hour. A reaction continued for five hours after the end of the dropwise addition, then, 2,2'-azobisisobutyronitrile (0.4 g) was added thereto, and the inner temperature was increased up to 80° C. Subsequently, 2,2'-azobisisobutyronitrile (0.5 g) was added thereto for six hours. At a stage of continuing the reaction for a total of 20 hours, 98% or more of polymerization had progressed, and a polymer fine particle water dispersion liquid (1) including PEGMA/St/AN in a volume ratio of 10/10/80 was prepared. The particle size distribution of the polymer fine particles had the maximum value at a particle diameter of 150 nm.

The particle size distribution was obtained by capturing an electron microscopic photograph of the polymer fine particles, measuring the particle diameters of a total of 5,000 fine particles on the photograph, dividing the range of the obtained particle diameter measurement values from zero to the maximum value into 50 sections using a logarithmic scale, and plotting the appearance frequency of the respective particle diameters. Meanwhile, for a non-spherical particle, the particle diameter value of a spherical particle having the same particle area as the particle area on the photograph was considered as the particle diameter.

4. Production of Lithographic Printing Plate Precursor D

Lithographic printing plate precursors D for Examples 73 to 77 and Comparative Examples 28 and 29 were respectively produced by applying a coating fluid for an image-recording layer (4) having the following composition after coating by means of bar coating instead of the coating fluid for an image-recording layer (1) and drying the coating aqueous solution in an oven at 50° C. for 60 seconds, thereby forming an image-recording layer having a dried coating amount of 0.93 g/m² in the production of the lithographic printing plate precursor A. The lithographic printing plate precursor D was a lithographic printing plate precursor having no protective layer. Supports and compounds A or compounds for comparison in the coating fluid for an image-recording layer (4) which were used to produce the respective lithographic printing plate precursors are summarized in Table 6. Meanwhile, in a case in which the compound A-22 according to the present invention was used, the compound A-22 included a borate salt portion in the structure, and thus a borate compound TPB was not added thereto.

<Coating Fluid for Image-Recording Layer (4)>

| | |
|---|---|
| Compound A or compound for comparison shown in Table 6 | 0.038 g/m² |
| Borate compound TPB [described above] | 0.01 g/m² |
| Polymer fine particle water dispersion liquid (2) | 0.693 g/m² |
| Glascol E15 (manufactured by Allied Colloids Manufacturing GMBH) | 0.09 g/m² |
| ERKOL WX48/20 (manufactured by ERKOL) | 0.09 g/m² |
| Zonyl FSO100 (manufactured by DuPont) | 0.0075 g/m² |

The compounds which were used for the image-recording layer coating fluid (4) and are expressed using trade names and the polymer fine particle water dispersion liquid (2) are as described below.

Glascol E15: Polyacrylic acid

ERKOL WX48/20: Polyvinyl alcohol/polyvinyl acetate copolymer

Zonyl FSO100: Surfactant

Polymer fine particle water dispersion liquid (2): A styrene/acrylonitrile copolymer stabilized with an anionic lubricant (the molar ratio: 50/50, the average particle diameter: 61 nm, and the solid content: approximately 20%)

5. Production of Lithographic Printing Plate Precursor E

Lithographic printing plate precursors E for Examples 78 to 85 and Comparative Examples 30 to 34 were respectively produced by applying a coating fluid for an image-recording layer (5) described below by means of bar coating instead of the coating fluid for an image-recording layer (1) and drying the coating fluid in an oven at 100° C. for 60 seconds, thereby forming an image-recording layer having a dried coating amount of 1.0 g/m² in the production of the lithographic printing plate precursor A. The lithographic printing plate precursor E was a lithographic printing plate precursor having no protective layer.

The coating fluid for the image-recording layer (5) was prepared by mixing and stirring the following photosensitive liquid (5) and a micro gel liquid immediately before the coating. Supports and compounds A or compounds for comparison in the coating fluid for an image-recording layer (5) which were used to produce the respective lithographic printing plate precursors are summarized in Table 7. Meanwhile, in a case in which the compound A-22 according to the present invention was used, the compound A-22 included a borate salt portion in the structure, and thus the amount of a borate compound TPB added was set to 0.039 g.

<Photosensitive Liquid (5)>

| | |
|---|---|
| Binder polymer (1) [described above] | 0.240 g |
| Compound A or compound for comparison shown in Table 4 | 0.038 g |
| Borate compound TPB [described above] | 0.057 g |
| Polymerizable compound Tris(acryloyloxyethyl)isocyanurate (NK ester A-9300, manufactured by Shin-Nakamura Chemical Co., Ltd.) | 0.192 g |
| Low-molecular-weight hydrophilic compound Tris(2-hydroxyethyl)isocyanurate | 0.062 g |
| Low-molecular-weight hydrophilic compound (1) [described above] | 0.050 g |
| Fluorine-based surfactant (1) [described above] | 0.008 g |
| Acid color developer [the following structure] | 0.029 g |
| 2-Butanone | 1.091 g |
| 1-Methoxy-2-propanol | 8.609 g |

<Micro Gel Liquid>

| | |
|---|---|
| Micro gel (1) [described above] | 2.640 g |
| Distilled water | 2.425 g |

The structure of the acid color developer used for the photosensitive liquid (5) will be illustrated below.

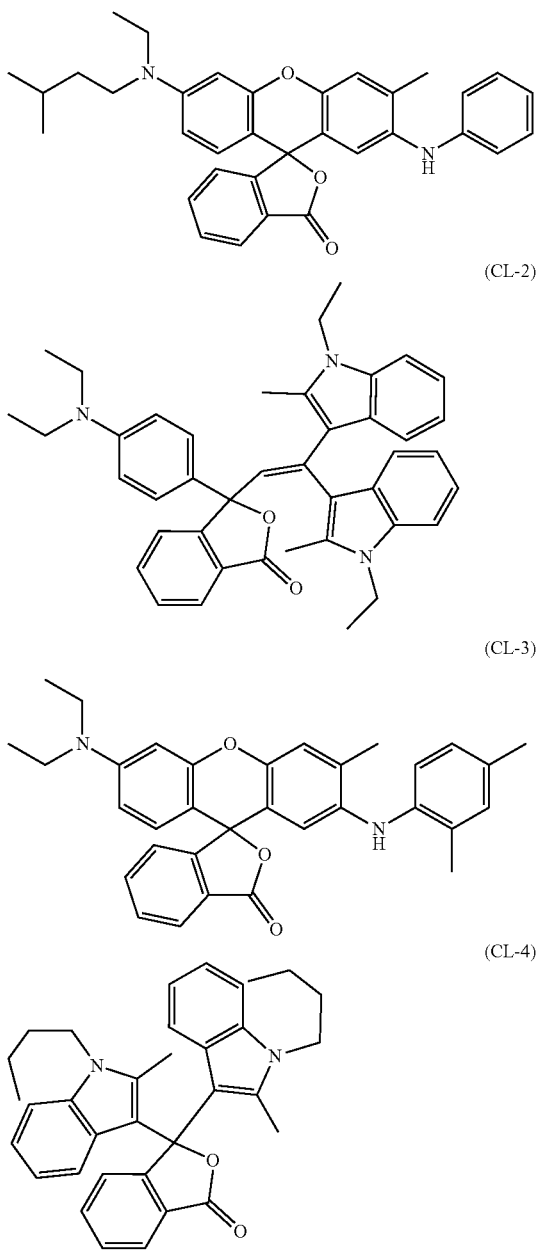

CL-1: S-205 (manufactured by Fukui Yamada Chemical Co., Ltd.)

CL-2: GN-169 (manufactured by Yamamoto Chemicals Inc.)

CL-3: Black-XV (manufactured by Yamamoto Chemicals Inc.)

CL-4: Red-40 (manufactured by Yamamoto Chemicals Inc.)

6. Evaluation of Lithographic Printing Plate Precursors

For the respective lithographic printing plate precursors described above, the color developability, the on-machine developability, the white light stability, the printing resistance, and the tone reproducibility were evaluated in the following manner. The evaluation results are shown in Tables 3 to 7.

(1) Color Developability

The obtained lithographic printing plate precursors were exposed using a TRENDSETTER 3244VX manufactured by Creo Co., Ltd. which was equipped with a water cooling-type 40 W infrared semiconductor laser under conditions of an output of 11.7 W, an external surface drum rotation speed of 250 rpm, and a resolution of 2,400 dpi (dot per inch, 1 inch=25.4 mm).

The exposure was carried out under conditions of 25° C. and 50% RH.

The color development of the lithographic printing plate precursor was measured immediately after exposure and after two hours of storage in a dark plate (25° C.) after the exposure. The color development was measured using a spectrophotometer CM2600d and operation software CM-S100W manufactured by Konica Minolta, Inc. by means of a specular component excluded (SCE) method. The color developability were evaluated using the difference ΔL between the L* value of an exposed portion and the L* value of a non-exposed portion using L* values (brightness) in the L*a*b* color specification system. A larger value of ΔL indicates superior color developability.

(2) On-Machine Developability

The lithographic printing plate precursors were exposed using a LUXEL PLATESETTER T-6000III manufactured by Fujifilm Corporation which was equipped with an infrared semiconductor laser under conditions of an external surface drum rotation speed of 1,000 rpm, a laser output of 70%, and a resolution of 2,400 dpi. Exposed images were provided with beta images and 50% halftone dot charts of 20 µm dot FM screens.

Without carrying out a development process on the exposed plate precursors, the lithographic printing plate precursors were attached to the plate trunk of a printer LITHRONE 26 manufactured by Komori Corporation. Dampening water and ink were supplied using dampening water of ECOLITY-2 (manufactured by Fujifilm Corporation)/tap water=2/98 (capacity ratio) and Values-G(N) BLACK INK (manufactured by DIC Graphics Corporation) and using the standard automatic printing start method of LITHRONE 26, and then printing was carried out on 100 pieces of TOKUBISHI art paper (76.5 kg) (manufactured by Mitsubishi Paper Mills limited) at a printing rate of 10,000 pieces per hour.

The on-machine development of non-exposed portions in the image-recording layer was completed on the printer, and the number of pieces of printing paper required until ink was not transferred to the non-image areas was measured and evaluated as the on-machine developability. A smaller number of pieces of printing paper indicates superior on-machine developability.

(3) White Light Stability

In an environment of room temperature (25° C.) and a humidity of 50%, an OSRAM FLR40SW fluorescent light manufactured by Mitsubishi electric Corporation was used as a light source, and the lithographic printing plate precursor was set at a location of an illuminance of 1,000 lx in a pocket illuminance meter ANA-F9 manufactured by Tokyo Photoelectric Co., Ltd. and irradiated with white light for two hours. After that, exposure in an image pattern and on-machine development were carried out in the same manner as in the evaluation of the on-machine developability, the number of pieces of printing paper was measured and evaluated as the white light stability. A smaller number of pieces of printing paper indicates superior white light stability.

(4) Printing Resistance

After the on-machine developability were evaluated, printing was further continued. As the number of printed pieces increased, the image-recording layer gradually wore, and thus the ink concentration on printed matters decreased. The number of pieces of printed paper until the value of the halftone dot area ratio of FM screen 50% halftone dots on printed matters measured using a gretag density meter decreased to be 5% lower than the measurement value obtained in a case in which printing was carried out on a $100^{th}$ piece of paper was measured. The printing resistance was evaluated using relative printing resistance for which the number of pieces of printed paper of 50,000 was considered as 100. A larger numerical value indicates superior printing resistance.

Relative printing resistance=(the number of pieces of printed paper of the subject lithographic printing plate precursor)/50,000×100

(5) Tone Reproducibility

The halftone dot area ratio of 50% halftone dots was measured using a gretag density meter, the dot gain amount (%) of the 50% halftone dots was obtained from the difference between the actual measurement value of the halftone dot area ratio and the original image halftone % (=50%), and the tone reproducibility was evaluated using this numerical value. The numerical value closer to zero indicates superior tone reproducibility. The numerical value of 5% or less is a practically permissible level, and the numerical value of 6% or more lacks practicality.

TABLE 3

| | Support | Compound A or compound for comparison | Color developability (immediately after exposure to light) | Color developability (after two hours) | On-machine developability (number of pieces) | White light stability (number of pieces) | Printing resistance | Tone reproducibility (%) |
|---|---|---|---|---|---|---|---|---|
| Example 19 | B | A-1 | 6.8 | 7.6 | 17 | 23 | 85 | 4 |
| Example 20 | B | A-2 | 6.2 | 7.0 | 11 | 12 | 74 | 3 |
| Example 21 | B | A-3 | 6.7 | 7.4 | 27 | 35 | 73 | 4 |
| Example 22 | B | A-4 | 6.9 | 7.7 | 20 | 26 | 79 | 4 |
| Example 23 | B | A-5 | 6.1 | 6.9 | 26 | 35 | 82 | 4 |
| Example 24 | B | A-6 | 6.0 | 6.8 | 24 | 30 | 81 | 4 |
| Example 25 | B | A-7 | 6.9 | 7.5 | 17 | 23 | 82 | 3 |
| Example 26 | B | A-8 | 6.5 | 7.3 | 19 | 25 | 78 | 4 |
| Example 27 | B | A-9 | 6.0 | 6.9 | 11 | 12 | 79 | 3 |
| Example 28 | B | A-10 | 6.6 | 7.7 | 25 | 30 | 73 | 3 |
| Example 29 | B | A-10 | 6.9 | 7.8 | 23 | 30 | 85 | 4 |
| Example 30 | B | A-12 | 6.8 | 7.4 | 13 | 17 | 80 | 3 |
| Example 31 | B | A-13 | 7.2 | 7.9 | 17 | 23 | 87 | 4 |
| Example 32 | B | A-14 | 7.5 | 8.3 | 18 | 24 | 88 | 4 |
| Example 33 | B | A-15 | 7.0 | 8.0 | 17 | 22 | 84 | 4 |
| Example 34 | B | A-16 | 7.3 | 8.1 | 17 | 24 | 82 | 4 |
| Example 35 | B | A-17 | 7.0 | 7.9 | 18 | 22 | 79 | 4 |
| Example 36 | B | A-18 | 4.5 | 5.2 | 17 | 23 | 70 | 4 |
| Example 37 | B | A-19 | 6.8 | 7.4 | 16 | 21 | 82 | 4 |
| Example 38 | B | A-20 | 6.8 | 7.4 | 16 | 20 | 81 | 4 |
| Example 39 | B | A-21 | 4.3 | 4.9 | 14 | 20 | 70 | 3 |
| Example 40 | B | A-22 | 7.2 | 7.8 | 20 | 25 | 88 | 4 |
| Example 41 | D | A-1 | 6.8 | 7.3 | 19 | 24 | 90 | 4 |
| Example 42 | D | A-13 | 7.4 | 8.2 | 18 | 24 | 92 | 4 |
| Example 43 | D | A-16 | 7.4 | 8.1 | 18 | 25 | 88 | 4 |
| Comparative Example 8 | B | R-1 | 2.3 | 1.7 | 45 | 85 | 82 | 6 |
| Comparative Example 9 | B | R-2 | 3.5 | 3.5 | 35 | 60 | 72 | 6 |
| Comparative Example 10 | B | R-3 | 2.2 | 1.6 | 28 | 40 | 71 | 5 |
| Comparative Example 11 | B | R-4 | 2.1 | 1.5 | 18 | 25 | 68 | 4 |
| Comparative Example 12 | B | R-5 | 1.4 | 1.5 | 35 | 55 | 65 | 6 |
| Comparative Example 13 | B | R-6 | 1.6 | 1.5 | 36 | 60 | 67 | 6 |
| Comparative Example 14 | D | R-2 | 3.6 | 3.6 | 37 | 65 | 78 | 6 |

TABLE 4

| | Support | Chain transfer agent | Compound A or compound for comparison | Color developability (immediately after exposure to light) | Color developability (after two hours) | On-machine developability (number of pieces) | White light stability (number of pieces) | Printing resistance | Tone reproducibility (%) |
|---|---|---|---|---|---|---|---|---|---|
| Example 44 | B | S-1 | A-1 | 9.8 | 10.2 | 11 | 11 | 68 | 2 |
| Example 45 | B | S-1 | A-2 | 9.1 | 9.5 | 11 | 11 | 60 | 2 |
| Example 46 | B | S-1 | A-7 | 9.9 | 10.3 | 11 | 11 | 69 | 2 |
| Example 47 | B | S-1 | A-8 | 9.5 | 10.3 | 11 | 11 | 64 | 2 |

TABLE 4-continued

| | Support | Chain transfer agent | Compound A or compound for comparison | Color developability (immediately after exposure to light) | Color developability (after two hours) | On-machine developability (number of pieces) | White light stability (number of pieces) | Printing resistance | Tone reproducibility (%) |
|---|---|---|---|---|---|---|---|---|---|
| Example 48 | B | S-1 | A-11 | 10.1 | 10.5 | 12 | 13 | 72 | 2 |
| Example 49 | B | S-1 | A-13 | 10.5 | 10.9 | 11 | 11 | 75 | 2 |
| Example 50 | B | S-1 | A-14 | 10.7 | 11.0 | 12 | 12 | 77 | 2 |
| Example 51 | B | S-1 | A-16 | 9.3 | 10.0 | 11 | 11 | 72 | 2 |
| Example 52 | B | S-1 | A-17 | 9.2 | 9.9 | 11 | 11 | 68 | 2 |
| Example 53 | B | S-1 | A-19 | 9.8 | 10.2 | 11 | 11 | 69 | 2 |
| Example 54 | B | S-1 | A-21 | 4.5 | 5.2 | 11 | 11 | 58 | 2 |
| Example 55 | B | S-1 | A-22 | 10.3 | 10.8 | 12 | 13 | 72 | 2 |
| Example 56 | D | S-1 | A-1 | 9.9 | 10.4 | 11 | 11 | 73 | 2 |
| Example 57 | D | S-1 | A-13 | 10.4 | 10.9 | 11 | 11 | 79 | 2 |
| Example 58 | B | S-2 | A-7 | 9.8 | 10.3 | 11 | 11 | 73 | 2 |
| Example 59 | B | S-3 | A-7 | 9.9 | 10.4 | 11 | 11 | 65 | 2 |
| Example 60 | B | S-4 | A-7 | 10.0 | 10.7 | 11 | 11 | 65 | 2 |
| Example 61 | B | S-5 | A-7 | 9.8 | 10.3 | 11 | 11 | 68 | 2 |
| Example 62 | B | — | A-7 | 9.8 | 10.3 | 11 | 11 | 64 | 2 |
| Comparative Example 15 | B | S-1 | R-1 | 1.5 | 1.4 | 18 | 25 | 45 | 3 |
| Comparative Example 16 | B | S-1 | R-2 | 2.8 | 2.8 | 15 | 19 | 47 | 4 |
| Comparative Example 17 | B | S-1 | R-3 | 1.4 | 1.4 | 12 | 15 | 42 | 2 |
| Comparative Example 18 | B | S-1 | R-4 | 1.6 | 1.5 | 11 | 12 | 40 | 2 |
| Comparative Example 19 | B | S-1 | R-5 | 1.3 | 1.4 | 18 | 22 | 41 | 3 |
| Comparative Example 20 | B | S-1 | R-6 | 1.4 | 1.4 | 18 | 23 | 42 | 3 |

TABLE 5

| | Support | Compound A or compound for comparison | Color developability (immediately after exposure to light) | Color developability (after two hours) | On-machine developability (number of pieces) | White light stability (number of pieces) | Printing resistance | Tone reproducibility (%) |
|---|---|---|---|---|---|---|---|---|
| Example 63 | B | A-1 | 6.7 | 7.3 | 16 | 21 | 74 | 4 |
| Example 64 | B | A-3 | 6.7 | 7.4 | 20 | 25 | 74 | 3 |
| Example 65 | B | A-7 | 6.8 | 7.5 | 12 | 15 | 75 | 3 |
| Example 66 | B | A-10 | 6.0 | 7.0 | 12 | 14 | 70 | 3 |
| Example 67 | B | A-14 | 7.2 | 7.7 | 16 | 22 | 79 | 4 |
| Example 68 | B | A-16 | 6.9 | 7.5 | 17 | 22 | 77 | 4 |
| Example 69 | B | A-20 | 6.7 | 7.2 | 16 | 21 | 75 | 4 |
| Example 70 | B | A-22 | 7.0 | 7.8 | 16 | 21 | 75 | 4 |
| Example 71 | D | A-1 | 6.8 | 7.5 | 17 | 22 | 81 | 4 |
| Example 72 | D | A-7 | 6.8 | 7.4 | 12 | 15 | 82 | 3 |
| Comparative Example 21 | B | R-1 | 2.3 | 1.5 | 30 | 75 | 70 | 6 |
| Comparative Example 22 | B | R-2 | 3.6 | 3.6 | 24 | 60 | 72 | 5 |
| Comparative Example 23 | B | R-3 | 2.4 | 1.6 | 20 | 27 | 73 | 5 |
| Comparative Example 24 | B | R-4 | 2.2 | 1.5 | 16 | 20 | 72 | 4 |
| Comparative Example 25 | B | R-5 | 1.4 | 1.5 | 26 | 60 | 73 | 6 |
| Comparative Example 26 | B | R-6 | 1.5 | 1.4 | 25 | 60 | 72 | 6 |
| Comparative Example 27 | D | R-2 | 3.5 | 3.6 | 25 | 60 | 79 | 5 |

TABLE 6

| | Support | Compound A or compound for comparison | Color developability (immediately after exposure to light) | Color developability (after two hours) | On-machine developability (number of pieces) | White light stability (number of pieces) | Printing resistance | Tone reproducibility (%) |
|---|---|---|---|---|---|---|---|---|
| Example 73 | B | A-1 | 9.7 | 10.2 | 12 | 12 | 70 | 2 |
| Example 74 | B | A-7 | 9.9 | 10.3 | 12 | 12 | 74 | 2 |
| Example 75 | B | A-11 | 9.5 | 10.1 | 13 | 16 | 74 | 2 |
| Example 76 | B | A-14 | 10.2 | 10.7 | 12 | 12 | 73 | 2 |
| Example 77 | B | A-22 | 10.0 | 10.5 | 12 | 12 | 74 | 2 |
| Comparative Example 28 | B | R-1 | 1.5 | 1.5 | 25 | 50 | 73 | 3 |
| Comparative Example 29 | B | R-2 | 2.9 | 3.0 | 20 | 30 | 71 | 3 |

TABLE 7

| | Support | Acid color developer | Compound A or compound for comparison | Color developability (immediately after exposure to light) | Color developability (after two hours) | On-machine developability (number of pieces) | White light stability (number of pieces) | Printing resistance | Tone reproducibility (%) |
|---|---|---|---|---|---|---|---|---|---|
| Example 78 | B | CL-1 | A-1 | 12.2 | 11.6 | 12 | 12 | 74 | 2 |
| Example 79 | B | CL-1 | A-11 | 12.6 | 12.0 | 12 | 12 | 78 | 2 |
| Example 80 | B | CL-1 | A-20 | 11.8 | 11.4 | 12 | 12 | 72 | 2 |
| Example 81 | B | CL-2 | A-20 | 12.6 | 11.5 | 12 | 12 | 72 | 2 |
| Example 82 | B | CL-3 | A-20 | 11.9 | 11.3 | 12 | 12 | 71 | 2 |
| Example 83 | B | CL-4 | A-20 | 11.8 | 11.2 | 12 | 12 | 73 | 2 |
| Example 84 | B | — | A-20 | 9.4 | 9.5 | 12 | 12 | 76 | 2 |
| Example 85 | B | CL-3 | A-22 | 12.7 | 12.1 | 12 | 12 | 74 | 2 |
| Comparative Example 30 | B | CL-1 | R-1 | 4.2 | 3.5 | 20 | 25 | 68 | 3 |
| Comparative Example 31 | B | CL-1 | R-2 | 3.5 | 2.8 | 16 | 20 | 70 | 3 |
| Comparative Example 32 | B | CL-1 | R-3 | 4.5 | 3.6 | 13 | 15 | 69 | 2 |
| Comparative Example 33 | B | — | R-3 | 1.5 | 1.4 | 13 | 15 | 70 | 2 |
| Comparative Example 34 | B | CL-1 | R-6 | 3.6 | 3.0 | 18 | 30 | 69 | 3 |

From the results of Tables 3 to 7, it is clear that the lithographic printing plate precursor having an image-recording layer containing the compound A according to the present invention has extremely superior color developability to the lithographic printing plate precursors of the comparative examples containing the compound for comparison. Furthermore, it is clear that the lithographic printing plate precursor having an image-recording layer containing the compound A according to the present invention are favorable in terms of all of the on-machine developability, the white light stability, the printing resistance, and the tone reproducibility, but the lithographic printing plate precursors of the comparative examples were poor in terms of all of the on-machine developability, the white light stability, the printing resistance, and the tone reproducibility.

According to the present invention, it is possible to provide a color developing composition which has excellent color developability and does not significantly discolor after aged.

In addition, according to the present invention, it is possible to provide a lithographic printing plate precursor which has excellent visibility by means of color development, is capable of maintaining excellent color developability even after aged, exhibits favorable on-machine developability, has excellent white light stability, and is also favorable in terms of printing resistance and tone reproducibility.

Furthermore, according to the present invention, it is possible to provide a method for producing a lithographic printing plate in which the lithographic printing plate precursor is used.

Furthermore, according to the present invention, it is possible to provide a color developing compound which has excellent color developability and does not significantly discolor after aged.

The present invention has been described in detail with reference to specific embodiments, but it is clear to a person skilled in the related art that a variety of modifications or corrections can be added thereto within the concept and scope of the present invention.

The present application claims priority on the basis of a Japanese Patent Application filed on Feb. 19, 2016 (JP2016-30505) and a Japanese Patent Application filed on Feb. 8, 2017 (JP2017-21607), the contents of which are incorporated herein by reference.

What is claimed is:

1. A color developing composition comprising:
a compound represented by the following Formula (1),

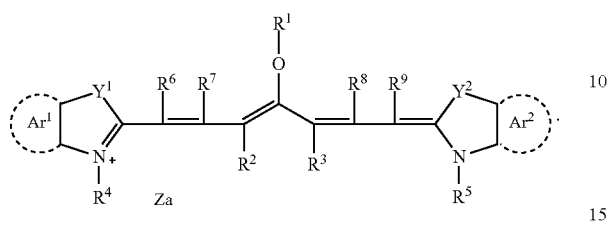
(1)

wherein, in the Formula (1), $R^1$ represents a group in which an $R^1$—O bond is cleaved by heat or exposure to infrared rays, the group represented by $R^1$ being a group represented by one of the following Formulae (1-1) to (1-7),
$R^2$ and $R^3$ each independently represent a hydrogen atom or an alkyl group, or $R^2$ and $R^3$ may be linked to each other to form a ring,
$Ar^1$ and $Ar^e$ each independently represent a group forming a benzene ring or a naphthalene ring,
$Y^1$ and $Y^2$ each independently represent an oxygen atom, a sulfur atom, —$NR^0$—, or a dialkyl methylene group,
$R^4$ and $R^5$ each independently represent an alkyl group or a group represented by one of the following Formulae (2) to (4),
$R^6$ to $R^9$ each independently represent a hydrogen atom or an alkyl group,
$R^0$ represents a hydrogen atom, an alkyl group, or an aryl group, and
Za represents a counter ion for neutralizing a charge;
provided that the compound represented by the Formula (1) has at least one of groups represented by the Formulae (2) to (4) as $R^4$ or $R^5$, or in $Ar^1$ or $Ar^2$,

(2)

(3)

(4)

in the Formulae (2) to (4), $R^{10}$ represents an alkylene group having 2 to 6 carbon atoms, W represents a single bond or an oxygen atom, n1 represents an integer of 1 to 45, $R^{11}$ represents an alkyl group having 1 to 12 carbon atoms or —C(=O)—$R^{14}$, $R^{14}$ represents an alkyl group having 1 to 12 carbon atoms, $R^{12}$ and $R^{13}$ each independently represent a single bond or an alkylene group having 1 to 12 carbon atoms, and M represents a hydrogen atom, a Na atom, a K atom, or an onium group,

(1-1)

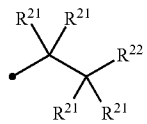
(1-2)

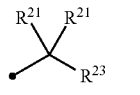
(1-3)

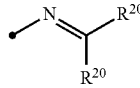
(1-4)

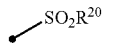
(1-5)

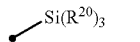
(1-6)

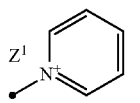
(1-7)

wherein in the Formulae (1-1) to (1-7), • represents a bonding site with the O atom in the Formula (1), $R^{20}$'s each independently represent a hydrogen atom, an alkyl group, an alkenyl group, an aryl group, —$OR^{24}$, —$NR^{25}R^{26}$, or —$SR^{27}$, $R^{21}$'s each independently represent a hydrogen atom, an alkyl group, or an aryl group, $R^{22}$ represents —$OR^{24}$, —$NR^{25}R^{26}$, —$SR^{27}$, —C(=O)$R^{28}$, —OC(=O)$R^{28}$, or a halogen atom, $R^{23}$ represents an alkenyl group, an alkoxy group, or an onium group, $R^{24}$ to $R^{27}$ each independently represent a hydrogen atom, an alkyl group, or an aryl group, $R^{28}$ represents an alkyl group, an aryl group, —$OR^{24}$, —$NR^{25}R^{26}$, or —$SR^{27}$, and $Z^1$ represents a counter ion for neutralizing a charge.

2. The color developing composition according to claim 1,
wherein $R^1$ in the Formula (1) is a group represented by the following Formula (5),

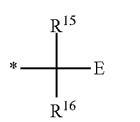
(5)

in the Formula (5), $R^{15}$ and $R^{16}$ each independently represent a hydrogen atom, an alkyl group, or an aryl group, E represents an onium group, and * represents a bonding site.

3. The color developing composition according to claim 2,
wherein E in the Formula (5) is a pyridinium group represented by the following Formula (6),

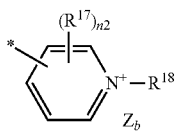

(6)

in the Formula (6), $R^{17}$ represents a halogen atom, an alkyl group, an aryl group, a hydroxy group, or an alkoxy group; in a case in which a plurality of $R^{17}$'s is present, the plurality of $R^{17}$'s may be identical to or different from each other or the plurality of $R^{17}$'s may be linked to each other to form a ring, n2 represents an integer of 0 to 4, $R^{18}$ represents an alkyl group, an aryl group, or a group represented by any of Formulae (2) to (4), and $Z_b$ represents a counter ion for neutralizing a charge.

4. The color developing composition according to claim 1,
wherein $Ar^1$ or $Ar^2$ in the Formula (1) is a group forming a group represented by the following Formula (7),

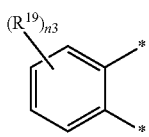

(7)

in the Formula (7), $R^{19}$ represents an alkyl group having 1 to 12 carbon atoms or a group represented by any of the Formulae (2) to (4), n3 represents an integer of 1 to 4, and * represents a bonding site.

5. The color developing composition according to claim 1,
wherein the compound represented by the Formula (1) has at least one group represented by the Formula (2) as $R^4$ or $R^5$, or in $Ar^1$ or $Ar^2$.

6. The color developing composition according to claim 1,
wherein $R^4$ and $R^5$ in the Formula (1) are the group represented by the Formula (2).

7. The color developing composition according to claim 1, further comprising:
a binder polymer.

8. The color developing composition according to claim 1, further comprising:
a polymerizable compound.

9. The color developing composition according to claim 1, further comprising:
a polymerization initiator.

10. The color developing composition according to claim 1, further comprising:
an acid color developer.

11. The color developing composition according to claim 10,
wherein the acid color developer is at least one compound selected from the group consisting of a spiropyran compound, a spirooxazine compound, a spirolactone compound, and a spirolactam compound.

12. A lithographic printing plate precursor comprising:
an image-recording layer containing the color developing composition according to claim 1, on a support.

13. The lithographic printing plate precursor according to claim 12, further comprising:
a protective layer on the image-recording layer.

14. A method for producing a lithographic printing plate comprising:
exposing the lithographic printing plate precursor according to claim 12 in an image pattern; and
removing a non-exposed portion in the image-recording layer using at least one of printing ink or dampening water on a printer.

15. A color developing compound represented by the following Formula (1),

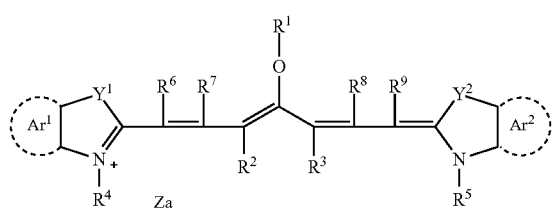

(1)

wherein, in the Formula (1), $R^1$ represents a group in which an $R^1$—O bond is cleaved by heat or exposure to infrared rays, the group represented by $R^1$ being a group represented by one of the following Formulae (1-1) to (1-7), $R^2$ and $R^3$ each independently represent a hydrogen atom or an alkyl group, or $R^2$ and $R^3$ may be linked to each other to form a ring, $Ar^1$ and $Ar^2$ each independently represent a group forming a benzene ring or a naphthalene ring, $Y^1$ and $Y^2$ each independently represent an oxygen atom, a sulfur atom, —$NR^0$—, or a dialkyl methylene group, $R^4$ and $R^5$ each independently represent an alkyl group or a group represented by one of the following Formulae (2) to (4), $R^6$ to $R^9$ each independently represent a hydrogen atom or an alkyl group, $R^0$ represents a hydrogen atom, an alkyl group, or an aryl group, and Za represents a counter ion for neutralizing a charge;

provided that the compound represented by the Formula (1) has at least one of groups represented by the Formulae (2) to (4) as $R^4$ or $R^5$, or in $Ar^1$ or $Ar^2$, $$—W—(\!—R^{10}—O—\!)_{n1}R^{11} \qquad (2)$$

$$—R^{12}—CO_2M \qquad (3)$$

$$—R^{13}—PO_3M_2 \qquad (4)$$

in the Formulae (2) to (4), $R^{10}$ represents an alkylene group having 2 to 6 carbon atoms, W represents a single bond or an oxygen atom, n1 represents an integer of 1 to 45, $R^{11}$ represents an alkyl group having 1 to 12 carbon atoms or —C(=O)—$R^{14}$, $R^{14}$ represents an alkyl group having 1 to 12 carbon atoms, $R^{12}$ and $R^{13}$ each independently represent a single bond or an alkylene group having 1 to 12 carbon atoms, and M represents a hydrogen atom, a Na atom, a K atom, or an onium group,

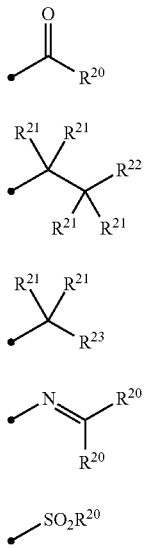

(1-1)
(1-2)
(1-3)
(1-4)
(1-5)

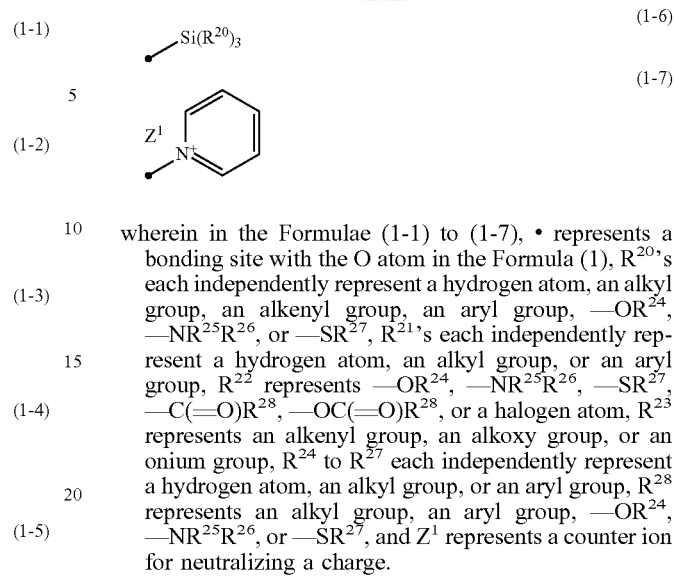

wherein in the Formulae (1-1) to (1-7), • represents a bonding site with the O atom in the Formula (1), $R^{20}$'s each independently represent a hydrogen atom, an alkyl group, an alkenyl group, an aryl group, $-OR^{24}$, $-NR^{25}R^{26}$, or $-SR^{27}$, $R^{21}$'s each independently represent a hydrogen atom, an alkyl group, or an aryl group, $R^{22}$ represents $-OR^{24}$, $-NR^{25}R^{26}$, $-SR^{27}$, $-C(=O)R^{28}$, $-OC(=O)R^{28}$, or a halogen atom, $R^{23}$ represents an alkenyl group, an alkoxy group, or an onium group, $R^{24}$ to $R^{27}$ each independently represent a hydrogen atom, an alkyl group, or an aryl group, $R^{28}$ represents an alkyl group, an aryl group, $-OR^{24}$, $-NR^{25}R^{26}$, or $-SR^{27}$, and $Z^1$ represents a counter ion for neutralizing a charge.

* * * * *